United States Patent [19]
Hard et al.

[11] Patent Number: 6,031,349
[45] Date of Patent: Feb. 29, 2000

[54] CROSS-CONNECT METHOD AND APPARATUS

[75] Inventors: Douglas G. Hard, Fayetteville, Tenn.;
Bryan K. Kennedy, Madison, Ala.;
Arthur O. Miller, Little Rock, Ark.

[73] Assignee: CON-X Corporation, Huntsville, Ala.

[21] Appl. No.: 08/408,831

[22] Filed: Mar. 20, 1995

Related U.S. Application Data

[63] Continuation-in-part of application No. 08/111,770, Aug. 25, 1993, Pat. No. 5,456,608.

[51] Int. Cl.[7] .............................. H04M 3/00; H04Q 1/02
[52] U.S. Cl. .................... 318/466; 340/825.89; 379/271; 379/291; 439/46
[58] Field of Search ............................ 318/466; 200/175, 200/176, 178, 51 R; 340/825.79, 825.83, 825.89; 361/627, 631, 632, 633, 641, 643; 379/242, 268, 269, 271, 291, 306; 439/44, 45, 46, 75

[56] References Cited

U.S. PATENT DOCUMENTS

| | | |
|---|---|---|
| 516,379 | 3/1894 | Muller . |
| 543,160 | 7/1895 | Shibata . |
| 1,137,271 | 4/1915 | Miner . |
| 1,264,826 | 4/1918 | Lundquist . |
| 1,411,478 | 4/1922 | Budd et al. . |
| 1,523,407 | 1/1925 | Dobbin . |
| 1,681,215 | 8/1928 | Blauvelt . |
| 1,712,393 | 5/1929 | Merk . |
| 1,812,546 | 6/1931 | Nilson et al. . |
| 2,036,305 | 4/1936 | Snyder . |
| 2,092,624 | 9/1937 | Memelsdorff . |
| 2,283,040 | 5/1942 | Brinkmann et al. . |
| 2,301,772 | 11/1942 | Boswau . |
| 2,330,812 | 10/1943 | Deakin . |
| 2,516,772 | 7/1950 | Hickman . |
| 2,624,807 | 1/1953 | Deakin . |
| 2,901,547 | 8/1959 | Miloche . |
| 2,952,828 | 9/1960 | Dorizzi . |
| 3,028,573 | 4/1962 | Stoehr . |
| 3,045,077 | 7/1962 | Knanishu . |
| 3,065,439 | 11/1962 | Krause . |
| 3,171,898 | 3/1965 | Sladek . |
| 3,175,179 | 3/1965 | Trump . |
| 3,179,913 | 4/1965 | Mittler et al. . |
| 3,188,403 | 6/1965 | Semo . |
| 3,208,028 | 9/1965 | Mittler et al. . |
| 3,252,056 | 5/1966 | Poesl . |

(List continued on next page.)

*Primary Examiner*—Bentsu Ro

[57] ABSTRACT

A remotely controlled cross-connection switching matrix, particularly suited for telephone systems, has a jumper pin picker and placement mechanism selectively movable along each of three axes under the control of a single drive motor translating a single drive cable over a series of pulleys. Movement along the selected axis is effected by braking movement along the other two axes. The system provides a "soft dial tone" to prospective telephone subscribers' premises having cable pairs permanently connected to the matrix. The cable pair for the calling prospective subscriber is automatically identified at the matrix in response to an off-hook status for that prospective subscriber, and the cable pair identification data is automatically transmitted to the telephone business office. Stored information at the business office for the premises of the identified cable pair is automatically displayed for the telephone company representative responding to a request for service by the calling prospective subscriber. The matrix also permits remote selective connection of unused telephone lines to a test bus connected between the matrix and the central office, thereby permitting automatic, remotely controlled testing of those lines. Improved security of the facility containing the matrix is provided by a feature permitting remote control over the facility door lock.

29 Claims, 37 Drawing Sheets

U.S. PATENT DOCUMENTS

| | | |
|---|---|---|
| 3,258,730 | 6/1966 | Husband et al. . |
| 3,305,644 | 2/1967 | Watanabe . |
| 3,631,374 | 12/1971 | Cartelli . |
| 3,751,594 | 8/1973 | Strother . |
| 3,796,848 | 3/1974 | Southworth, Jr. . |
| 3,969,594 | 7/1976 | DeLuca et al. . |
| 4,124,788 | 11/1978 | Kedian, Jr. . |
| 4,163,135 | 7/1979 | Steen . |
| 4,208,080 | 6/1980 | Teaqno . |
| 4,327,418 | 4/1982 | Kishi . |
| 4,520,234 | 5/1985 | Fields et al. . |
| 4,573,262 | 3/1986 | Dornes et al. . |
| 4,672,660 | 6/1987 | Curtin . |
| 4,817,134 | 3/1989 | Pickens et al. . |
| 4,833,708 | 5/1989 | Goodrich . |
| 4,857,716 | 8/1989 | Gombrich et al. . |
| 4,907,253 | 3/1990 | Watrous . |
| 4,964,105 | 10/1990 | Schrodt et al. . |
| 5,017,145 | 5/1991 | Kanai et al. . |
| 5,179,550 | 1/1993 | Simpson . |
| 5,343,461 | 8/1994 | Barton et al. ............ 370/13 |
| 5,388,148 | 2/1995 | Seiderman ............ 379/59 |
| 5,481,590 | 1/1996 | Grimes ............ 379/57 |
| 5,485,505 | 1/1996 | Norman et al. ............ 379/58 |

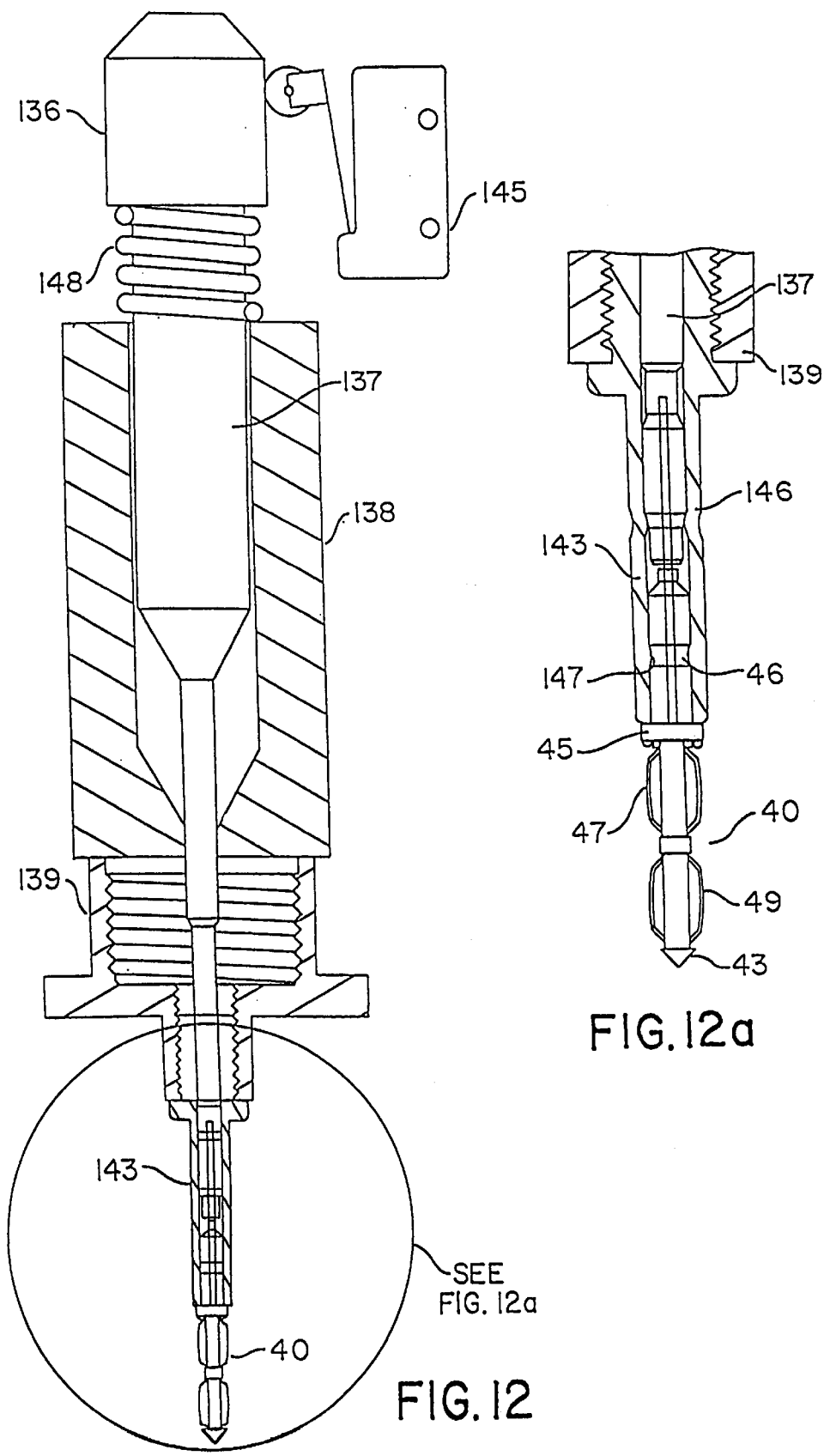

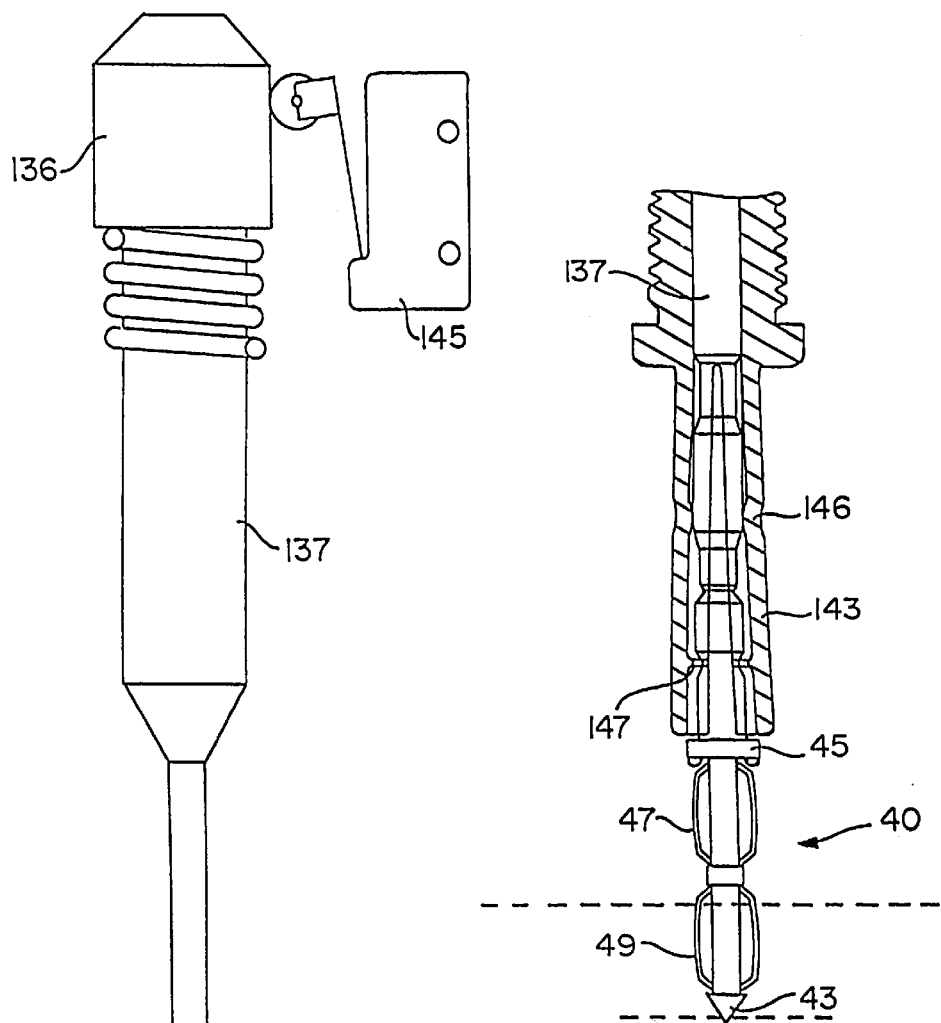
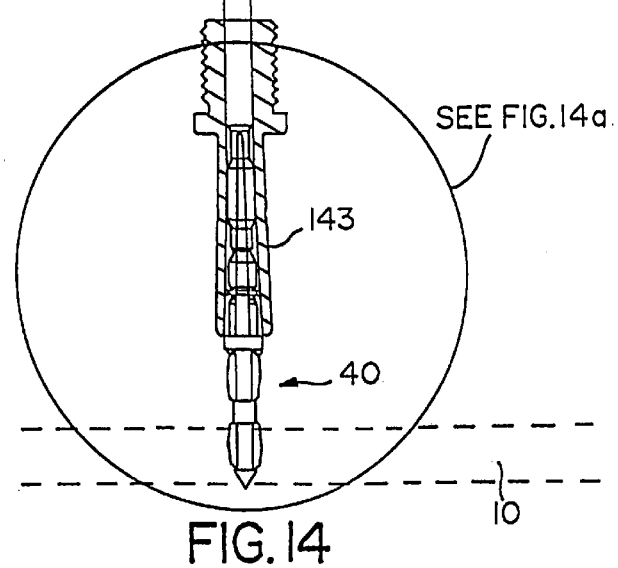
FIG. 14a
FIG. 14

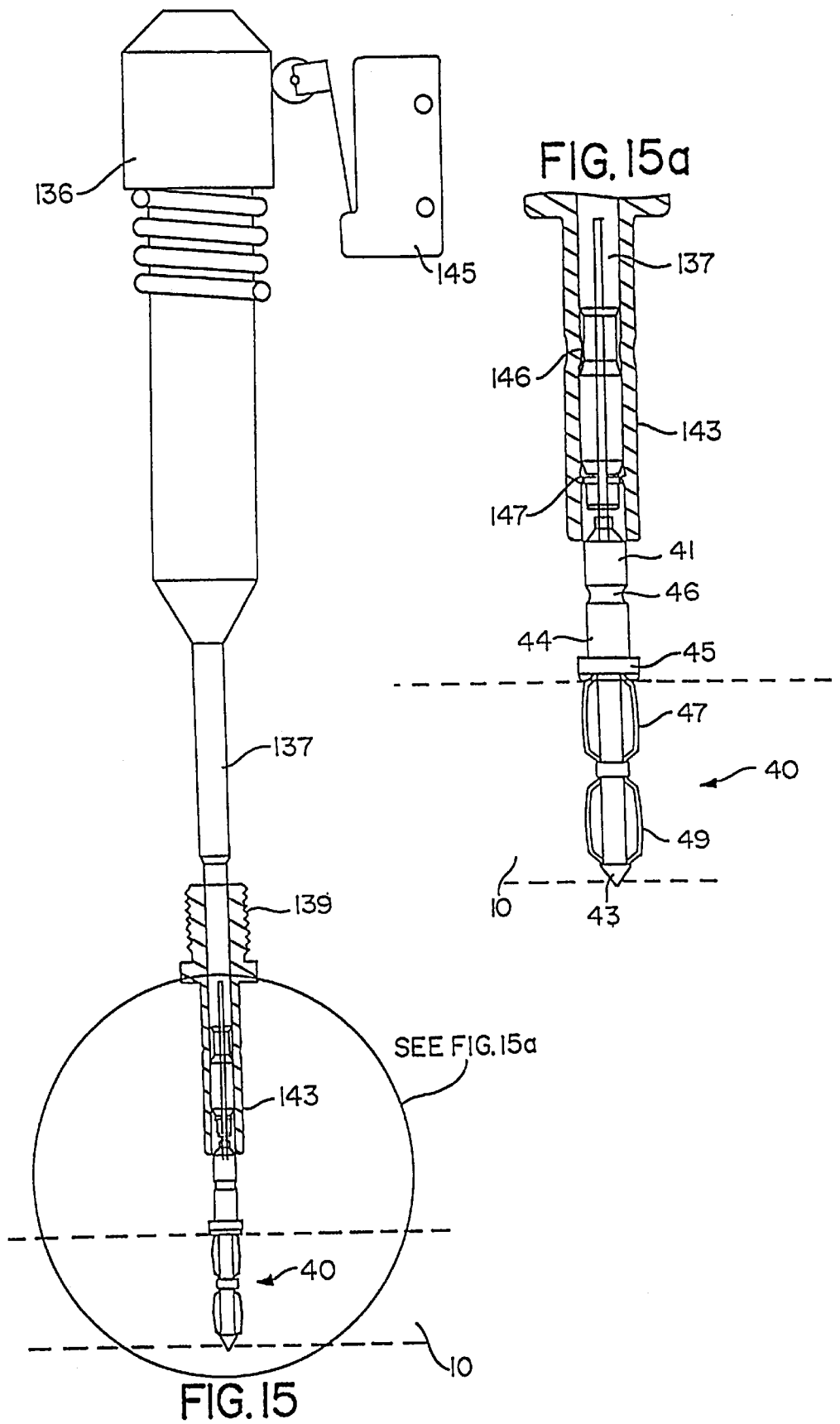

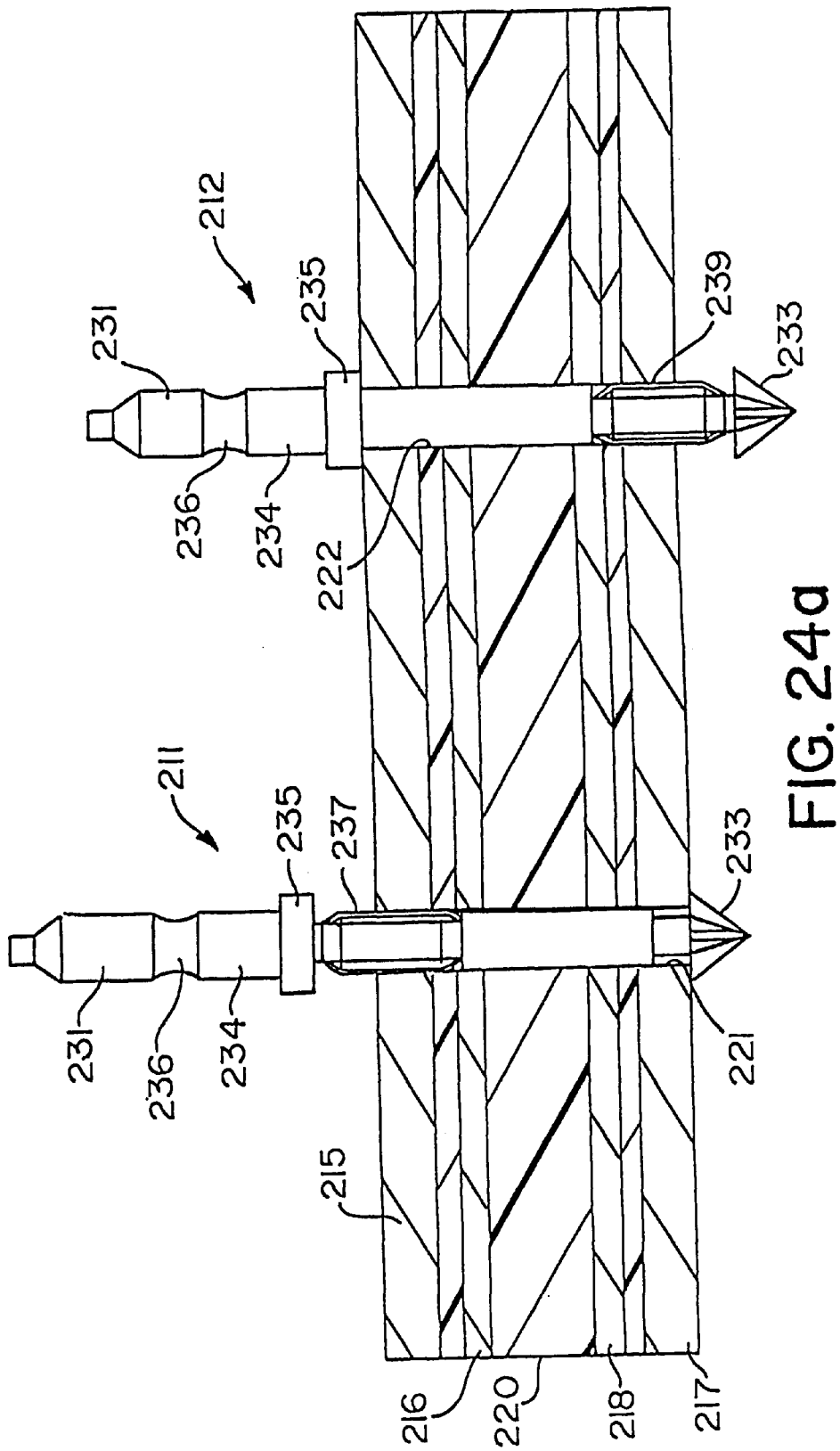

CROSS-CONNECT METHOD AND APPARATUS

CROSS REFERENCE TO RELATED APPLICATION

This application is a continuation-in-part of U.S. patent application Ser. No. 08/111,770, filed Aug. 25, 1993 and entitled "Cross Connect System", now U.S. Pat. No. 5,456,608. The entire disclosure in that patent application is incorporated herein by this reference.

BACKGROUND OF THE INVENTION

1. Technical Field

The present invention relates generally to automatically controlled matrix switching systems and, more particularly, to methods and apparatus for automatically and selectively providing cross-connect switching functions in a telephone system.

2. Discussion of the Prior Art

In the above-noted U.S. patent application Ser. No. 08/111,770, there is described and illustrated a remotely controlled cross-connect matrix arrangement having particular but not limited application in selectively connecting multiple telephone subscriber pairs to multiple telephone system or central office lines. That system utilizes a unique pick and place mechanism for automatically inserting jumper pins at desired matrix locations to provide service for individual subscribers. Although that pick and place mechanism is effective to perform its intended functions, the mechanism requires three separate motors to position the jumper pin holder along three respective axes to insert and/or remove a jumper pin. The three motor approach is costly and results in a degree of complexity that has now been found to be unnecessary.

It has also been found that the cross-connect matrix approach of the above-referenced prior patent application is ideally suited for performing other important telephone system functions. In particular, telephone facilities that are typically utilized in providing telephone service to a customer include a telephone number, a central office line termination, a cross-connection via a mainframe or cross-connection unit to a cable pair extending via several types of outside plant facilities to a terminal near the customer's home or business, and wiring from the terminal into the home/business and to the telephone. Each of these components must have its own identification code to distinguish it from among thousands of identical components that may or may not be in service. These codes for the various components are specified on a service installation order to inform technicians exactly which components to connect together to provide the overall circuit for the customer. When all of the components have been properly connected and the line tested, the customer can plug his/her telephone into the line and utilize the service.

Telephone companies typically issue orders to disconnect each of these facility connections all along the circuit when a customer moves or the service is otherwise disconnected. Individual components are then returned to the assignment availability list for re-use in response to a subsequent request for service. In recent years, increases in technical labor costs have caused telephone companies to attempt a variety of schemes to reduce that cost by leaving many of the component connections intact when a customer disconnects service, and then using the same connected components for the next customer to occupy the former customer's premises. This method of operation is known by various names throughout the industry such as:

(a) Dedicated Outside Plant (DOP). In this approach the cable pair remains connected from the mainframe in the central office to the serving area interface (i.e., the cross-connection point), to a terminal at the customer's location and on into the home/business. This technique is sometimes called "connect-thru".

(b) Dedicated Inside Plant (DIP). The office equipment line termination remains connected to the cable pair that served the former customer.

(c) Flow Through. This term is used when service is established for a new customer by reusing all former facilities and no field work or central office work is required.

(d) Soft Dial Tone. This is a recent innovation made possible by stored program controlled switching systems permitting programming of the office equipment terminal that had been used by the previous occupant in a manner to permit the incoming new customer to contact only the telephone business office and emergency 911 even though service has not been officially established at the facility.

All of the foregoing methods require that the facilities to the customer's location be left in place from the customer's connection block in the home/business to the office equipment terminal in the central office. There are tremendous labor savings inherent in these methods of operation. However, as telephone companies have become involved in these processes they have found that there are serious drawbacks and problems not readily apparent in initial plans. Some of these, for the above-described methods include:

1. Dedicated Outside Plant (DOP). The greatest obstacle in DOP is loss of flexibility in utilizing capital investment. Outside plant cable facilities are designed using a multiplying scheme to provide maximum flexibility in utilizing cable pairs. When these pairs are left connected to the central office mainframe, they are unavailable for changes and rearrangements necessary to fully utilize capital investment. The result is an increase in capital requirements for new facilities. A feeder cable pair from a serving area interface to the central office is very expensive; when dedicated to a non-working line, it is not available for use by paying customers, resulting in a waste of capital investment.

2. Dedicated Inside Plant (DIP). There is a tremendous capital penalty involved in leaving the central office equipment connected to the outside cable pair. Central office administrative spares (i.e., operating spares) are designed and provided from specific formulae based on a precise percentage of available lines being idle at any given time. When these office equipment terminals are left connected to the outside plant cable pair, they are unavailable for use as administrative spares and can be assigned only when a customer occupies the dwelling or business where the cable pair is terminated. At any given time there are approximately ten percent of the available lines idle or disconnected in the normal course of business (i.e., people moving in and out of the city, people moving from one home or business to another, new customers, present customers disconnecting service, customers adding lines, etc.). This activity is called "the float" or "churn" in the telephone industry. It is an expensive but necessary part of the telephone business. The average central office line termination currently costs approximately one hundred and fifteen dollars to one hundred and fifty dollars each. When one considers the thousands of lines involved in the DIP method, it becomes apparent that this method is very expensive from a capital utilization point of view. Considerable effort has been expended throughout the industry to resolve the labor versus capital costs impasse. Many companies have indicated that the economic impact of idle capital investment, while having to purchase new terminations for new service, outweighs the cost of making the connections manually.

3. Flow Through. When a decision to stop or not provide DIP is implemented, the "flow through" of service orders is stopped. This, in effect, puts the service order process back where it was before the labor saving plans were implemented, meaning that every service order must be manually processed to establish service. When one considers all the different assignments and cross-connections involved, this obviously is a major problem. Even with fully dedicated outside plant (DOP) and inside plant (DIP), there is another serious obstacle to increasing the labor saving "flow through" of service orders to establish telephone service. This is the problem of identification of the line serving the customer that is just moving in to occupy the premises. Many homes, particularly in rural areas, do not have precise addresses. Many apartment buildings do not precisely identify the apartment location; rather, only the street address of the apartment building is listed, and some carry only the street address plus the floor or story number. Thus, even if such a customer is properly connected through to the central office equipment, the customer has no way of telling the business office that service is desired, or precisely where he/she lives, or what facility is connected to the dwelling unit. In theory, these data should be available from assignment records; however, if the addresses are not available, assignment records cannot locate the customer. In many cases, entire duplicate facility connections are assigned and sent to the field for the technician to install because the original facility records cannot be located. In order to solve a part of this problem, that is, notification to the business office that service is desired, the "soft dial tone" technique was developed.

4. Soft Dial Tone. Many telephone companies found that simply leaving facilities connected to the main frame still required the customer to find a working telephone or pay telephone to call the business office to apply for service. The "Soft Dial Tone" technique was developed to solve this problem. Under this technique, all facilities are left connected from the customer to the switching machine. In addition, a telephone number is assigned and attached to the non-working line. This switching machine, as do all switching machines, has means to automatically identify the telephone number that is attached to a particular telephone facility. This is called "Automatic Number Identification" (ANI). The "soft dial tone" operation under this method proceeds in the following manner. When a customer moves into a dwelling unit that has been left connected through to the central office switch, he/she plugs in a telephone and receives a dial tone. The telephone number assigned to that facility has been programmed in the switch software to restrict all calls from that number except 911 or to the telephone company business office number. When the customer calls the business office, assuming everything has been perfectly recorded and all facilities have been properly connected, the customer gives the business office the address of the dwelling unit. The service representative then calls an assignment bureau where all facilities are recorded and associated with the dwelling units, and gives the assignor the house address of the applicant. Assuming again that the customer can provide the exact address, apartment location, street numbers etc., the assignor can determine from the records the probable cable facility that the customer has called in on. He/she then has frame technicians "pull an ANI" on the cable pair to find the telephone number that is connected to that pair. If the ANI number matches the number in the records, the business office informs the customer that service will be established that day. Service orders are then issued to establish service using the facilities for that dwelling unit; in addition, the temporary telephone number will have to be changed or reprogrammed in the switching machine to permit normal service. If all goes well and every piece of the facility was left as the records indicated, the service is established. Obviously this is better than the old method of simply leaving the cable pairs connected to the central office mainframe, as the old method adds additional labor back into the cost of providing the service. It is totally dependent, however, upon records and data that are notoriously inaccurate and, it requires coordination between four disparate work groups. These groups are not co-located and may even be in different cities. In addition, fully dedicated facilities for soft dial tone require the addition of another large capital investment to add a telephone number to a non-working line that produces no revenue. The capital cost of a single telephone number has been estimated between $300–$500. When one considers the thousands of lines that must be treated in this fashion every day of the year, the capital requirements are obvious. Studies have shown that the capital cost of the facilities and telephone numbers involved, exceed the value of labor saved by use of this technique.

The foregoing description is applicable approximately twenty five percent of the time when dedicated facilities are utilized in both DIP and DOP techniques. Obviously, the "flow through" percentage is zero for non-dedicated facilities. It must be recognized that the process takes place every working day of the year in every central office in cities and towns all over the world. The expense and labor involved in these processes are enormous, and great amounts of thought, study and effort are expended in attempting to overcome specific obstacles and problems to establishing "flow through" of orders for telephone service. These problems include: idle outside plant capital investment resulting from dedicated outside plant cable pairs; idle and "trapped investment" of central office line terminations when DIP is used; and the inability to efficiently establish same day service when dedicated facilities are not utilized. In many cases the calling customer does not know the exact address or even the apartment number.

Where telephone numbers are not assigned to non-working lines because of the high capital expense, there is no ANI capability and therefore the assignment force is unable to identify the calling line even when the exact address is known and given to the business office. Without a telephone number, no electronic tests of the facility can be made to assure proper operation because all electronic test equipment connects to the facility through the telephone number. This means that service must first be established, and then operational testing can be done. In many cases the facility is not suitable and all work must be done again and service activation is delayed.

The present invention solves these and other telephone service activation problems and inefficiencies at a great capital and labor savings to the telephone company. In addition, customer service is greatly improved.

OBJECTS AND SUMMARY OF THE INVENTION

It is an object of the present invention to provide a remotely controlled switching matrix having a low cost and efficient mechanism for selectively removing jumper pins from and inserting jumper pins into matrix connection holes.

It is another object of the present invention to provide a simple remotely controlled mechanism for accurately positioning a matrix jumper pin along three orthogonally related axes of movement.

A further object of the invention is to provide an improved method for translating a pick and place mechanism for matrix jumper pins.

It is also an object of the present invention to provide a method of eliminating the need for telephone companies to leave expensive central office line terminations (DIP), telephone numbers and outside plant feeder facilities (DOP) connected for lines not in service.

Yet another object of the invention is to provide "Soft Dial Tone" for prospective telephone customers in a manner that obviates the need for one-for-one central office terminations for each cable pair used and for one-for-one outside plant feeder cable pairs.

A still further object of the invention is to provide means for rapidly identifying the specific telephone line, from a multiplicity of lines, that is "offhook" (i.e., trying to use the telephone) and attempting to call the telephone company business office.

A still further object of the invention is to eliminate the labor, expense and delays in activating customer service that are caused by the inability of the service representative to obtain facility assignment and facility availability information. The present invention overcomes this problem by providing means to automatically transmit to the telephone company business office the total facility assignment of the line connected to the prospective customer's home or business from which a call applying for service is made.

It is an object of the invention to provide a method for electronically testing both "soft dial tone" lines and non-working lines by uniquely accessing the telephone company mechanized loop testing equipment.

It is a further object of the invention to provide means for effecting security for telephone buildings by controlling door entry control in an economical and efficient manner.

In accordance with one aspect of the present invention, a pick and place mechanism, suitable for use with the matrix assembly and jumper pin arrangement disclosed in prior U.S. patent application Ser. No. 08/111,770, utilizes only a single stepping motor to translate the mechanism along all three orthogonal axes. In the preferred embodiment a single drive cable is driven by the single stepping motor and directed by a series of idler pulleys to travel horizontally, vertically and transversely toward the matrix. Upper and lower horizontal transport blocks ride along respective upper and lower horizontally oriented support tubes. Idler pulleys for the drive cable are located on these blocks, permitting the blocks to be moved along their respective support tubes in response to disengagement of a normally engaged horizontal block brake arrangement while vertical picker plate brakes remain engaged. A transport carriage similarly rides along respective left and right vertically oriented support tubes that are secured at their upper and lower ends to the upper and lower transport blocks, respectively. The vertical support tubes and vertical transport carriage thus move horizontally with the horizontal support blocks. The drive cable is terminated at the vertical transport carriage to permit the carriage to move vertically along the vertical support tubes when the horizontal block brakes and picker plate pulley brake are engaged and the vertical carriage brake is released.

A picker plate is mounted on the vertical carriage and is connected via connecting rods to a pulley rotatable about a horizontal axis oriented parallel to the horizontal support tubes. The ends of the drive cable are secured to this pulley. A brake mounted on the carriage enables selective rotation of the picker plate pulley to effect controlled movement of a jumper pin engaging picker toward and away from the matrix.

Movement of the picker in any one of the three orthogonally related directions (i.e., horizontally, vertically and depthwise) is achieved by releasing the brakes for either the horizontal transport blocks, the vertical carriage or the picker plate pulley, respectively while the other brakes remain engaged. Precise horizontal and vertical braking is achieved by defining a series of longitudinally spaced slots in the horizontal and vertical support tubes, the slot spacing corresponding to the spacing between adjacent contact holes in the matrix. In the preferred embodiment successive slots are offset circumferentially in two rows to provide the requisite space between successive slots. Two solenoids, one for each row of slots, are provided on the upper horizontal transport block, and each has a plunger arm that is forcefully projected to be engaged in one of the slots when the solenoid is deenergized. When a solenoid is energized, its plunger arm is retracted from a slot and permits the horizontal transport block to move with the drive cable. Similar solenoids are provided on the vertical carriage. Thus by energizing braking solenoids for only one motion direction at a time, the single drive cable and single drive motor are able to selectively move the picker in any one of the three directions.

In accordance with another aspect of the invention, prospective telephone subscriber locations having respective installed cable pairs are provided with "soft dial tone" using automatic control via the matrix. Plural prospective subscribers are connected in parallel by the matrix to central office battery and ground. When one of those prospective subscribers goes off hook, dial tone is provided via the matrix connection to the parallel-connected group of prospective subscribers. The system identifies the calling party with a unique control logic arrangement and connects his/her cable pair to a soft dial tone bus and disconnects the majority of parallel connections, thereby permitting the party to call only emergency 911 or the telephone business office number. In order to eliminate degrading on the line caused by the other paralleled prospective subscribers remaining bridged to the calling party, a spare matrix pin is automatically inserted into the matrix to jump the calling party's cable pair to a direct central office line. This is done while the emergency or business office call is in progress. The calling prospective subscriber is thus, at least transiently, connected to the central office soft dial tone bus via two parallel connections, namely the common access line and the newly established direct central office line connection. The two specially configured jumper pin that had originally connected the calling prospective subscriber to the common access line in parallel with the other prospective subscribers are then moved to break the soft dial tone bus connection. This leaves the other prospective subscribers connected to the soft dial tone connector bus and capable of receiving soft dial tone service while the calling prospective subscriber continues his/her call to 911 or the telephone company business office.

In accordance with another aspect of the invention, means are provided to automatically select, from among hundreds of identical cable pairs, the specific cable pair used by the customer for his/her call to the business office when applying for service when such call is made via the "soft dial tone" provisions of the present invention.

Testing of vacant lines or prospective subscriber lines is effected remotely by connecting a test line permanently to one row of the matrix and selectively jumping that line, using the matrix jumper pins, to different vacant prospective subscriber pairs. The standard mechanized loop tests (MLT) are applied to the line under test via the telephone number associated with the permanent test line.

BRIEF DESCRIPTION OF THE DRAWINGS

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

FIG. 12 is a side view in partial section of the jumper pin pick and place mechanism of the present invention shown with a jumper pin engaged and fully retracted.

FIG. 12a is a detailed side view in section of a portion of the pick and place mechanism of FIG. 12.

FIG. 14 is a side view in partial section of the pick and place mechanism shown with a jumper pin being ejected for placement in the matrix.

FIG. 14a is a detailed side view in partial section of a portion of the mechanism of FIG. 14.

FIG. 15 is a side view in partial section of the pick and place mechanism showing the jumper pin completely ejected from the picker tip.

FIG. 15a is a detailed side view in partial section of the picker tip and jumper pin portion of FIG. 15.

FIGS. 24a and 24b are diagrammatic illustrations of circuit jumper pins utilized in connection with the soft dial tone feature of the invention.

DESCRIPTION OF THE PREFERRED EMBODIMENTS

Figures 1, 1A:
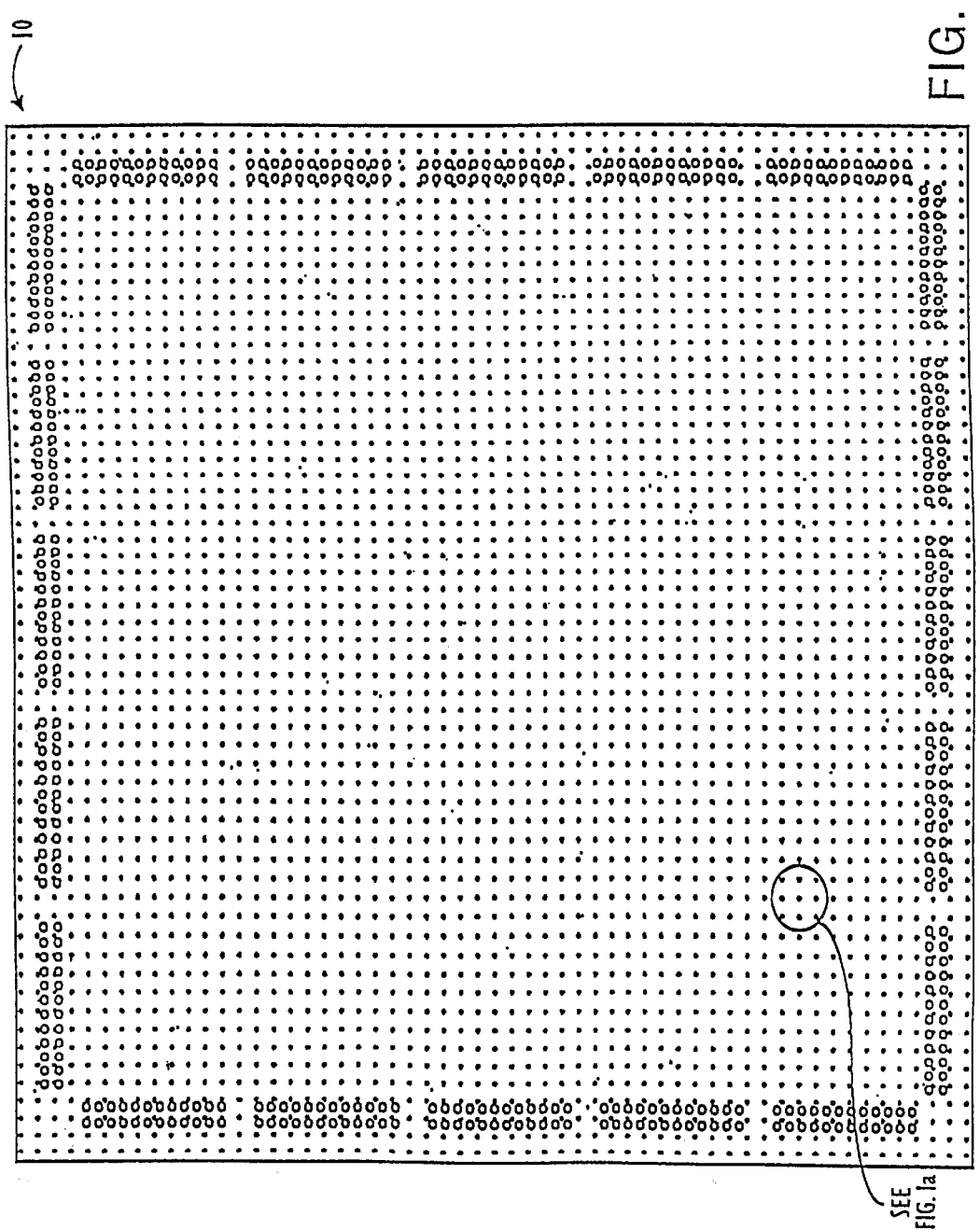
FIG. 1 is a front view in plan of a cross-connect matrix constructed in accordance with the present invention.
FIG. 1a is a detailed plan view of a small portion of the matrix of FIG. 1.
Figure 2:
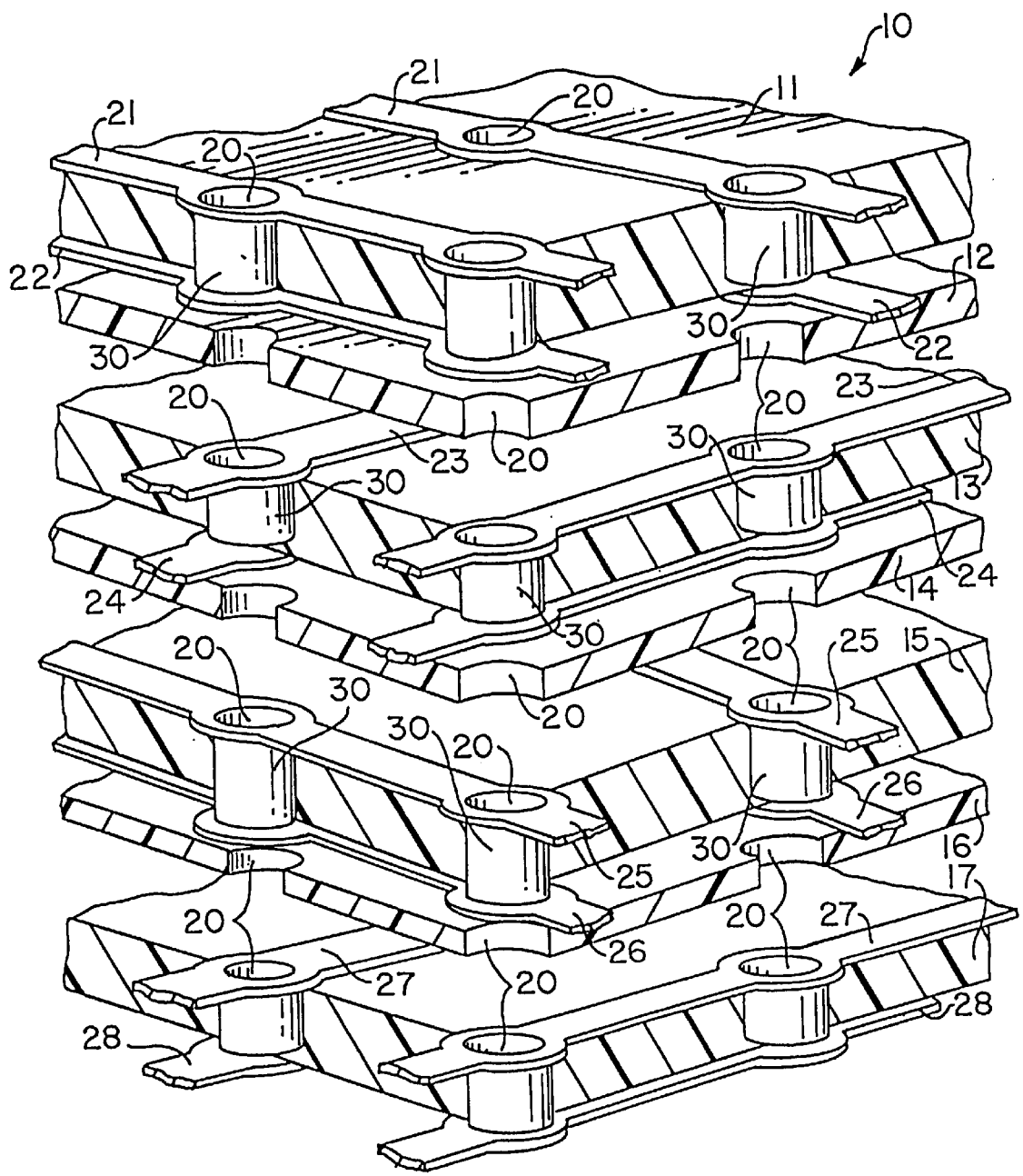
FIG. 2 is an exploded perspective view in partial section of a portion of the matrix of FIG. 1.

Referring to FIGS. 1, 1a and 2 of the accompanying drawings, a matrix assembly 10 comprised as four stacked planar circuit boards 11, 13, 15 and 17 of generally rectangular configuration. As viewed in FIG. 2, circuit board 11 is the first or top board and is designated herein as the switch ring board. Circuit board 13 is the second board and is designated herein as the subscriber ring board. Circuit board 15 is the next board in sequence and is designated herein as the switch tip board. Circuit board 17 is the bottom board and is designated herein as the subscriber tip board. Designations such as "top" and "bottom" are used herein for convenience only and are not to be construed as limiting the orientation of matrix assembly 10. An electrically insulative planar board 12 is disposed in abutting relationship between circuit boards 11 and 13 and is substantially coextensive in width and length with those boards. A similar insulative board 14 is disposed between circuit boards 13 and 15, and another insulative board 16 is disposed between circuit boards 15 and 17. These circuit and insulative boards are compressed together by a plurality of rivets, or the like, to provide a compact matrix assembly with each insulative board in abutting contact on each of its surfaces with an adjacent circuit board.

Multiple matrix holes 20 are drilled or otherwise formed through the entire assembly, including all of the seven boards 11 17, in a direction perpendicular to the board surfaces. Matrix holes 20 may be formed in patterns or groups as described in U.S. patent application Ser. No. 08/111,770.

On the top (i.e., exposed) surface of switch ring circuit board 11 there are multiple conductive switch ring traces 21 arranged linearly in spaced parallel relation. Switch ring traces 21 are typically plated onto the board surface by known techniques. Each trace or conductor 21 extends along a respective row of matrix holes 20, whereby each row of matrix holes 20 in circuit board 11 has a respective trace 21. Corresponding switch ring traces 22 are plated onto the underside (i.e., interior) surface of circuit board 11 in precise registry with respective traces 21 on the opposite surface of board 11. Matrix holes 20 extending through the board are conductively plated in a conventional manner to form female contacts 30 interconnecting their respective traces 21 and 22 at each hole 20. In addition to interconnecting traces 21 and 22, female contacts 30 serve to permit interconnections between different circuit boards in the manner described below.

The subscriber ring circuit board 13 has multiple subscriber ring traces 23 arranged linearly in parallel spaced relation on its top surface. Identical multiple subscriber ring traces 24 are defined in the bottom surface of board 13 in precise registry with respective traces 23. Plated female contacts 30 are also provided in the matrix holes 20 of board 13. Traces 23 and 24 extend along respective columns of holes 20 and are electrically connected by female contacts 30. Subscriber ring traces 23 and 24 extend orthogonally relative to switch ring traces 21 and 22 on circuit board 11.

On the switch tip circuit board 15 there are switch tip traces 25 and 26 disposed at the top and bottom surfaces of the board, respectively, in an array identical to that for traces 21 and 22 of circuit board 11, that is, orthogonally to traces 23 and 24 of circuit board 13. On the subscriber tip circuit board, opposite subscriber tip surface traces 27 and 28 are arranged parallel to traces 23 and 24. It will be appreciated, therefor, that the switch traces on circuit boards 11 and 15 are parallel to each other but orthogonal to the traces on circuit boards 13 and 17.

Figure 4:
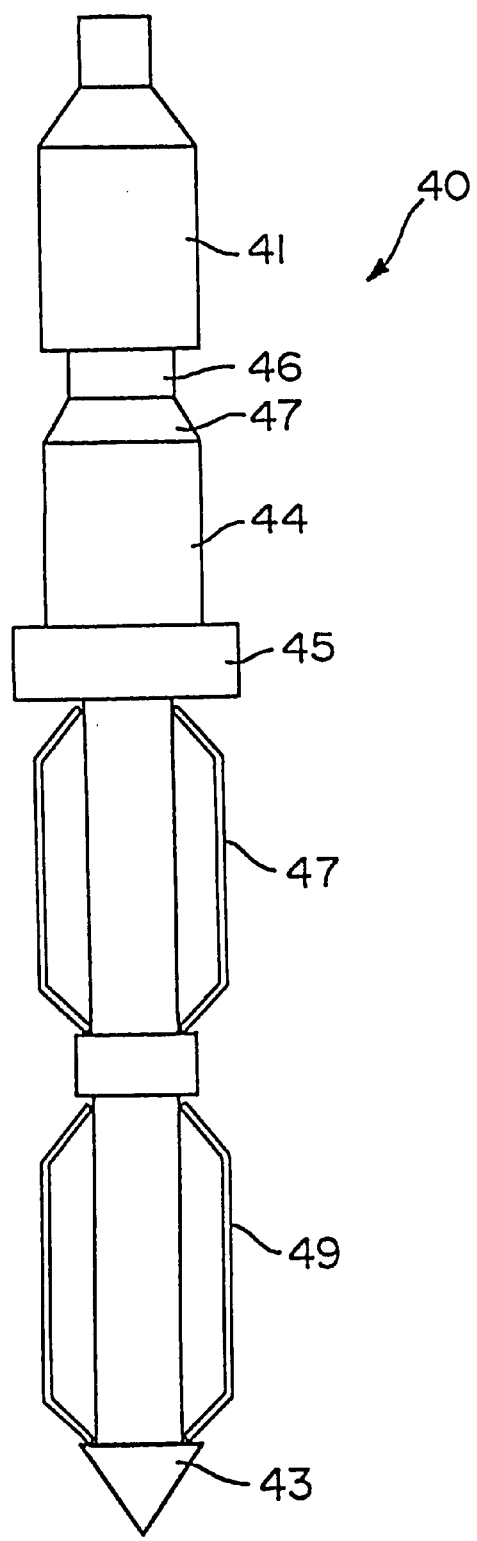
FIG. 4 is a view in elevation and partial section of a circuit jumper pin utilized to make connections between traces in the matrix of FIG. 1.

The traces and female contacts 30 on each board are insulated from the traces and female contacts on successive circuit boards by the adjacent insulation boards 12, 14 and 16 interposed between an abutting successive circuit boards. It will be appreciated, however, that any switch ring trace on circuit board 11, for example, can be electrically connected to any subscriber ring trace on circuit board 13 by providing a connection between female contacts of the two circuit boards at the matrix location where the two orthogonally related traces cross. A circuit jumper pin 40 for effecting such connection is illustrated in FIG. 4 described in detail below.

Figure 3:
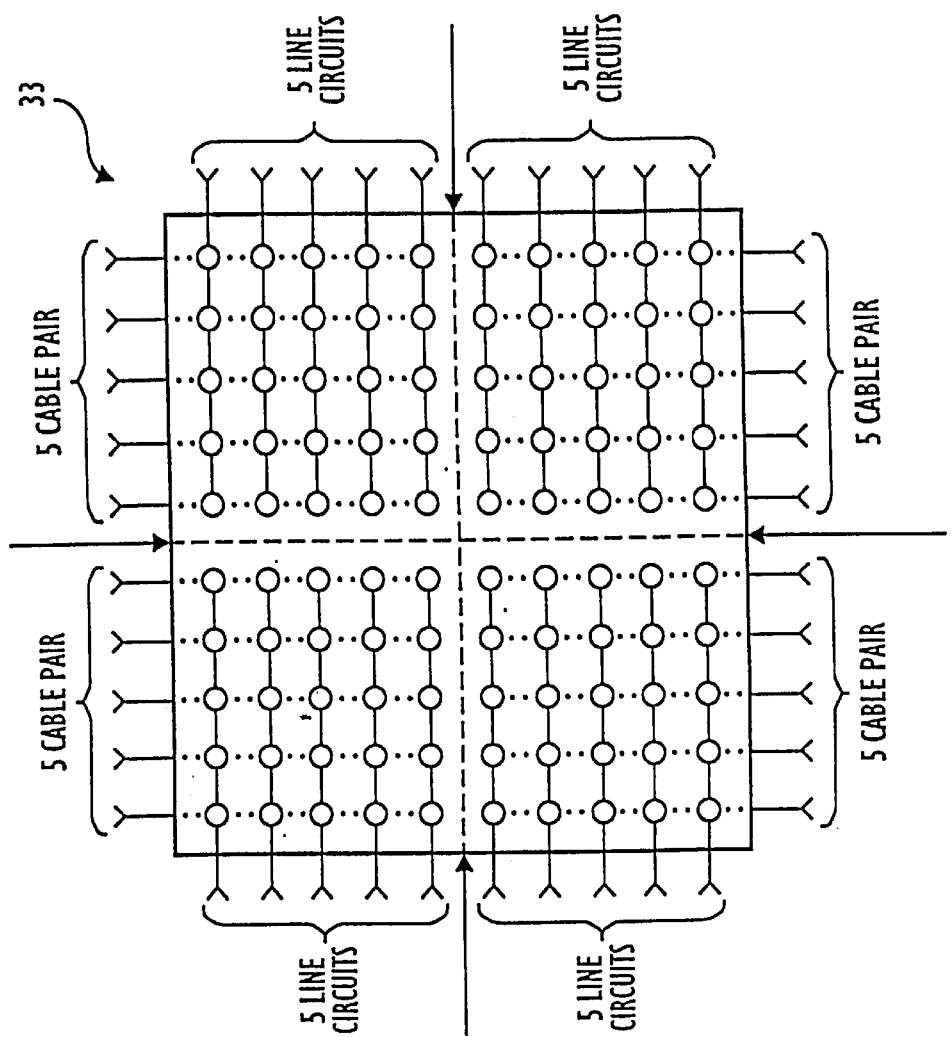
FIG. 3 is a schematic diagram of a matrix of the type illustrated in FIG. 1 subdivided to effect more efficient use of connections.

In typical prior art switching matrices, each horizontal trace (e.g., switch ring trace) and each vertical trace (e.g., subscriber ring trace) extend lengthwise entirely across their respective matrix boards. When a horizontal trace is jumped or connected to any vertical trace, all of the other connector holes located on those traces becomes unavailable for other connections. If, for purposes of facilitating understanding, we assume that the matrix has N horizontal traces and N vertical traces, it becomes apparent that only N connections can be made on the matrix even though there are $N^2$ matrix holes. In the aforementioned U.S. patent application Ser. No. 08/111,770 there is disclosed a technique for expanding the connection capacity of a matrix of given size by providing discontinuities in the traces to effectively provide sub-matrices of the overall matrix. In that patent application, the preferred embodiment of this feature is disclosed as a gap or discontinuity line extending diagonally across the matrix to form two sub-matrices, effectively increasing the connection point capacity of the overall matrix from N to 2N−1. The technique may be expanded further by subdividing the matrix in other ways, for example into four sub-matrices as illustrated schematically in FIG. 3. In particular, matrix 33 is subdivided into four equal capacity sub-matrices, occupying four respective quadrants, by horizontal and vertical discontinuity or gap lines. In the exemplar embodiment, matrix 33 is a square with ten horizontal rows of connector holes and ten vertical columns of connector holes. The horizontal traces, instead of extending entirely across the matrix, are interrupted between the fifth and sixth columns of holes. Similarly, the vertical traces are interrupted between the fifth and sixth rows of holes. Thus, each horizontal trace is oriented coplanar and co-linear with, but electrically isolated from, another trace in an adjacent sub-matrix. The result is four electrically isolated five-by-five sub-matrices occupying the same space as the overall ten-by-ten matrix. This arrangement permits twenty connections to be made via the sub-matrices whereas only ten connections can be made in the corresponding single matrix 33 without providing the discontinuities in the traces. Importantly, the sub-matrices are formed by merely discontinuing the traces at the desired isolation or dividing locations, not by physically positioning sub-matrices at different areas of the structure. Stated otherwise, the space between successive adjacent vertical columns of holes 20 is constant, whether the columns are in the same sub-matrix or in adjacent sub-matrices. Likewise, the spacing between successive adjacent horizontal rows of connection holes 20 is the same whether the rows are in the same sub-matrix or in adjacent sub-matrices. As a consequence, the connection capacity of the matrix is doubled without requiring any increase in the physical size or space of the assembly.

Circuit jumper pin 40 is an elongated member having a grip 41 at its proximal end and a tapered tip 43 at its distal end. Grip 41 is generally cylindrical with a predetermined diameter and a tapered proximal end. Pin 40 is made of an electrically insulative plastic material that is somewhat flexible (i.e., bendable off its longitudinal axis) in order to preclude breakage when the pin is subjected to bending forces or off-axis longitudinal compression, but sufficiently rigid to permit the pin to be inserted through a set of aligned matrix holes 20 in matrix assembly 10. In this respect the diameter of pin 40 is smaller than the inner diameter of female contact 30. An annular stop flange 45 extends radially from pin 40 at a location closer to the proximal end than the distal end of the pin. Proximally of stop 45, the pin has a short cylindrical section 44 with a diameter similar to the diameter of grip 41. Between section 44 and grip 41 there is a short reduced diameter section 46 extending distally from grip 41 and terminating in a distally flaring frusto-conical section 47 that terminates at section 44. Stop flange 45 has a diameter greater than that of hole 20 and divides the pin into insertable and non-insertable length portions. Specifically, the insertable pin portion is located distally of stop flange 45, the depth of insertion into a matrix hole 20 being limited by abutment of flange 45 against the exposed top surface of circuit board 11. The length of the insertable portion of pin 40 is such to permit distal tip 43 to extend through and beyond the bottom circuit board 17 when the pin is fully inserted into the matrix assembly (see FIG. 5).

The portion of fully inserted pin 40 extending between the female contacts 30 of circuit boards 11 and 13 is surrounded by a ring contact sleeve 47 of electrically conductive spring-like material. A similarly configured tip contact sleeve 49 simultaneously extends between the female contacts 30 of circuit boards 15 and 17. When unstressed (i.e., radially uncompressed), sleeves 47 and 49 have diameters slightly larger than the inner diameter of female contacts 30. When pin 40 is fully inserted into a matrix hole 20, sleeve 47 extends between and is radially compressed by aligned female contacts 30 on switch ring board 11 and subscriber ring board 13. The radial compression of the resilient conductive sleeve assures positive electrical contact between the sleeve and the female contacts, thereby assuring connection between the corresponding switch ring trace conductors 21, 22 and the subscriber ring trace conductors 23, 24. Similar connection is made between the switch tip trace conductors 25, 26 and the subscriber tip trace conductors 27, 28 by ring sleeve 49.

It will be appreciated that any pair of superposed switch ring traces 21, 22 can be electrically connected to any superposed pair of subscriber ring traces 23, 24 by simply inserting a pin 40 into matrix holes 20 corresponding to the cross-over location of the traced pairs that are to be connected. The tip traces for the same subscriber and the tip traces for the same switch line cross at the same matrix hole 20 so that a complete tip and ring connection between the subscriber and the switch can be made with a single circuit jumper pin 40. Pin 40 can be manually or mechanically inserted and removed by grasping proximal grip 41 and moving the pin axially in the desired direction. The tapered distal end 43 of the pin facilitates insertion into holes 20. By rendering the pin somewhat flexible, a slight axial misalignment of the pin during insertion will not hinder insertion and, more importantly, will not cause the pin to break due to axial bending stress.

Figure 5:
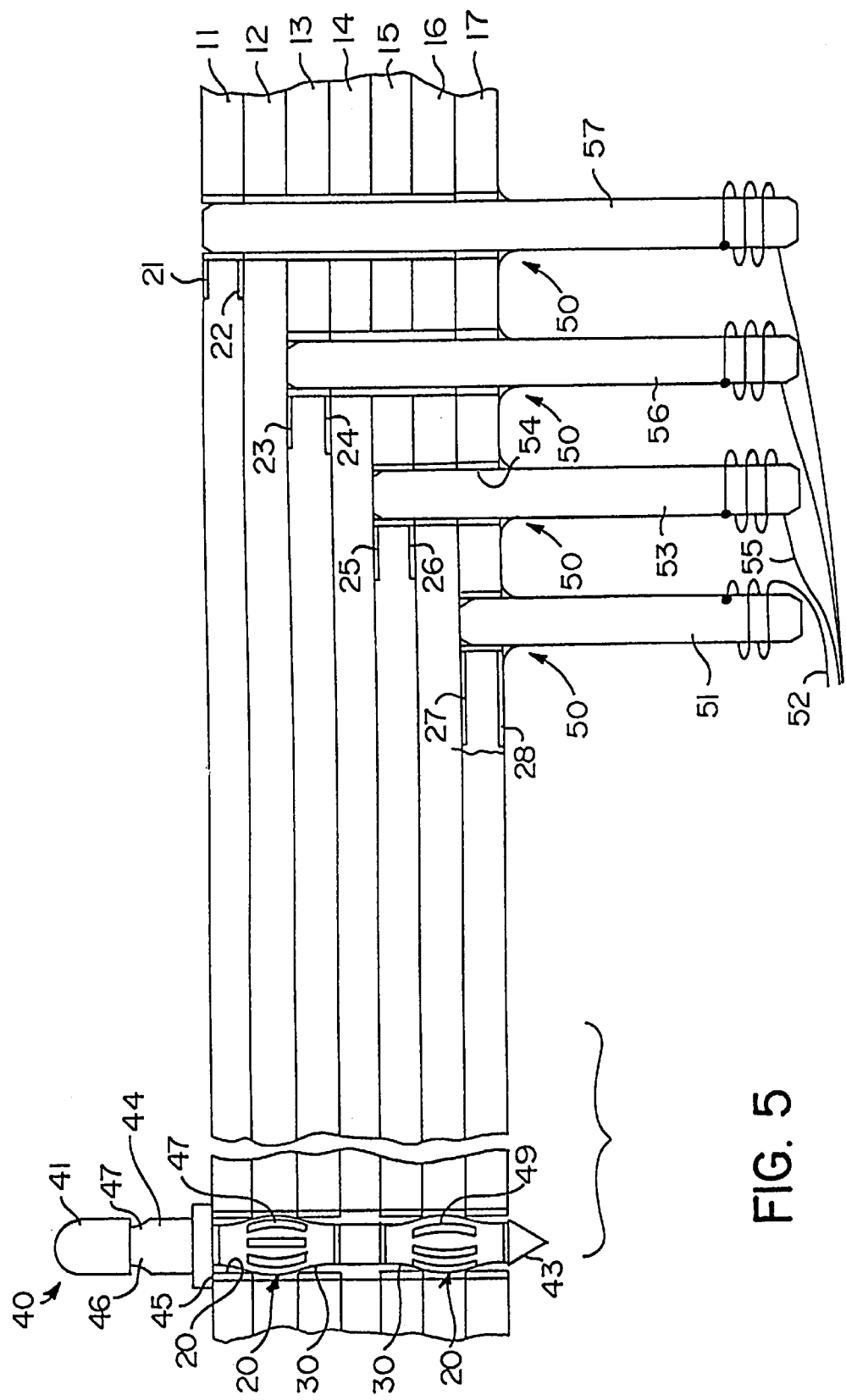
FIG. 5 is a diagrammatic sectional view in elevation of a portion of a matrix assembly of FIG. 1 illustrating the manner in which a circuit jumper pin and external connection posts engage the matrix assembly.

Referring to FIG. 5, a diagrammatic cross-sectional illustration is provided of matrix 10 showing a circuit jumper pin 40 inserted in a matrix hole 20 with the contact sleeves 47, 49 of the pin interconnecting trace conductors on different circuit boards. Specifically, contact sleeve 47 interconnects a contact 30 on circuit board 11 with an aligned contact 30 on circuit board 13. Likewise, contact sleeve 49 interconnects a contact 30 on circuit board 15 with an aligned contact 30 on circuit board 17.

Also illustrated diagrammatically in FIG. 5 is a plurality of wirewrap posts utilized to provide external connections for the matrix assembly. Post 51, representative of multiple such posts employed to provide external connections to trace conductors 27, 28 on circuit board 17, is an electrically conductive post of square transverse cross-section arranged to be longitudinally inserted, perpendicular to the matrix, into a plated female connector in a suitably provided square hole 50 defined through circuit board 17. A plurality of such holes 50 are also shown in FIG. 1 wherein they are disposed in rows along the bottom of the matrix periphery. Wirewrap post 51 is engaged by the connector in hole 50 by means of a press or interference fit to assure proper electrical contact with trace conductors 27, 28 extending along circuit board 17 beyond matrix holes 20. To assure positional rigidity of posts 51 in hole 50, the juncture of the post and hole at the exposed surface of circuit board 17 may be soldered as shown or otherwise reinforced. A subscriber tip wire 52 for a particular subscriber wire pair extends from a cable, containing multiple subscriber wire pairs, to post 51 wherein it is wrapped about post 51 in a manner assuring good electrical contact.

Wirewrap post 53, exemplary of multiple such posts utilized to provide external connections to trace conductors 25, 26 on circuit board 15, is perpendicularly inserted into a plated female connector in a suitably provided hole defined through circuit board 15. Access to that hole in board 15 is provided by a respective aligned hole 54 in circuit board 17. A plurality of such holes 54 is shown in FIG. 1 wherein the holes are disposed in rows extending along the left side of the matrix periphery. Holes 54 are not conductively plated to serve as conductors; instead, they merely provide access to plated holes in circuit board 15 through similarly aligned access holes in the intervening insulative board 16. Post 53 is engaged in the plated hole in circuit board 15 by a friction or interference fit; solder, or the like, may be used at hole 54 to provide positional rigidity for the inserted post. A line or switch tip wire 55 is conductively wrapped about post 53 and is part of a suitable cable carrying the switch tip wires.

At this point, it should be noted that posts 51 and 53 are shown adjacent one another in FIG. 5 only for purposes of convenience of illustration. In actuality, the subscriber tip wirewrap post 51 is inserted into a hole 50 along the bottom edge of the matrix whereas the switch tip post 53 is inserted into a hole 54 along the left edge of the matrix. Likewise, the wires 52, 55 for these posts are, in actuality, part of different cables carrying subscriber and switch wires, respectively.

In a similar manner, it can be seen in FIGS. 5 and 1 that wirewrap posts 56 provide external connections to trace conductors 23, 24 on the subscriber ring circuit board, and wirewrap posts 57 provide external connections to traces 21, 22 on the line switch ring circuit board 11. All posts 51, 53, 56 and 57 are inserted through holes from the exposed surface of circuit board 17 which is the opposite exposed surface of the matrix from that into which the circuit jumper pins 40 are selectively inserted. Each wirewrap post makes electrical contact with trace conductors on only one circuit board, and the access holes for posts connected to each circuit board are disposed in rows along respective edges of the matrix periphery.

During the manufacturing process of the matrix, the posts 51, 53, 56 and 57 are inserted and terminated after all other steps in the matrix assembly process have been completed. The posts are shown as having different lengths depending upon their depth of insertion into the matrix assembly to the desired circuit board. It will be appreciated, however, that equal length posts can be utilized, thereby providing a staggered presentation of the exposed portions of the posts.

It will also be appreciated that all of the access holes, not merely holes 50, may be plated at circuit board 17 to facilitate positional stabilization of the posts by soldering to the plated holes. Under such circumstances, only holes 50 would also serve as electrical connections to trace conductors on circuit board 17.

A primary advantage of the wirewrap posts is that they can be unwrapped and re-wrapped as desired to provide a high degree of versatility for external connections to the matrix. For example, wires in the same cable can be connected to different parts of the matrix. This would not be possible with conventional plug and jack connectors since all cable wires must terminate at the same plug or jack.

The apparatus and the method for inserting and removing circuit jumper pins 40 relative to the matrix assembly is illustrated in FIGS. 6–16 to which specific reference is now made. The mechanism for removal, transport and placement of the pin is unique in that it utilizes only one motor to control pin movement along three orthogonally related axes. Also unique is the technique for converting an imprecise cable drive motion into an exact and positively locked position of the pin picker relative to any matrix hole 20. The drive assembly is mounted as a frame on the matrix assembly (the matrix assembly not being shown in FIG. 6 to preserve clarity and facilitate understanding) about the exposed surface of circuit board 11. Specifically, the drive assembly 60 includes an upper horizontal support 61, a lower horizontal support 62, a left vertical support 63 and a right vertical support 64, all connected at their ends to form a frame. It is to be understood that terms such as left, right, upper, lower, horizontal and vertical are used herein to facilitate relative description of the assembly parts for the particular orientation illustrated in FIG. 6. More particularly, the matrix assembly 20 and drive assembly 60 can be oriented in substantially any manner without departing from the principles of the present invention.

Supports 61, 62, 63 and 64 define a rectangular or square frame about the array of matrix holes 20. A horizontal transport tube 65 is supported at its ends by respective spaced flanges of upper support member 61. In this regard, the ends of horizontal transport tube 65 are threaded and secured to respective flanges of support 61 by means of nuts 67. A lower horizontal transport tube 66 is similarly supported by flanges of lower support member 62. Horizontal transport tubes 65, 66 are parallel to one another and to the plane of the matrix panel, and define the X axis of motion referred to hereinbelow.

An upper block assembly 70 supports a pair of spool-shaped rollers 71, 72 arranged to roll smoothly along the upper portion of the surface of transport tube 65. Rollers 71 and 72 are arranged to freely rotate about their respective support shafts 73 and 74 mounted on block 70 in a spaced mutually parallel orientation that is perpendicular to the matrix assembly 20. In this regard the rollers 71, 72 provide for smooth movement of block 70 along the X axis within the limits imposed by the end flanges of support 61. The spool-type configuration of rollers 71, 72 permits the rollers to engage the upper half of tube 65 in a manner that precludes the rollers and block 70 from moving off the X axis, thereby assuring only lineal movement along that axis.

A lower block assembly 75 is similar in most respects to upper block 70 and supports a pair of similar spool-shaped rollers 76, 77 arranged to roll smoothly along the bottom half of the lower support tube 66. This engagement by the upper and lower rollers of tubes 65 and 66 prevents the picker unit (described below) from being tilted out of the X-Y plane.

Each of a pair of vertically-oriented tubes 80, 81 has its upper end secured to upper block assembly 70 and its lower end secured to lower block assembly 75. This engagement provides for a rigid sub-assembly formed by tubes 80, 81 and blocks 70, 75. A vertical transport carriage 69 is provided with four spool-shaped rollers 82, 83, 84 and 85 arranged to rotate about respective parallel support shafts mounted on carriage 69 and oriented perpendicular to the matrix assembly. Rollers 82 and 83 engage and freely roll along the inboard half of tube 80 that faces tube 81. Likewise, rollers 84 and 85 engage and freely roll along the inboard half of tube 81 facing tube 80. Transport carriage 69 is thereby retained in a vertical plane defined by the parallel tubes 80 and 81. Likewise, the carriage is prevented from moving relative to these tubes in any direction other than vertical (i.e., along the Y dimension), and its Y-axis movement is limited by blocks 70, 75.

In order to assure that upper block 70 and lower block 75 move simultaneously in the same direction, an alignment cable 87 is provided in conjunction with four alignment pulleys 88, 89, 90 and 91 mounted on respective corners of the drive assembly frame. One end of the alignment cable 87 is fixed to upper block 70 and extends to the left (as viewed in FIG. 6) and 180° around the upper left corner pulley 88. Alignment cable 87 then extends horizontally along the frame top over to and around upper right corner pulley 89 and turns 90° downward to and around the lower right corner pulley 90. The cable turn is 90° about pulley 90 and it then extends horizontally along the bottom of the frame to the lower left corner pulley 91. In extending between pulleys 90 and 91, cable 87 is clamped or otherwise affixed to lower lock 75 to assure that the lower block moves with cable 87. The cable then passes 90° around lower left corner pulley 91 and up to and around upper left corner pulley 88 where it turns 900 and extends back across to the upper right corner pulley 89, turns 180° around that pulley and over to the upper block 70 where the other end of the cable is secured. It will be appreciated that if the upper block moves in either direction along the X axis, it pulls alignment cable 87 in that direction and causes lower block 75 to move in the same direction.

Figure 6:
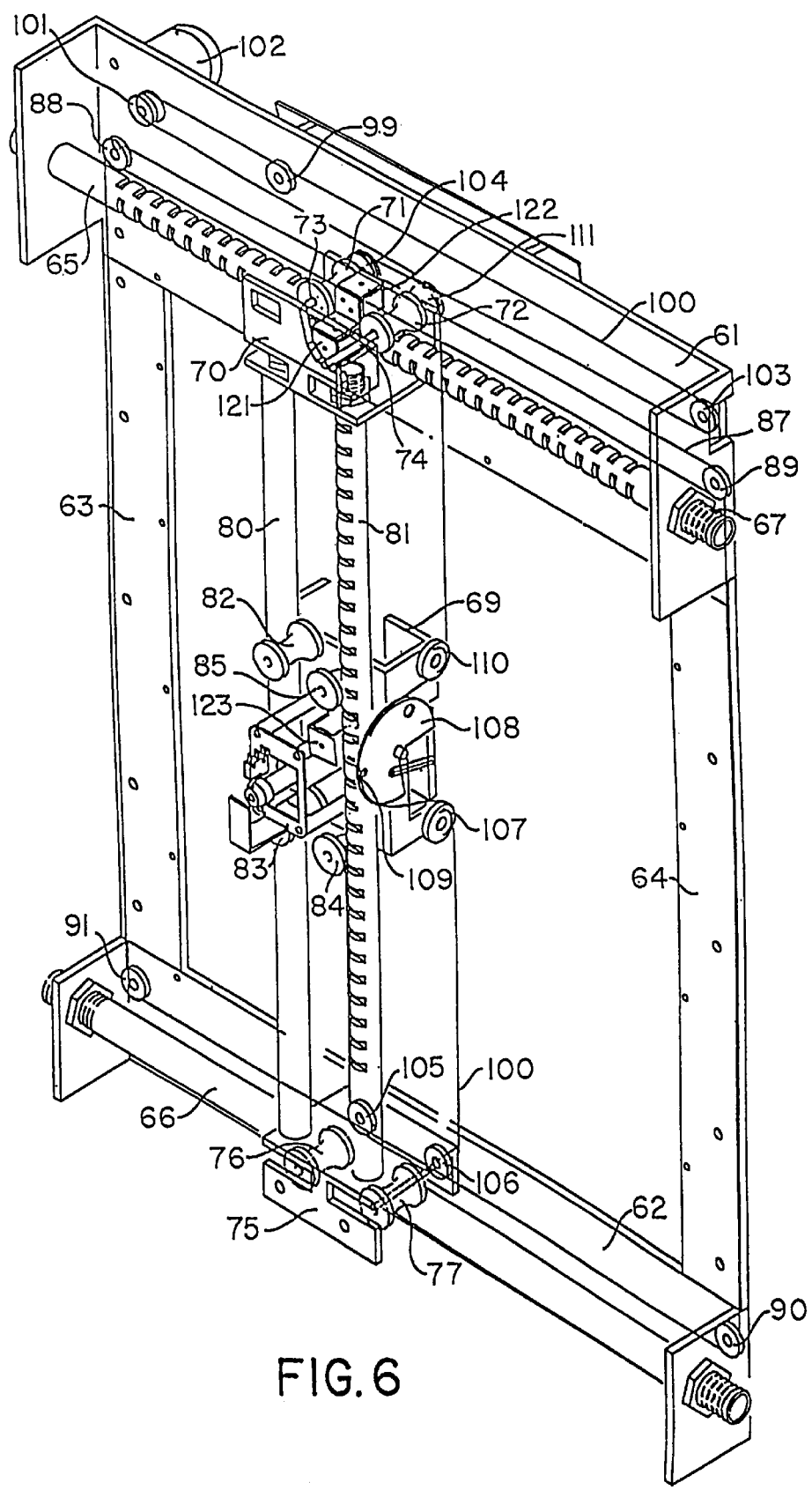
FIG. 6 is a view in perspective of a transport mechanism for effecting three dimensional movement of a circuit jumper pin relative to the matrix assembly of FIG. 1.
Figure 8:
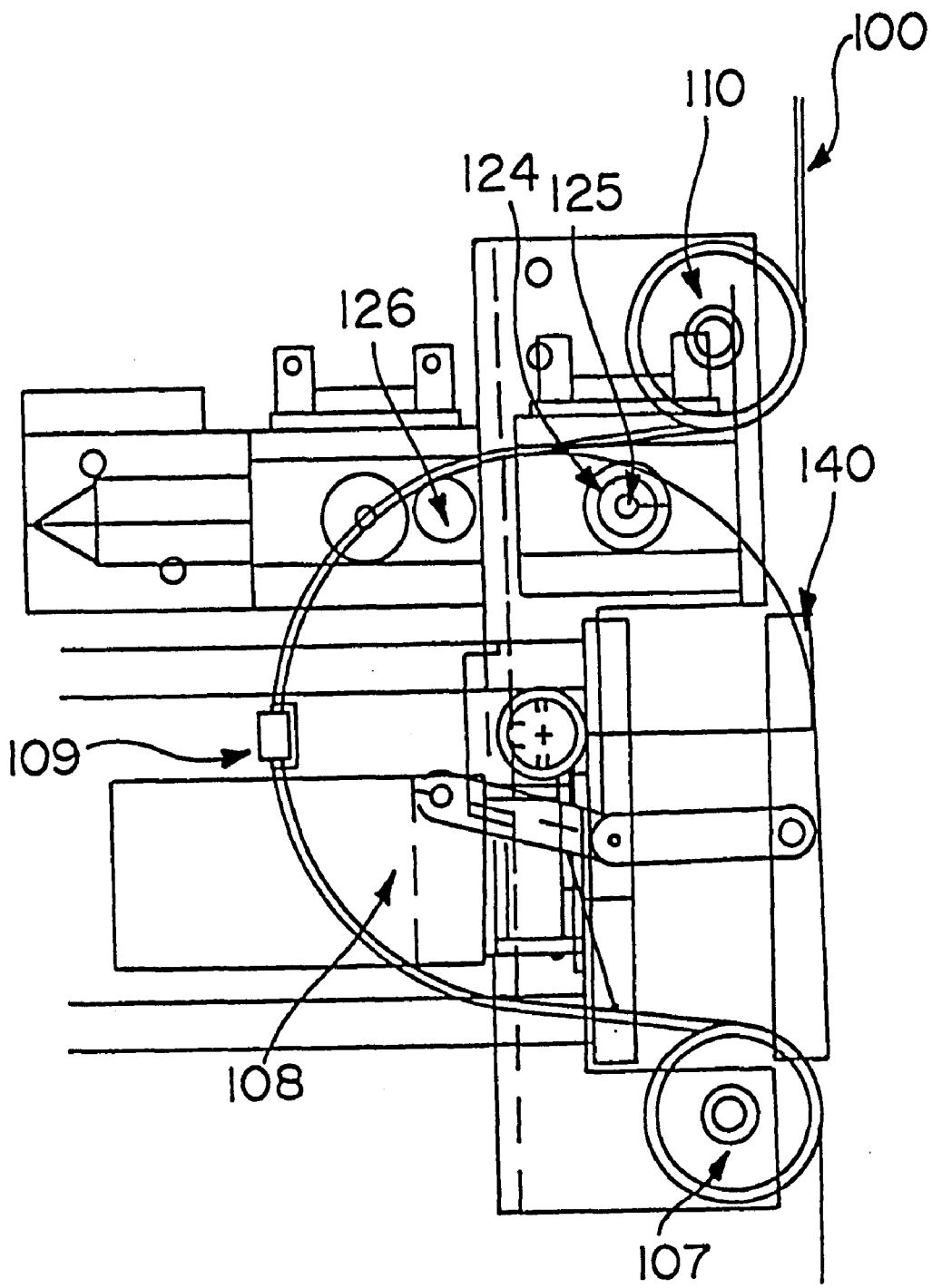
FIG. 8 is a schematic illustration of the jumper pin picker plate carried by the transport mechanism of FIG. 6.

A drive cable 100, as best illustrated in FIGS. 5 and 6, is wrapped a few times, in a windlass drive arrangement, about a drive capstan 101 located near the upper left corner of the drive assembly frame. Drive capstan 101 is rotatably driven by a step motor 102 mounted behind the capstan on the upper lateral support 61. Drive cable 100 extends horizontally in the X dimension from drive capstan 101 and engages an opto-shutter drive pulley 99 serving to measure drive cable movement. From the opto-shutter drive pulley 99 the cable extends in the X dimension to an idler pulley 103 mounted on support 61 proximate the upper right corner of the frame. Drive cable 100 makes a 180° turn about idler pulley 103 and extends along the X dimension back to a leftmost idler pulley 104 mounted on upper block assembly 70. After turning 90° downward about pulley 104, each end of the drive cable is terminated at a cable tensioning device and extends in the Y dimension and then turns 90° about a leftmost idler pulley 105 mounted on lower block 75, and then extends to the right in the X dimension and turns 90° about a rightmost idler pulley 106 also mounted on block 75. Drive cable 100 then extends upwardly along the Y dimension to a lowermost idler pulley 107 mounted on carriage 69 where the cable is turned 90° inward along the Z dimension onto a grooved edge of a picker plate drive pulley 108. Picker plate pulley 108 takes the form of a major portion of a circle lying in the Z plane, perpendicular to both the X and Y dimensions. The picker plate pulley, as best illustrated in FIG. 8, has a periphery appropriately grooved to receive drive cable 100, and the drive cable is terminated in that groove at a point designated generally by the reference numeral 109. The drive cable 100 extends from point 109 in the Z direction to an uppermost idler pulley 110 mounted on carriage 69 where the drive cable is turned 900 upward so that it then extends in the Y dimension to a rightmost idler pulley 111 mounted on the upper block 70. Pulley 111 turns the drive cable 90° to the left where it extends in the X direction back to drive capstan 101.

Figure 9:
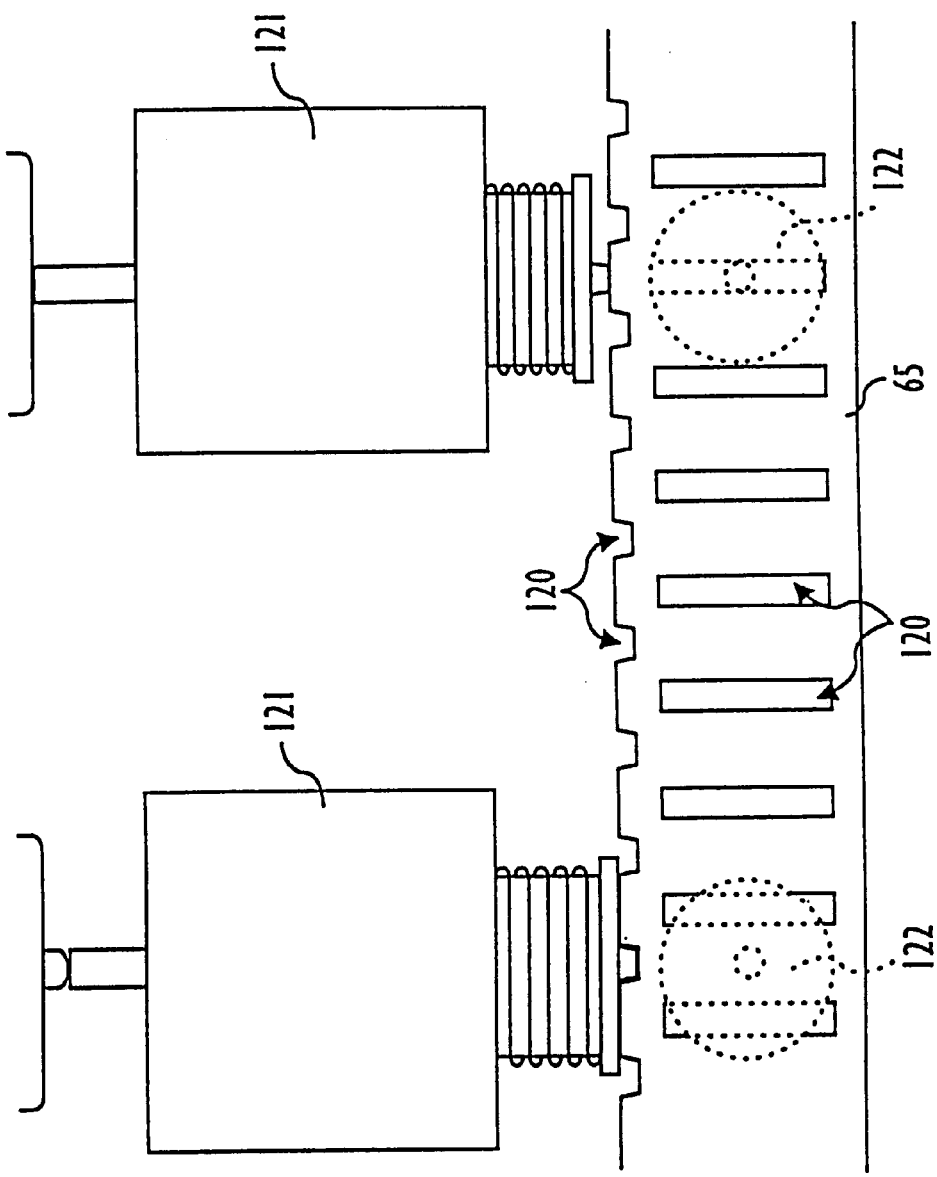
FIG. 9 is a schematic illustration of a solenoid-actuated braking mechanism utilized with the transport assembly of FIG. 6, showing the brake in both its released and engaged conditions.

As best illustrated in FIGS. 9 and 6, horizontal transport tube 65 has multiple axially spaced slots 120 defined therein and extending approximately 75° circumferentially about the tube. In actuality there are two series of such slots, each series being offset from the other by approximately 90° on the tube circumference. The slots 120 in each series are disposed axially midway between the slots in the other series so that, from a longitudinal or axial prospective, each successive slot is offset 90° circumferentially from the preceding slot. The spacing between successive slots is precisely equal to the spacing between successive matrix holes 20 in the matrix assembly.

Two solenoids 121, 122 are mounted on the upper block assembly 70 and each has a selectively extendable and retractable plunger with a protruding pin. In FIG. 9, each solenoid 121, 122 is shown twice in order to illustrate the energized and de-energized state of each at respective slots 120; it will be understood that only one of each solenoid is provided. The plungers of the two solenoids are perpendicularly oriented relative to one another and positioned so that their pins are juxtaposed with respective offset series of slots 120 on tube 65. Thus, as upper block 70 moves in the X dimension relative to tube 65, the plungers and pins of solenoids 121 and 122 are aligned with different rows of slots. Importantly, the pins of plungers 121 and 122 reside in the same plane perpendicular to tube 65 so that when the plunger and pin of one solenoid is aligned with a slot 120 in its series of slots, the plunger and pin of the other solenoid is disposed intermediate successive slots in its series. The pins extending from the solenoid plungers have smaller diameters than the width of slots 120. Solenoids 121, 122 are of the type that retract their plungers when the solenoid is energized but extend those plungers in response to a bias spring when the solenoid is de-energized. Accordingly, when both solenoids are energized, their plunger pins are retracted and clear tube 65, thereby allowing unimpeded motion of the upper block 70 along the X direction. However, when either solenoid 121 or 122 are de-energized, its plunger pin rests upon the surface of lateral tube 65 and, under spring bias, is urged toward the tube and into a slot 120 aligned with the plunger. Accordingly, the solenoids serve as brakes that are selectively actuable to prevent or permit movement of the upper block 70 relative to tube 65. In a similar manner, a pair of solenoids 123 (only one being visible in FIG. 6) is mounted on carriage 69 to engage similar slots 120 defined in two 90°-separated series along the length of vertical tube 81 and provide the same selective braking action for the carriage along that tube. In actual operation, a solenoid is controllably de-energized just prior to completion of motion of block 70 or carriage 69 so that the plunger can be extended to contact tube 65 between slots 120. As the block or carriage continue to move, the de-energized solenoid plunger is forced into the next slot to stop the motion.

Figure 10:
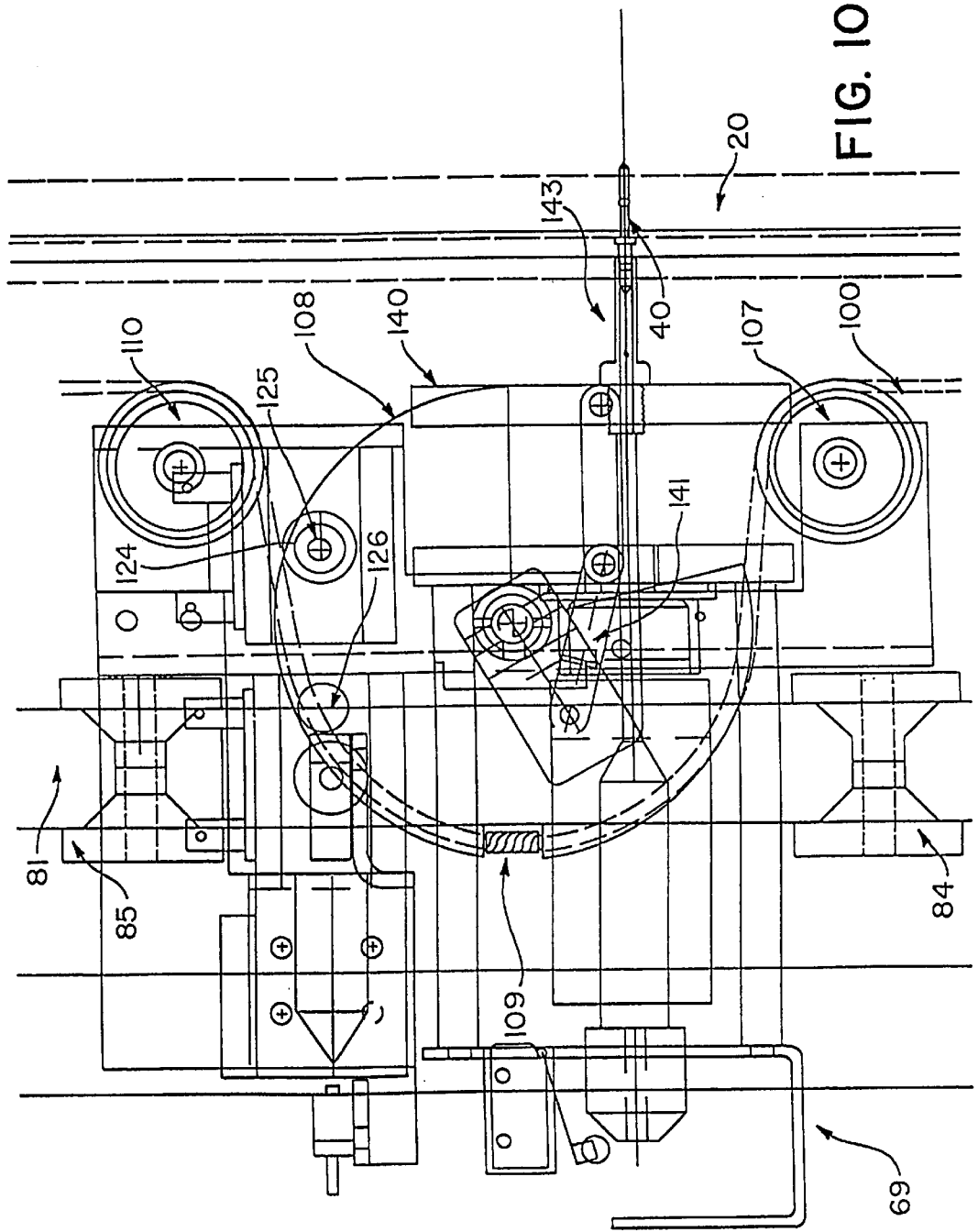
FIG. 10 is a diagrammatic side view of the picker plate and its actuating mechanism.

As viewed in FIGS. 8 and 10, also mounted on carriage 69 is a solenoid 124 having a pin 125 movable in the X dimension to be selectively received in or withdrawn from a hole 126 defined in picker plate drive pulley 108. When solenoid 124 is de-energized, pin 125 engages hole 126 and thereby prevents relative motion of the picker plate. When solenoid 124 is de-energized, the picker plate drive pulley is able to rotate in the Z dimension about an axis extending in the X direction. In particular, the drive cable 100, terminating as it does on rotatable picker plate pulley 108, is able to rotate that pulley around the X-axis, and by virtue of the connecting rod 141, move the picker plate in the Z direction when pin 125 is retracted from hole 126.

Movement of the picker assembly in any of the three dimensions X, Y and Z is therefore accomplished by energizing solenoids for the axis in which motion is desired and by energizing a single drive motor 102 to drive the capstan 101 and the drive cable 100. Specifically, the picker assembly can be moved in the X dimension by energizing both solenoids 121 and 122 to permit the upper block 70 to move freely relative to tube 65; solenoids 123 and 124 remain de-energized so that Y and Z movement is prevented. Under these circumstances the portion of drive cable 100 extending vertically down from idler pulley 104 to idler pulley 105, over to idler pulley 106, around pulleys 107, 108 and 110 and up to pulley 111 is stationary because of the braking. The drive system may thus be viewed as a movable horizontal loop of drive cable 100 extending between pulleys 101 and 103, with the remainder of the drive path suspended therefrom and movable horizontally therewith. Likewise, if solenoids 123 are both energized, carriage 69 is able to move vertically under the control of step motor 102 as long as solenoids 121, 122 and 124 are de-energized. Under these circumstances the horizontal drive cable loop about pulleys 101 and 103 cannot move the positionally locked pulleys 104, 105, 106 and 111 horizontally but can pull pulley 110 (and carriage 69) up or pull pulley 107 (and carriage 69) down, depending on the direction of rotation of motor 102. Z dimension movement, accordingly, is accomplished by energizing solenoid 124 while solenoids 121, 122 and 123 are deenergized. Under these circumstances pulleys 104, 105, 106, 107, 110 and 111 are locked in place and the only movable element is picker pulley 108 to which both ends of cable 100 are fixed. Movement of the picker pulley is strictly rotational and produces a relatively small range of movement of the cable. A greater range of movement, if required, could be achieved by increasing the circumference of drive pulley 108 so that the length of cable engaging that pulley would similarly increase. Importantly, this system only permits motion in one direction at a time.

The opto-shutter drive pulley 99, when rotated by drive cable 100, rotates a shutter in a conventional manner which sequentially turns an opto-coupler on and off to create electrical pulses that may be counted by the system processor. The pulses that are counted have a direct relationship to linear movement of the cable and the picker that is driven by the cable. Thus, if motor 102 malfunctions, or if cable 100 slips on capstan 101, the processor receives fewer pulses and initiates a corrective action or alarm.

Initial positioning registration may be accomplished by means of switches (not shown) when the vertical assembly is positioned to the extreme leftmost position and when the carriage 69 is positioned at the extreme lowermost position. Specifically, carriage 69 may be moved laterally to the left until a limit switch is sensed. Solenoids 121 and 122 may then be de-energized and carriage 69 moved laterally to the right until one of the associated solenoid plunger pins drops into a slot on lateral tube 65, thereby arresting further lateral movement. The picker can then be positioned over the bottom row of holes in the matrix panel by moving the carriage 69 downward until the lower vertical limit switch is operated and sensed. With solenoids 123 de-energized, the carriage can be moved upward until a plunger pin of one of solenoids 123 extends into a slot 120 in the vertical tube, thereby preventing any further movement. The picker is thus positioned over the lowermost row of matrix holes in the matrix panel.

It is to be noted that for precise registration of the picker over the individual matrix holes, the flange nuts 67 engaging the tubes 65, 66, 80 and 81 (as viewed in FIG. 6) may be loosened, allowing axial movement of the tubes so that the slots 120 can be positioned as necessary for alignment with matrix holes 20. Once the tubes are properly positioned, the nuts 67 are tightened to prevent further tube movement.

Figure 11:
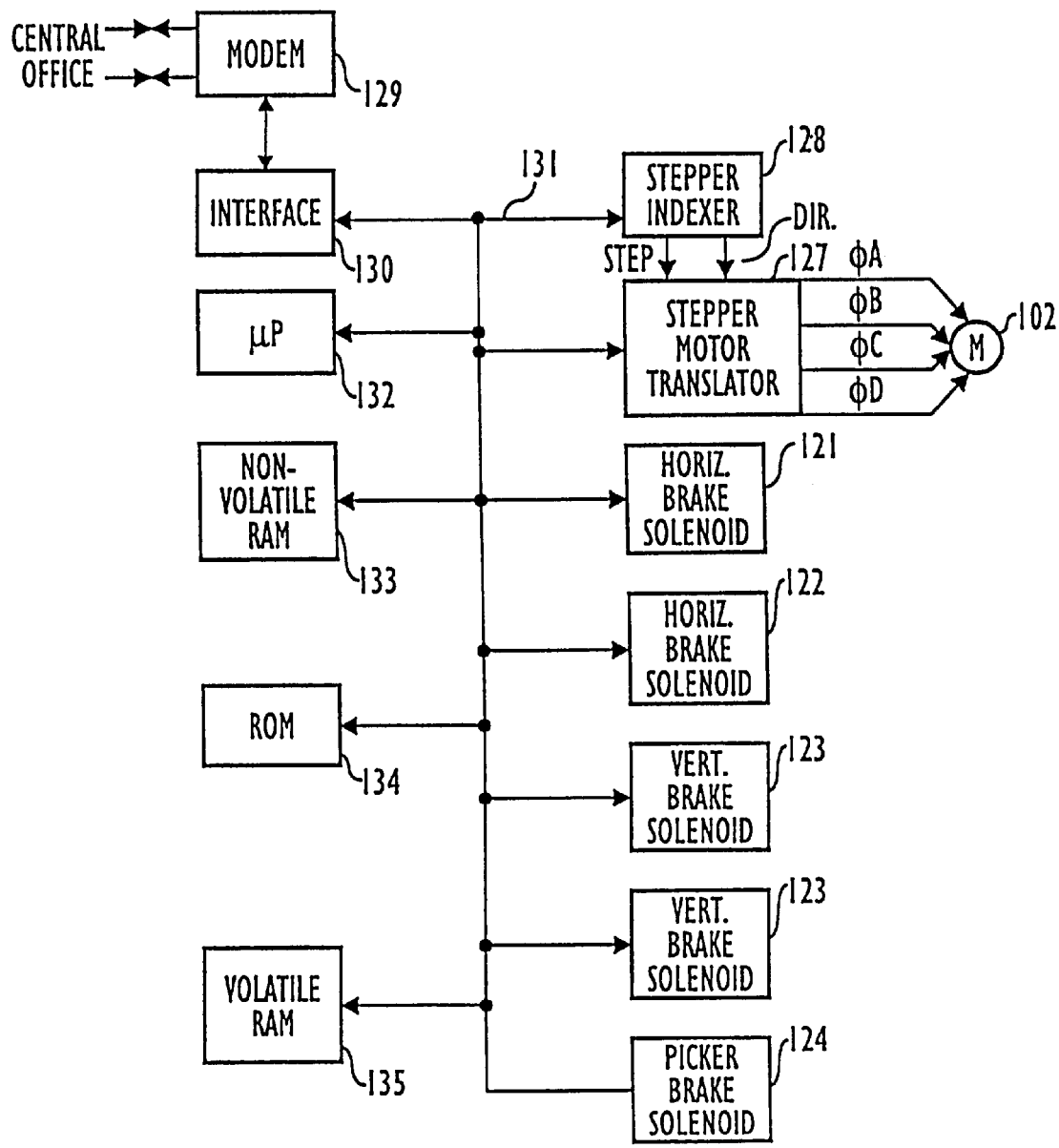
FIG. 11 is an electrical block diagram of the system for controlling the transport mechanism and picker plate of FIG. 6.
Figure 13A:
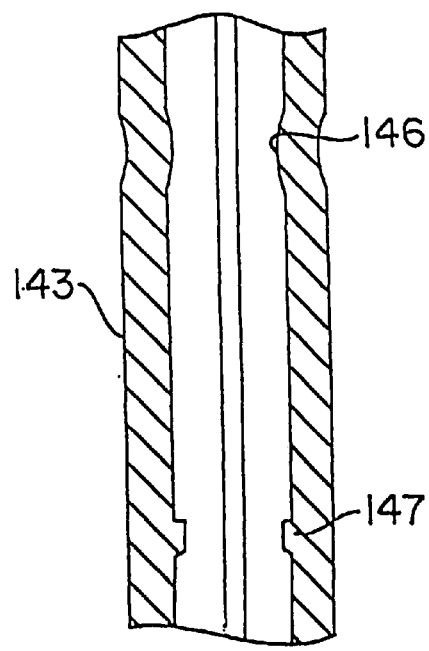
FIG. 13a is a detailed side view in section of a portion of the tip illustrated in FIG. 13.
Figure 13:
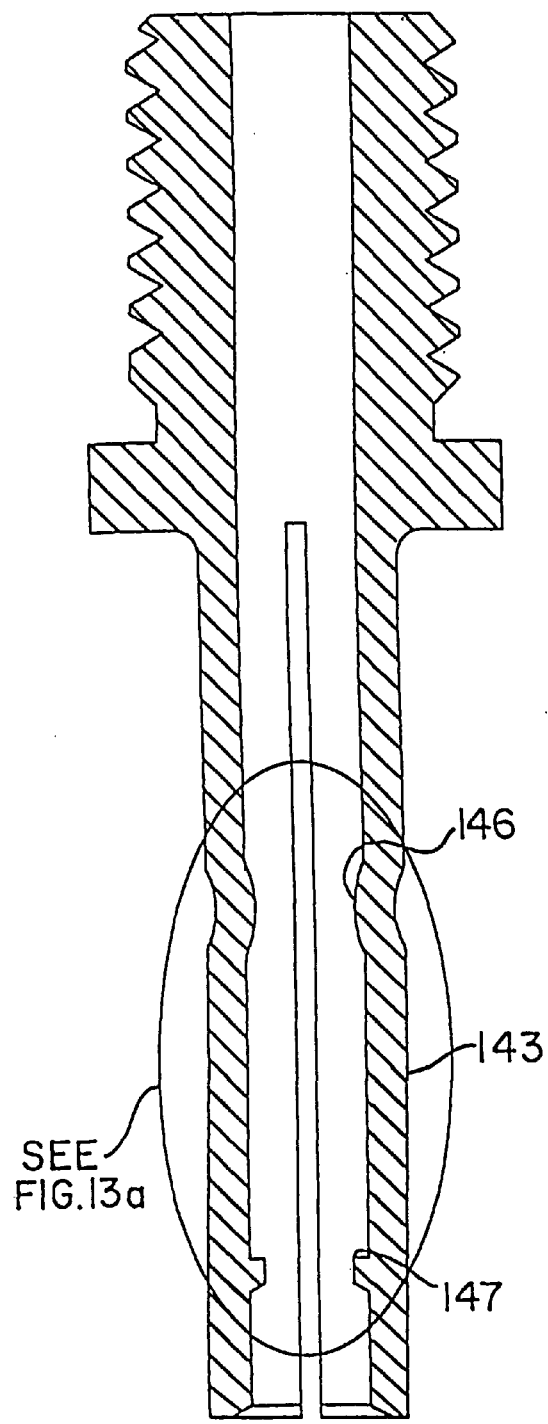
FIG. 13 is a side view in section of the picker tip portion of the mechanism of FIG. 12.

Control over movement of the drive assembly is derived from a remote location, typically at a central telephone system office. A generalized block diagram of equipment located at the remote location of the drive system and permitting such remote control is illustrated in FIG. 11 to which specific reference is now made. Control signals from a telephone system central office are received by a modem 129 having an interface 130 arranged to format the signals and distribute them via a microprocessor bus 131 to microprocessor 132. Bus 131 provides signal communication between the microprocessor and all of the controlled equipment and data processing circuits at the remote station. Microprocessor 132 controls operation of the equipment at the remote station, including the step motor 102, the horizontal brake solenoids 121, 122, the vertical brake solenoids 123 and the picker brake solenoid 124. A non-volatile read/write random access memory (RAM) 133 is provided to store the status (i.e., whether or not occupied) of the various matrix locations, and the hole locations of the various circuit jumper pins 40. A read only memory (ROM) 134 stores the operating system program and application program to operate the microprocessor. A volatile RAM 135 serves the function of transient working storage.

The step motor 102 is controlled by a stepper motor translator 127 which in turn is controlled by a stepper indexer 128. Translator 127 and indexer 128 are commercially available components utilized in a conventional manner to control stepping motors. Translator 127, for example, may be a model NEAT SDN7, manufactured by New England Affiliated Technologies, while indexer 128 may be a model INDEXER LPT (using line printer controller) manufactured by Ability Systems Corporation. In response to control signals received from microprocessor 132 via bus 131, stepper indexer 128 applies step signals to the translator 127. The translator responds by applying appropriate control signals to motor 102 to positionally step the motor and move drive cable 100. Upon the picker mechanism reaching the desired location in each direction, the appropriate brake solenoids are actuated/de-actuated to effect a change in picker movement direction.

Referring to FIG. 10 of the accompanying drawings, the picker plate drive pulley 108 is shown mechanically linked to a picker plate 140 by means of a reciprocating action connecting arm 141. Specifically, upon rotation of the picker plate drive pulley 108, connecting arm 141 pushes or pulls the picker plate 140 in the Z direction (i.e., perpendicular to the matrix panel 20). The picker plate 140 carries a picker tip 143 capable of grabbing and releasing a jumper pin 40 in the manner described below. The details of the picker tip 143 are illustrated in FIGS. 12–16 as described in the following paragraphs.

It will be appreciated that the concept of employing a single drive cable and single motor has numerous advantages over using a separate drive arrangement for each axis of movement. Moreover, the drive arrangement described above is particularly advantageous for providing individual motion along two or three orthogonally related axes. However, the single cable and motor arrangement, combined with selective braking along all but one axis at a time, may be employed to control movement along other than orthogonally related axes. For example, a polar co-ordinate system could be used whereby a pivotable tube, slotted in the manner of support tube 65, is pivotable through 360°. At its distal end the tube supports a block arranged to ride along an annular tube that is similarly slotted. A carriage supporting, for example, the picker described above, is arranged to ride along the rotatable tube. Solenoids on the carriage have plungers of the type described to selectively engage the slots along the rotating tube to brake and positionally define the carriage position along the rotatable tube. Solenoids on the block are selectively energized to brake and positionally define the angular position of the rotatable tube relative to the annular tube. The picker plate and pulley are the same as described. A single motor drives a single drive cable engaged by pulleys on the block, carriage and picker to move the picker only along the unbraked axis. The controlling microprocessor is programmed to provide polar co-ordinates for picker movement and destination, rather than rectilinear co-ordinates as in the system described above.

As illustrated in FIGS. 12, 12a, 13 and 13a, the picker tip assembly includes a solenoid 138 having an armature 137 with an armature extension 136 projecting from the proximal end of the armature. A helical spring 148 biases the armature extension 136 to its proximally projected position when the armature is de-energized and has been pushed back by virtue of the picker tip 143 descending over a pin. A picker head 139 is secured to the distal end of the solenoid 138 and includes a tip 143 capable of carrying a circuit jumper pin 40. A microswitch 145 mounted on the carriage 69 is actuated when the armature extension 136 is proximally retracted (i.e., the solenoid is de-energized and a pin is in the picker) and is deactuated when the solenoid is energized.

The picker tip 143 includes a hollow cylindrical section for receiving the proximal end of circuit jumper pin 40. An annular protuberance or nub 147 extends radially inward in the hollow cylinder to reside in section 46 of jumper pin 40 when the jumper pin is fully engaged, thereby preventing jumper pin 40 from being inadvertently pulled from tip 143.

The proximal end of the solenoid armature 137 has a slightly enlarged diameter adapted to-abut an annular cammed portion 146 of the interior of the hollow cylindrical picker tip 143 upon actuation of the solenoid.

Referring to FIGS. 14 and 14a, when the solenoid is energized, the distal end thereof is projected distally causing the enlarged portion of the armature to forcefully bear against tip cam 146. Distally of the tip cam 146, the picker tip 143 is longitudinally slit to define four spreadable leaves or arms which open in response to the forward forceful bearing of the enlarged armature portion against tip cam 146. The opening of these leaves or arms removes the holding barks 147 from the pin 40 and allows further distal movement of the armature 137 to thereby permit complete ejection of pin 40 from picker tip 143 and into a matrix hole of the panel 10. Upon this distal movement of the energized armature, as best illustrated in FIGS. 15 and 15a, the pin 40 is completely ejected and the proximal end 136 of the armature clears switch 145 which deactuates to indicate that there is no pin in the picker. Note that when jumper pin 40 has been fully ejected, the enlarged diameter portion of the distal end of the armature has cleared the tip cam 146, thereby permitting the leaves of the picker tip 143 to close.

Figure 16A:
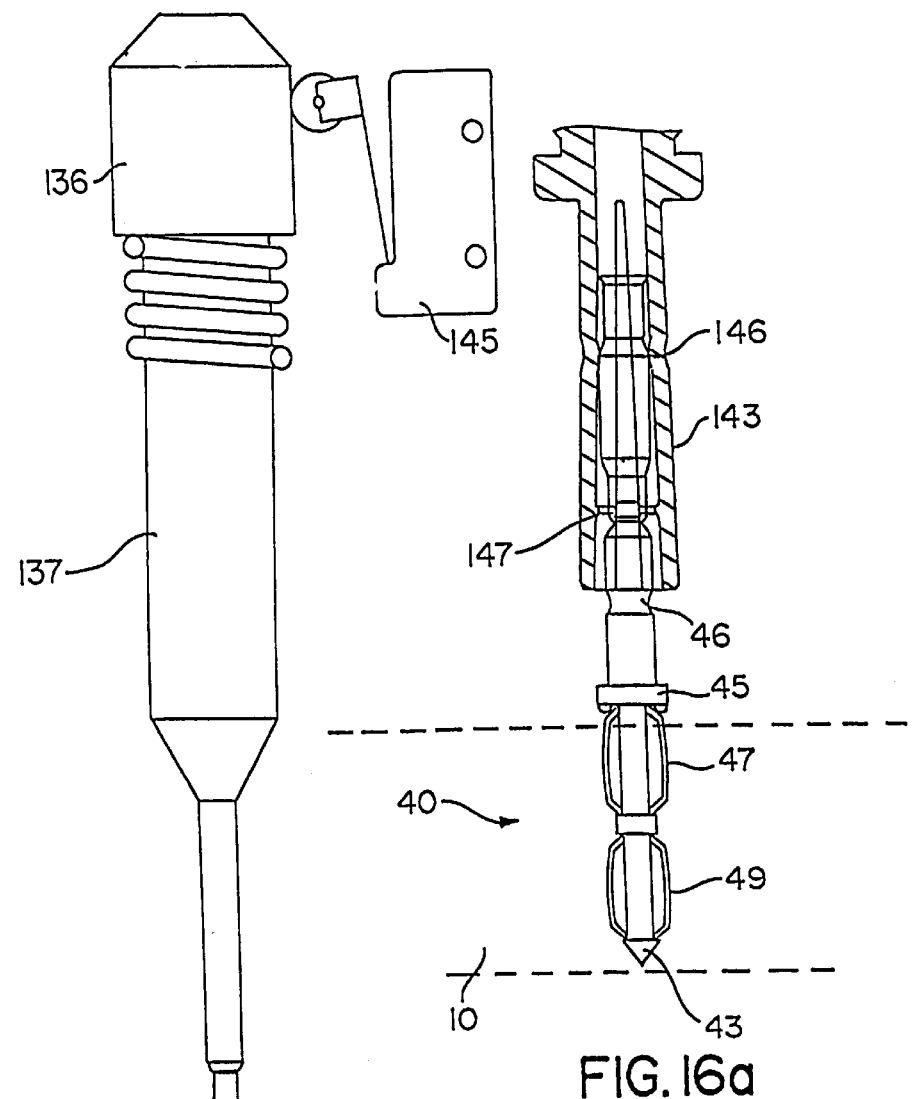
FIG. 16a is a detailed side view in partial section of the picker tip and jumper pin portion of FIG. 16.
Figure 16:
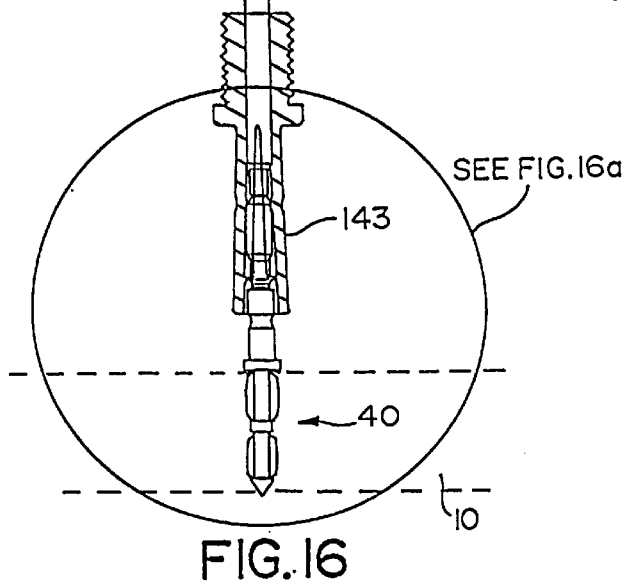
FIG. 16 is a side view in partial section of the pick and place mechanism showing a circuit jumper pin being engaged for removal from the matrix assembly.

Referring to FIGS. 16 and 16a, the initial portion of a pin picking operation is illustrated showing the circuit jumper pin 40 being forcefully urged against the distal end of the de-energized solenoid armature 137, forcing the enlarged portion of the solenoid armature proximally in forceful engagement with the tip cam 146 to spread the leaves of the picker tip 143 and permit entrance of the circuit jumper pin 40 into the picker tip 143 until it is openly engaged by protuberance 147 (as better illustrated in FIG. 12a). The pushing of the armature proximally actuates switch 145 to indicate that a pin is in the picker tip.

The matrix assembly described above may be used at a location remote from a telephone system central office to selectively connect subscribers to central office lines. This mode of utilization has been described above and in U.S. patent application Ser. No. 08/111,770. It is also possible to utilize the matrix assembly at the central office to eliminate the requirement for manually connecting tip and ring pairs between the mainframe and the central office switching equipment. In particular, in a typical telephone system, individual two wire lines from the customer's home or business are installed using various types of facilities, such as paired wires, buried cable, underground cable, etc. These smaller wire groups and cables are formed into larger cables that ultimately terminate at a telephone company mainframe at a central office. The mainframe has the necessary protective devices to prevent or reduce damage from lightning and other hostile environmental sources.

From the protected side of the mainframe, two wire jumpers for each customer, representing tip and ring, are manually installed and connected to the central office equipment line termination. These central office line terminations are permanently connected by cables to the central office switching machine, and are the connecting link between the physical facility and the software in the stored program control portion of the switching machine. Each central office line termination is associated with a respective telephone number in the stored program residing in the switching machine.

When a customer places a call, the receiver is lifted and a scanner in the switching machine peripheral equipment recognizes the "off-hook" condition and provides dial tone. The switching machine recognizes the digits dialed and translates them to the proper trunks that send the call to the desired location based on the dialed number.

For an incoming call the telephone numbers and codes dialed by the distance party are translated into the proper office equipment termination which is connected via a two wire jumper at the mainframe to the cable pair that is connected to the called customer's facility. When this connection is made, the switching machine applies ringing tones and current and, when the customer answers, conversation can begin.

Figure 17:
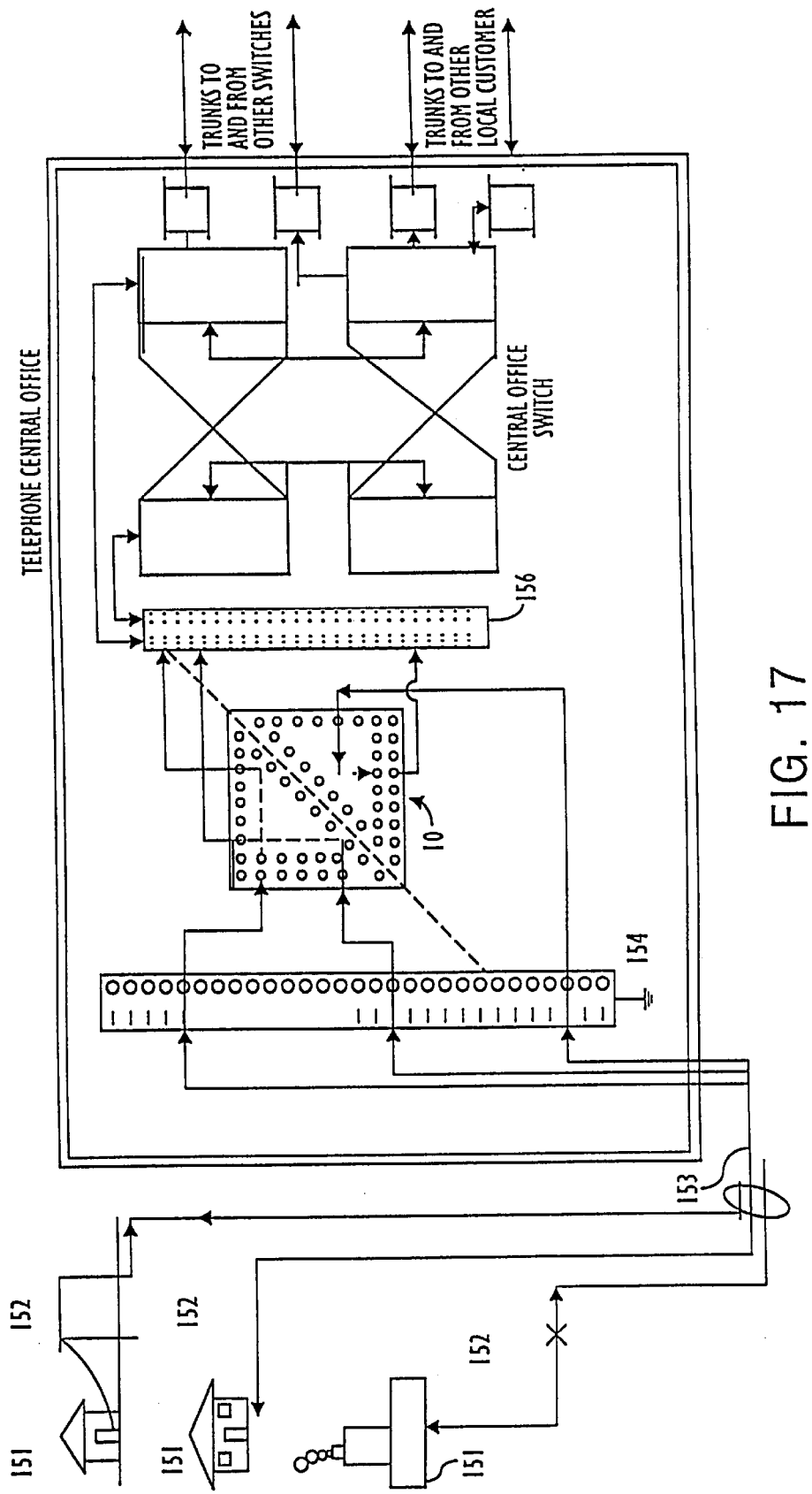
FIG. 17 is a schematic diagram of a telephone system utilizing utilizing the matrix assembly of FIG. 1.

The above explanation of a conventional system is presented in order to point out the facilities and components involved in system operation. When the customer disconnects and moves away from the dwelling or business unit, all of the facilities are left connected from the unit to the central office equipment. The expense and inefficiency of this method of operation is described hereinabove. The present invention provides methods and apparatus for solving these problems. One aspect of the invention, in this regard, involves inserting matrix assembly 10 in series with the customer's line between the protected side of the main distribution frame and the central office line equipment. This is a strategic point in the facility circuit, thereby eliminating the necessity of manually making the two wire cross-connection between the mainframe and the central office line termination. Referring specifically to FIG. 17, matrix assembly 10 is inserted in series with the customer lines 153 at a strategic point between the mainframe 154 and the terminating equipment at the central office 156. This permits all cross-connections between the mainframe 154 and the central office line terminating equipment 156 to be made automatically from a remote location, thereby eliminating the labor and the material expense of placing and removing cross-connections manually. The subscribers 151 and their individual two-wire lines 152 form part of larger cables 153.

Figure 18:
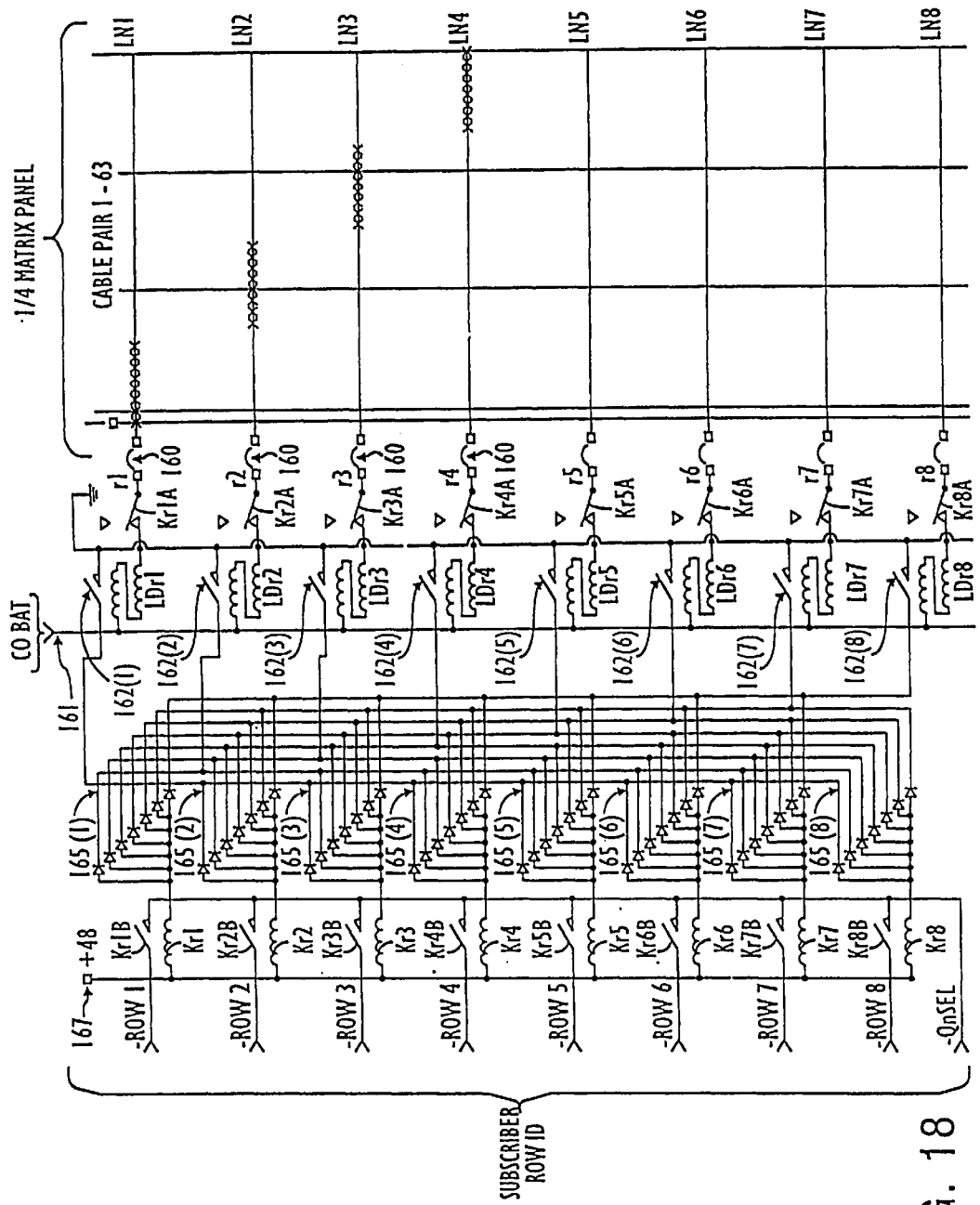
FIG. 18 is a schematic diagram of a portion of the circuit utilized in providing the soft dial tone feature of the present invention.

While this solves many problems for telephone companies such as the time and labor of manually making cross-connections, as well as the ability to make these connections at night during off hours from a remote location, the other problems described hereinabove are solved by other aspects of the invention as described below. Specifically referring to FIGS. 18 and 19, there is presented a schematic representation of the "soft dial tone" (SDT) option circuit board associated with a portion of a cross-connection matrix panel 10 of the type described above. The SDT option circuit board is typically installed on the back of the matrix panel. The rightmost one-third of FIG. 18 represents a portion of the matrix panel itself. Four groups of eight crosses ("X") are shown on lines Ln1, Ln2, Ln3 and Ln4. These crosses represent connecting pins fully inserted into the matrix holes 20 at these locations. In other words, for example, there are eight jumper pins 40 inserted into the matrix panel at line Ln1 which is so designated because it is in the first line position on the matrix. Note that until the connecting pins are inserted, line Ln1 has no significant correlation with any particular cable pair except that cable pair CP#1 happens to be a cable pair terminated on matrix line Ln1 when the connecting pin is inserted.

At the upper right portion of FIG. 18 there are illustrated cable pairs CP#1 through CP#63 terminated at the top of the matrix panel. Each of these cable pairs extend from the central office to the customer as previously described and are commonly referred to as "the subscriber loop". Any one of these subscriber loops can be connected to any horizontal line Ln1 through Ln75 by the insertion of a jumper pin 40 as described above. Thus, for the disclosed preferred embodiment, there are seventy five horizontal lines per quadrant of the matrix, and these lines are numbered Ln1 through Ln75, respectively.

It is important to note that the insertion of eight circuit jumper pins 40 on line Ln1 serves to connect one-half of each of the corresponding eight cable pairs CP#1 through CP#8 together on line Ln1. These pins have a contact sleeve on the ring portion of the jumper pin only (i.e., not on the tip portion of the jumper pin).

A second group of crosses is shown on line Ln2 and represents eight other subscriber loops CP#9 through CP#16 connected together on line Ln2. The same is true for the third and fourth groups of eight crosses designating connections of lines Ln3 and Ln4, respectively to cable pairs CP#17 through CP#24 and cable pairs CP#25 through CP#32, respectively. This pattern is repeated to provide eight groupings of eight cable pairs. In FIG. 18, however, there are only thirty two subscriber loops shown connected to four horizontal rows on the matrix panel.

Figure 19:
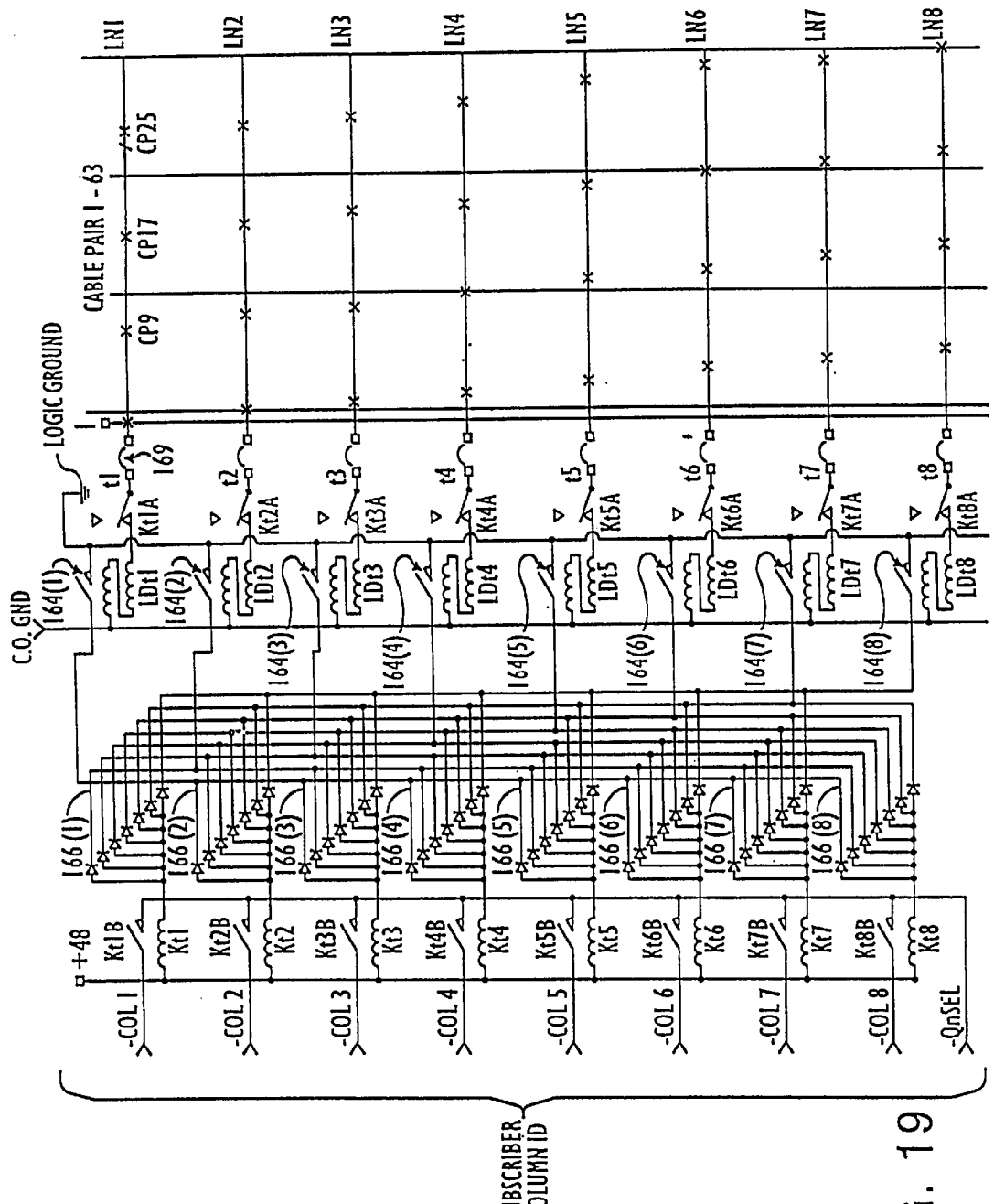
FIG. 19 is another portion of the circuit utilized in conjunction with the circuit portion illustrated in FIG. 18 to provide the soft dial tone feature.

It is to be noted that only the ring side of the cable pair circuits are considered in FIG. 18. This is accomplished by only connecting the ring side (i.e., the battery side of the loop) to the SDT circuit board. There is a wired connection 160 between the ring side of the horizontal line Ln1 and the SDT circuit board at r1. The tip side of all horizontal lines Ln1 through Ln8 are not shown connected in FIG. 18; instead, FIG. 19 is concerned with the tip side of the circuits. The circuitry effectively splits the tip and ring sides of all cable pairs, putting the ring sides under control of the SDT circuit board of FIG. 18 and the tip sides under control of the SDT circuit board of FIG. 19. It is to be noted that, in FIG. 19, circuit jumper pins designated by crosses are inserted in line Ln1 to tie together cable pairs CP#1, CP#9, CP#17, CP#25, etc.; that is, the first cable pairs from each grouping of eight are tied together. These circuit jumper pins have a contact sleeve only on the tip portion of the pin. Likewise, on line Ln2, cable pairs CP#2, CP#10, CP#18, etc. are tied together; these are the second cable pairs of each grouping of eight. This pattern is continued through all of the other pair groupings and is done in order to provide a means of uniquely determining which cable pair (of the sixty two total pairs) goes off-hook in a request for service.

At the upper central portion of FIG. 18, reference numeral 161 represents the connection to central office battery. Eight sets of dual winding coils Ldr1 through Ldr8 are connected to this central office battery lead 161. These dual winding coils serve as loop current detectors. A respective set of contacts 162(1) through 162(8) is associated with respective loop current detectors Ldr1 through Ldr8. When current flows through any one of these loop current detectors, the contact 162 associated with that current detector closes. Referring to FIG. 19, it is observed that the same arrangement is provided for the tip side of the circuit. The tip side detectors LDt1 through LDt8 have respective contacts 164 (1) through 164(8).

Referring back to FIG. 18, a logic ground connected to the normally open side of the contact associated with loop current detectors Ldr1 through Ldr8. The common terminal of these contacts is connected to diodes in eight sets of diode matrices 165(1) through 165(8). Each diode matrix 165 is associated with a respective relay coil Kr1 through Kr8, and the diode anodes is each matrix are connected together and to one side of the associated relay coil. The cathodes of each of the eight diodes in each matrix 165 are connected to a respective common terminal or contact 162(1) through 162 (8) of a respective relay Ldr1 through Ldr8. The same arrangement is provided in FIG. 19 for the tip side of the SDT line. In this case the relays are numbered Kt1 through Kt8 and the respective diode matrices are designated by reference numerals 166(1) through 166(8).

In describing operation of the system, it is assumed that a potential customer moves into a vacant dwelling or office unit that has cable pair CP#17 connected thereto. When the customer requests telephone service, the receiver is lifted off-hook, and the switch contacts in the telephone unit close to complete the loop circuit. In FIG. 18, cable pair CP#17 has the first cross (i.e., "X") on line Ln3 (for Ring side). In FIG. 19, cable pair CP#17 has the third cross on line Ln1 (for Tip side).

From the central office battery connector 161 (FIG. 18), current flows through loop current detector Ldr3, the normally closed contacts Kr3A of relay Kr3, and connection 160 to the matrix panel. At the matrix panel the current flows through the cross-connection ("X") at cable pair CP#17 and line Ln3, up through the matrix cable pair CP#17, out through the subscriber loop and through the telephone unit switch hook. The current path returns to the tip side of the cable pair and re-enters the matrix (FIG. 19) on cable pair CP#17 at line Ln1. Current then flows through cable pair CP#17 to the tip cross connection ("X" at cable pair CP#17 and line Ln1, then through the normally closed contacts of relay contact Kt1a through the tip side loop detector relay Ldt1 and back to central office ground. This path is a complete circuit for the dial tone request. In this condition there are two and only two loop detector relays actuated, namely relay Ldr3 on the ring side and Ldt1 on the tip side.

When loop detector Ldr3 is actuated, a circuit path is completed from logic ground through the closed contact 162(3) of loop current detector Ldr3, through the diode associated with relays Kr1, Kr2, Kr4–Kr8, and through the windings of these relays to +48V. The current through this path actuates all relays Kr1 through Kr8 except for relay Kr3. Normally closed contacts Kr1a, Kr2a and Kr4a through Kr8a open as a result of their respective relays being actuated, but contact Kr3a remains closed. The actuated relays Kr1, Kr2 and Kr4 through Kr8 open the circuits for all telephone lines in the groups of eight except for those on line Ln3; this is because contacts Kr3a remain closed.

When current flows in cable pair CP#17, relay coil Ldt1 (FIG. 19) is energized and closes a circuit path for logic ground through contact 164(1) associated with relay Ldt1. Voltage is present at the windings of every relay Kt2 through Kt8 which are thereby energized through their connections to +48V. Relay Kt1 is not actuated, however. This opens relay contacts Kt2a through Kt8a, thereby disconnecting the tip side of the matrix, except for connections to line Ln1. Line Ln3 (FIG. 18) and line Ln1 (FIG. 19) are the only lines having access to central office battery and ground under these conditions. In other words, cable pairs connected to Ln3 are the only cable pairs provided with central office battery on the ring side, and cable pairs connected to line Ln1 are the only cable pairs connected to central office ground on the tip side. Accordingly, only that cable pair connected to both lines Ln3 and Ln9 can draw loop current.

The system must identify which cable pair has gone off hook. In this regard, it is noted that all of the Kr and Kt relays except Kr3 and Kt1 are actuated. This specifies unique column and row signals available for the system to determine the exact cable pair that is presently off-hook. The row identifications are indicated at the left hand side of FIG. 18, while the column identifications are indicated at the left hand side of FIG. 19. What is sent back to the control unit is the row number three and column number one indication. This is the unique signal applicable only to cable pair CP#17 going off-hook. A unique circuit path is thus provided between central office battery and central office ground, and is connected between the r and t pair of lines designated Q1SDT shown in the upper left corner of FIG. 20. In this regard, the "Q1" portion of the signal designates a particular quadrant, namely quadrant one, of the matrix panel. Accordingly, the Q1SDT signal is the soft dial tone signal for quadrant one. That signal actuates loop detector relay 170 to close relay contact 171 and place -GNDout (i.e., logic ground) on the OPTO-1 line.

The previously described operations are all completed automatically by the SDT hardware in less than twenty milliseconds. The system periodically polls the OPTO-1 line to determine if a party on quadrant one seeks soft dial tone service. In a system utilizing plural matrix panels, the system determines which panel has brought up the OPTO-1 signal. The system thus knows which panel and quadrant is requesting soft dial tone service. Ground and forty-eight volts are then provided to read the matrix row and column codes identifying the soft dial tone requestor as indicated by the energized Ldt and Ldr relays. Specifically, referring again to FIGS. 18 and 19, the -Q1SEL signal (i.e., the select signal for quadrant one) provides a ground on rows one through eight (FIG. 18) and columns one through eight (FIG. 19) to indicate which cable pair is requesting service. This information is also required to determine the circuit jumper pins that must be moved to effect service on the requestor's line without additional lines being partially "bridged" to that line. In this regard, the term "bridged" is not intended to mean parallel connection of lines in the conventional sense of both tip and ring of two or more lines being connected together. Rather, in the example described, the tip of cable pair CP#17 is connected to the tip of cable pairs CP#1, CP#9, CP#25, CP#33, etc., and the ring of cable pair CP#17 is connected to the ring of cable pairs CP#18 through CP#24.

Referring again to FIG. 20, the -Q1SEL signal also energizes relay K1. This serves to transfer central office battery from contact K1b, and to transfer central office ground from contact K1a, to soft dial tone ring and tip, respectively, on the Soft Dial Tone Buss. As a result, the customer on cable pair CP#17 is provided with a connection to the Soft Dial Tone Buss.

Figure 21:
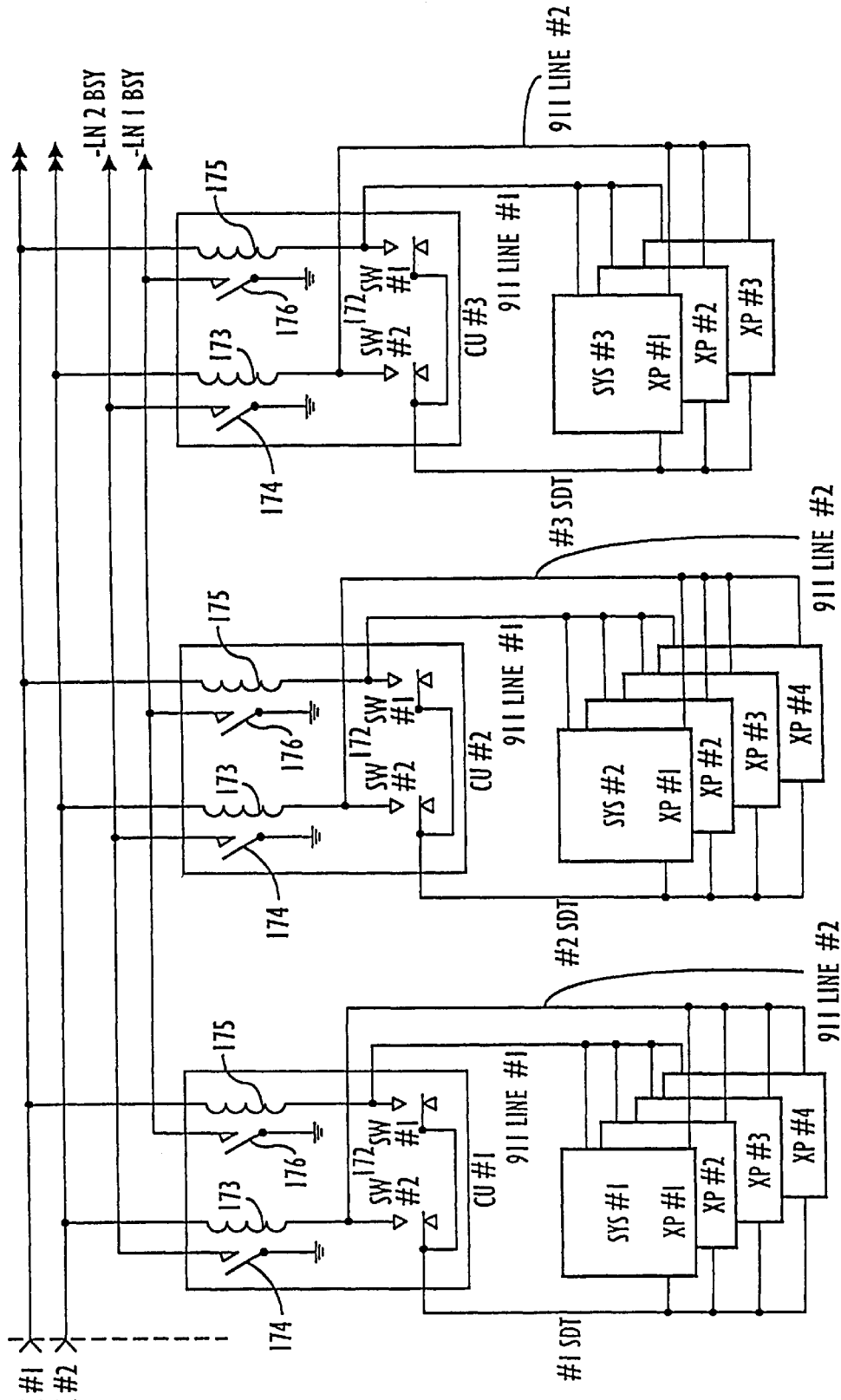
FIG. 21 is a schematic diagram of three separate matrix assemblies connected together in providing the soft dial tone feature of the present invention.

For an explanation of how all systems and individual panels of a multiple panel system are connected to the central office to receive soft dial tone, reference is made to FIG. 21 wherein three control systems for three cross connection systems are shown. System one is shown as including four panels XP#1 through XP#4 and typically would serve one thousand lines; system two is similarly configured with four panels; and system three has three panels to typically serve seven hundred and fifty lines. Each system is connected by two dedicated lines to a telephone central office. Depending upon the volume of calls, there may be up to eight of these dedicated lines. The dedicated lines are physically the same as any other telephone line except that their central office terminations are treated for soft dial tone in the software of the central office switching unit to prevent any user from calling any number except the emergency 911 and the number of the telephone business office.

The two soft dial tone lines illustrated in FIG. 21 are designated 911-Line#1 and 911-Line#2. Control units shown in FIG. 21 are designated CU#1, CU#2 and CU#3; that is each of the three systems has its own control unit. Each control unit has its own relay switches 172 which, when actuated, have the capability of connecting the calling line to one of the dedicated central office soft dial tone lines. Each of the control units CU#1 through CU#3 has the capability of determining, by virtue of line detectors, whether or not there is a party connected to a 911 line and, by virtue of the line detectors in the other control units, whether or not the other systems have a party connected to a 911 line.

Referring still to FIG. 21, for purposes of the present description it is assumed that control unit CU#2 has connected one of its controlled calling cable pairs to 911-Line#2; accordingly, current through the loop, as previously described, flows through line detector relay 173 of control unit CU#2. When the relay contact 174 associated with relay 173 is thusly closed, it places ground (a low logic level) on the −LN2BSY (i.e., line 2 busy). This low logic level is available to all other control units to indicate that the 911-Line#2 signal line is busy and not available for connection to other telephone lines. Thus, the three separate multi-matrix systems share two 911 lines, and each system control unit is capable of determining whether or not these lines are available or busy.

At the lower left corner of FIG. 21 there is a signal designated #1SDT representing the soft dial tone buss for system number one. This buss is present on every panel of system number one. Since the control unit CU#1 has selected only a particular panel (i.e., the panel having the first customer calling in on a cable pair), the #1SDT signal is provided only from the selected panel, and is applied to both switches SW#1 and SW#2 of switch pair 172 for system one. This configuration is duplicated in system two and system three (and in any additional systems).

Control unit CU#1 interrogates both the 911-Line#1 and 911-Line#2 by means of line detection relays 175 and 173, respectively. Thus, if 911-line#2 is available for use, a relay is actuated to close SD#2 of switch pair 172 so that the #1SDT buss can be connected through to the 911-line#2. The customer utilizing cable pair CP#17 is thusly connected directly to a hard-wired circuit at the telephone central office switching machine. This circuit, as described above, is treated for soft dial tone.

By energizing relay 173 connected to the 911-line#2 line, the control unit CU#1 for system number one has notified all other control units for the other systems that the 911-line#2 signal line is busy and not available for connection.

It must be remembered, from the description of the circuitry in FIGS. 18 and 19, that the above-described connection is not a "good circuit" because fourteen other circuits are still partially bridged to cable pair CP#17 even though those circuits are not themselves in the off-hook state. This is similar to party line operation. The capacitance of these lines, depending upon their lengths and degree of line balance, tend to have some degrading effect on the high frequency components of voice signals on cable pair CP#17. On the other hand, the bridged lines have little effect on central office supervision (i.e., the ability of the central office switching machine to recognize off-hook signals, dial pulses, etc.) and on dual tone multi-frequency (DTMF) signals. Therefore, the switch accepts the call and begins call progress toward the business office or 911 control, depending upon which number the customer dials.

All of the circuit operations described above are initiated when an off-hook condition exists on cable pair CP#17 and all of the operations are rapid and automatic. By the time the customer places the receiver to his/her ear, the customer is connected via the soft dial tone line in the manner described and hears conventional central office dial tone. With this type of connection, the call may be completed and conversation may take place. It will, however, sound "tinny" if very long customer loops are utilized. Since the soft dial tone customer is not paying for regular telephone service, this condition would be satisfactory for most situations. However, in order to eliminate the possibility of service problems, the present invention provides for removing all bridged connections to the line being connected to the central office dial tone facility. Specifically, the system removes the bridged lines and provides a standard high quality telephone circuit during the period of time between the customer goes off-hook and the call is answered. This is achieved in the manner described in the immediately following paragraphs.

Figure 20:
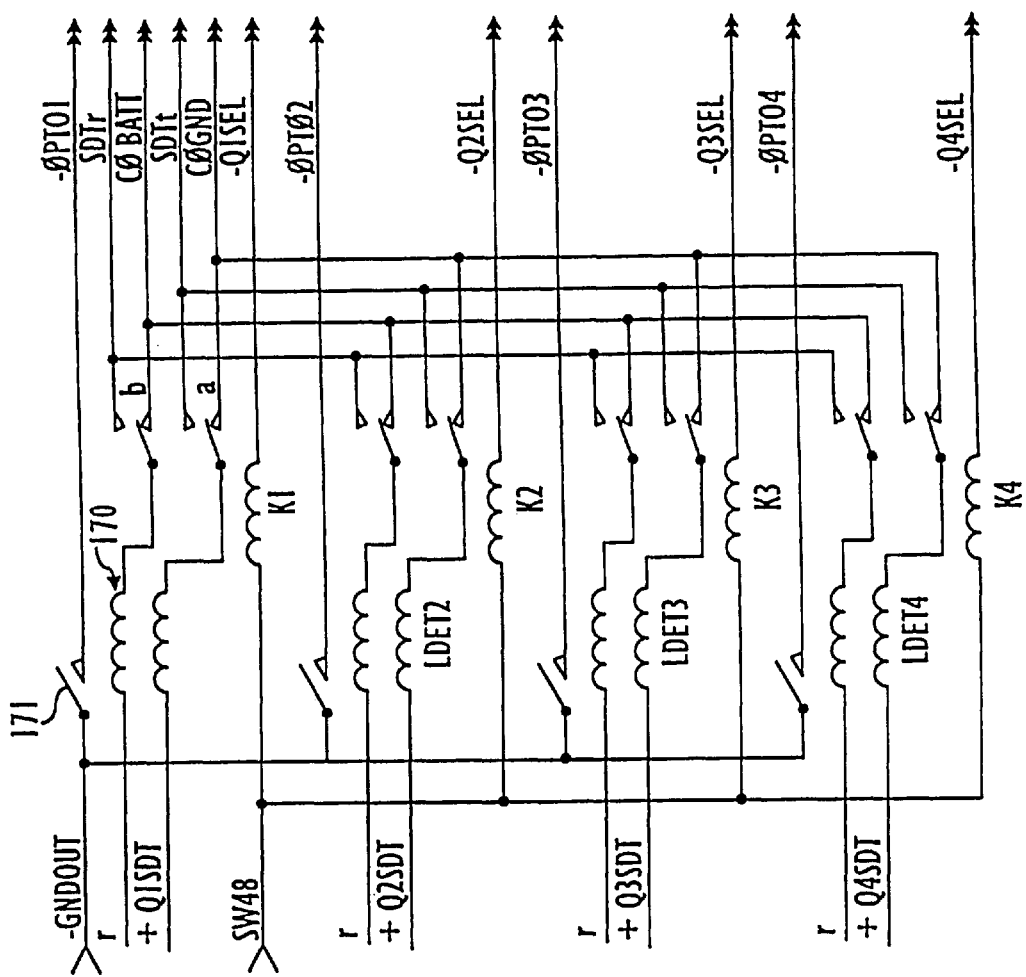
FIG. 20 is a schematic diagram of still another portion of the circuit utilized to provide the soft dial tone feature.

Referring to FIG. 21, the telephone circuit from the 911-line#2 line, through the loop detector relay 173 to the #1SDT buss and back to the circuitry in FIG. 20, has been completed in the above-described example. The circuit extends through respective contacts K1a and K1b of loop detector relay K1 in FIG. 20 to provide the two Q1STD signals for the circuitry in FIGS. 18 and 19.

In FIG. 19, the STD tip signal passes through the line detector relay Ldt1 and closed relay contact Kt1a to terminal $t_1$ where it is connected by means of connection 169 to the matrix illustrated at the right hand side of FIG. 19. At the matrix the signal passes through the circuit jumper pin in the matrix hole at the seventeenth position to the customer's hook switch and on to the customer's ring side of the line. From there the signal returns, in FIG. 18, on line Ln3 through the connecting pin in the seventeenth position. From there the signal progresses from the matrix through the cross connection to the soft dial tone circuit board at terminal $r_3$ via connection 160. At the soft dial tone circuit board the signal passes through relay contact Kr3a, loop detector Ldr3, and back to the SDT ring side to complete the circuit.

The lines that are still bridged in parallel with cable pair CP#17 are seven circuits on line Ln3 (FIG. 18) and seven circuits on Ln1 (FIG. 19). In order to remove the bridged inactive subscribers from the line, the unique capabilities of the system pick and place mechanism described above are utilized. Specifically, the calling line (i.e., cable pair CP#17) is transferred to a direct line at the central office by means of the matrix. This is achieved while the call is in progress and while all of the other bridged lines are being removed, and it is achieved without interrupting the call. The only indication to the customer that anything is happening on the line is a cessation of any line hum, and the transmission suddenly becomes clearer. To achieve this, and referring to FIG. 21, it is noted that for the above-described example, the buss 911-line#2 is present on panel XP#1 of system number one. It is also present on each quadrant of the other panels XP#2, XP#3 and XP#4 of that system. Still assuming that the calling line CP#17 is in quadrant one of panel one, upon completion of the path as described above, the software in control unit CU#1 commands the pick and place mechanism to remove a pin from a spare pin location on the matrix and place it (see FIG. 19) at the seventeenth column on line Ln9. This ties line Ln9 directly to 911-line#2 through the line detector relay 173 (FIG. 21). The foregoing provides the connection and keeps a busy condition on the 911-line#2 line.

Under the described conditions there exists a parallel connection for cable pair CP#17. Specifically, the original connection on the soft dial tone buss is still present. Since that connection is the link to the parallel telephone lines bridged to cable pair CP#17, it is necessary to release that connection in order to remove all lines bridged to cable pair CP#17 and thereby provide a perfect telephone line. An important aspect of the present invention is that, since it is a parallel connection, the soft dial tone connection can be removed with no adverse effect while the call is in progress to 911 or to the telephone business office.

Referring to FIG. 18 to illustrate how the soft dial tone connection and bridged lines are released, as soon as the second connection is made (as described above) the pick and place mechanism is commanded to remove the circuit jumper pin at line Ln3 and place it in an unused or park position on the matrix. This has the effect of removing seven of the fourteen cable pairs that were bridged to line Ln9. In other words, once the direct connection to the soft dial tone telephone line has been made, the temporary connection is removed to remove the bridged cable pairs. When this is completed the pick and place mechanism is commanded to move to line Ln1 and remove the pin that is at column seventeen and place it in a non-used or park position on the matrix. This has the effect of removing the other seven lines that were still partially bridged or paralleled with line Ln9. At this time no other party is on the telephone company 911 circuit except the party connected to cable pair CP#17. The calling customer is thus provided with a circuit having a quality as good as that provided for any paying customer connected to the system.

Removal of the –Q1SEL signal can now be effected to restore all contacts to their original state in preparation for the next request for service. Pulling connector pins from column seventeen on line Ln3 of FIG. 18 and line Ln1 in FIG. 19 prevents any loop current from flowing through loop detector relays Ldr3 and Ldt1. This deactivates all relays Kr1 through Kr8 (FIG. 18) and Kt1 through Kt8 (FIG. 19) and places them in a ready state for the next request for service. The system has thus made a direct connection to a normal telephone line for cable pair CP#17, and the panel and quadrant have been released and made ready to serve the next soft dial tone requester.

It should be understood that, for purposes of facilitating understanding the drawings, only two telephone company 911 soft dial tone lines are shown in the drawings. In this implementation up to eight lines may be utilized for this purpose.

It should also be noted that, for purposes of facilitating understanding, only three systems are illustrated in FIG. 21, and these systems, in the described example, service a total of two thousand seven hundred and fifty lines. Depending upon the needs of the telephone company and the anticipated usage, the system can be separately configured so that all customers can be served in one system, and that any particular matrix system can be configured in any given size and shape to serve the needs of the telephone company.

The foregoing description relates to the insertion of the matrix system of the present invention at a strategic point in a telephone system central office so as to permit remote and automatic control of the placing, moving and removing of cross connections between a cable pair from the premises of a customer and a central office line termination. Also described is a method and apparatus for deploying the matrix system in a manner to relieve telephone companies from the requirement of leaving expensive central office line terminations connected to every non-working cable pair, i.e., dedicated inside plant. Further, the foregoing describes a method of immediately identifying a particular customer from among thousands that may be requesting service from non-subscriber cable pairs.

The foregoing description is based upon the presence in the central office switching machine of software capable of denying access to connected but non-paying stations to all numbers except 911 and the telephone business office.

Figure 37:
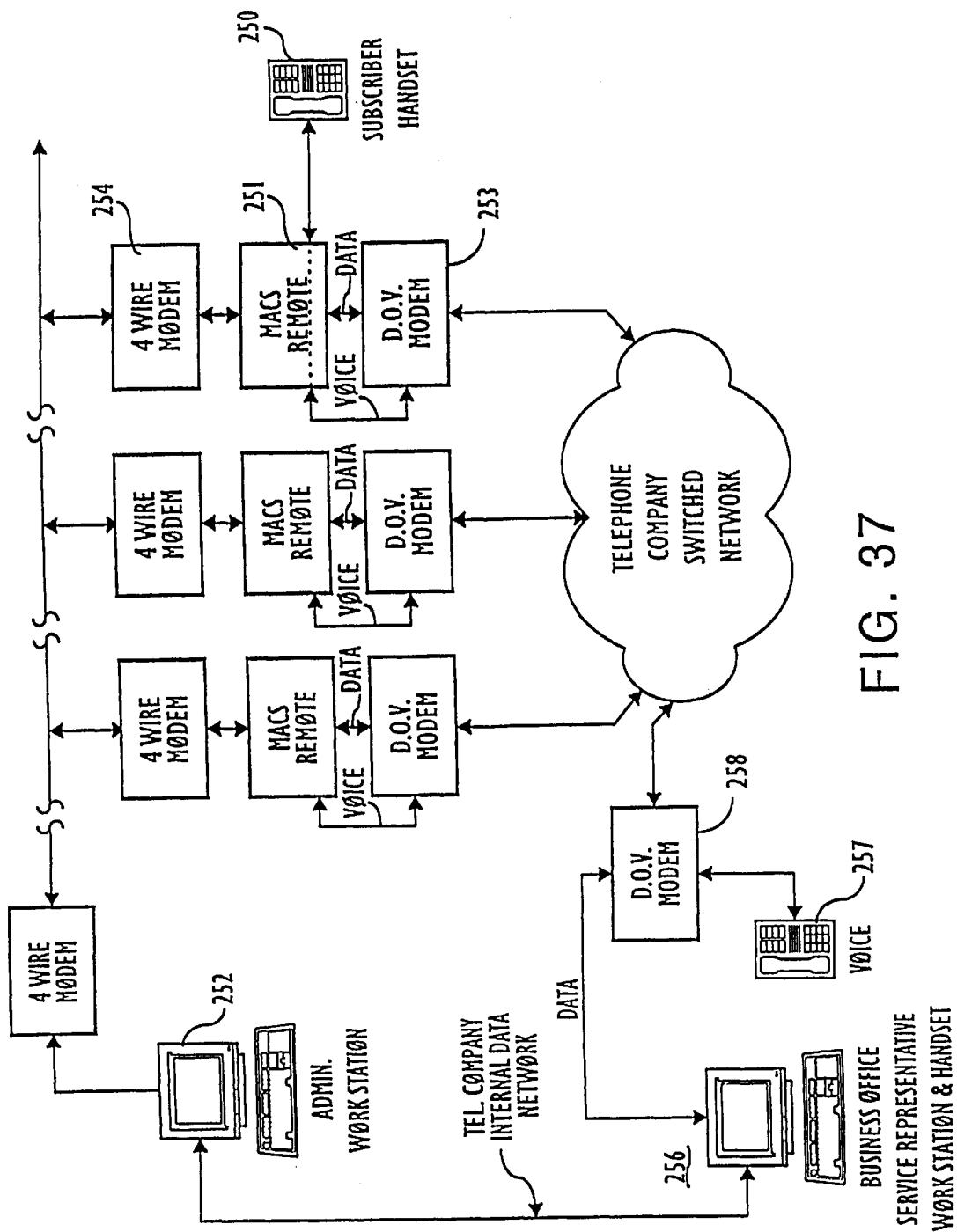
FIG. 37 is a functional block diagram of the system of the present invention and illustrates the manner in which the cable pair and address can be obtained automatically for a soft dial tone caller requesting connection for permanent service.

A further feature of the invention, as illustrated diagrammatically in FIG. 37, is the ability to collect and store a prospective customer's facility and dwelling or business data at a remote matrix system and then transmit the data to a video screen at the service representative's position. This is effected in response to a call from a customer applying for service. As described above, this feature greatly expands and magnifies the capabilities of the telephone system and, therefore, the value to the telephone company of the present invention.

When a customer applying for service lifts the receiver 250 to place the call to the business office, the remote matrix system 251 recognizes the off-hook condition and identifies the calling cable pair used by the customer in the manner disclosed above in relation to the soft dial tone feature of the invention. The remote matrix 251 then automatically requests the other facility data previously stored at the administrative workstation 252 for the specific address associated with that cable pair. The caller is automatically connected via data-over-voice (DOV) modem 253 and begins dialing the business office. The facility data for the calling cable pair and the customer's address are then down-loaded via a four-wire modem 254 to the remote matrix system and stored. When the telephone 257 rings at the service representative's position 256 and is answered, the off-hook at the service representative's position is seen by data-over-voice (DOV) modem 253 as a "go ahead" and all facility data is transmitted to the service representative's video screen.

With the exact facility data for the address of the calling customer visible on the screen, conventional customer contact takes place. When all credit and contact information is taken from the customer, the service representative calls the administrative workstation 252, down-loads all facility and address information, and instructs the operator to establish permanent service. With the customer on-line, the line is tested for satisfactory service, and permanent service is then established.

A further feature of the invention relates to providing means for testing vacant (i.e., non-working) cable pairs remotely. In the prior art, there is no capability of testing non-working telephone lines utilizing central office mechanized loop testing equipment. This is because all automatic test equipment makes connections to the telephone line via a telephone number. If a line does not have a telephone number assigned to it, the only way to test the line is to have a technician travel to the mainframe, install a "test shoe" which connects a volt meter circuit to the cable pair, and perform the test manually. This is so time consuming as to render the procedure economically unfeasible. The present invention solves this problem in the manner described below.

Figure 22:
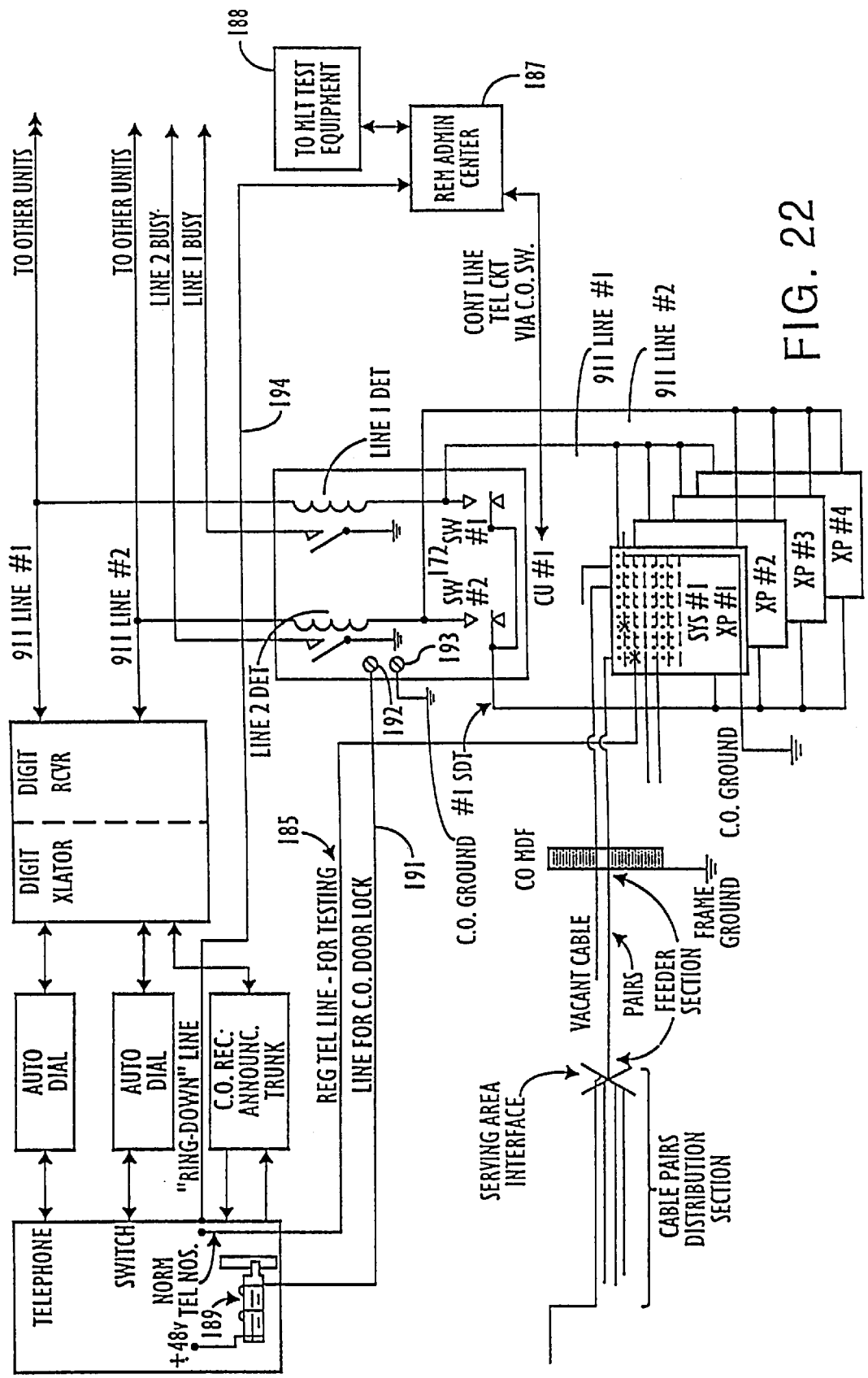
FIG. 22 is a schematic diagram of the circuitry utilized to provide automatic testing of unused cable pairs according to the present invention.

Referring to FIG. 22, a regular telephone line 185 for testing is connected to a horizontal line on matrix panel XP#1 of the present invention. The system administration center is aware, by pre-programming, of the X-coordinate line to which 185 is connected. Cable pairs for that quadrant are terminated on the vertical or Y-coordinate columns, and the system is aware of which cable pairs are vacant and to which columns they are connected. When it is desired to test a vacant cable pair, no action is needed by technicians. Rather, at the remote administration center 187, the administration center manager orders the pick and place mechanism to make the connection between a cable pair in the matrix column to be tested and the test line 185. This makes the selected vacant cable pair temporarily the same as a working telephone line using the number assigned to the system test line. The mechanized loop testing equipment 188 is then utilized to conduct all tests normally done on a working cable pair.

The system thus provides telephone companies with a test feature not presently available. The technique is also advantageous in central offices not equipped with special devices and test capabilities.

As noted above, the security of central offices in telephone systems is of great concern. Even small, unattended offices contain millions of dollars worth of equipment, test gear, records and building investment. Labor costs have created the need for operating these offices in an unattended mode with technicians being dispatched thereto from a central location only when necessary. There are numerous different work groups requiring entry into these offices. To provide all members of these groups with a key to the office doors is tantamount to leaving the door open. Presently, multiple different schemes for protecting keys are utilized by telephone companies. The present invention provides telephone companies with an economical and positive way of assuring the security of these buildings. This feature is also illustrated in FIG. 22.

Specifically, electric door locks 189 are installed on all buildings controlled by the remote administration center 187. The system control unit CU#1 provides access to two sets of relay contacts via a screw terminals. The door lock solenoid is connected to a central office battery, the other side of the solenoid to a central office door lock line 191 which, in turn, is connected to one screw terminal 192 on the back of the control unit. Central office ground is connected to the other screw terminal 193. A standard "ring down" telephone is installed between the doors of all buildings to the administration control center. A "ring down" line is a line that rings automatically in a remote location when the receiver is lifted at the other end; i.e., no dialing is necessary. When an employee desires to enter a telephone building, he/she lifts the receiver on the ring-down telephone mounted in a weatherproof housing at the entry point. The telephone automatically rings in the administration center 187 via the special line 194. The attendant at the administration center answers and asks the employee for his/her password. All employees authorized to enter the particular building are assigned respective passwords associated with their names. When the correct password is given, the administration control center commands the matrix system to activate the relay to complete the circuit from the central office battery (i.e., plus 48 volts) through the winding of the door lock solenoid 189 to central office ground. This causes the door to be unlocked. The control unit CU#1 is programmed to leave the door relay closed for an arbitrary time interval (e.g., approximately fifteen seconds and then de-activate it. This locks the door circuit until the next authorized entry. The central office control software automatically maintains a record of the date, time and name of the person who entered the facility.

Although the security mechanism described above is not technically sophisticated, it is economical, sure-acting, and far superior to the present key system currently in use. Although numerous technically sophisticated systems can perform the security function, they tend to be quite expensive, thereby explaining why telephone companies have chosen not to install security systems. The present invention, in its ultimate simplicity, meets these needs of a telephone company.

Figure 23:
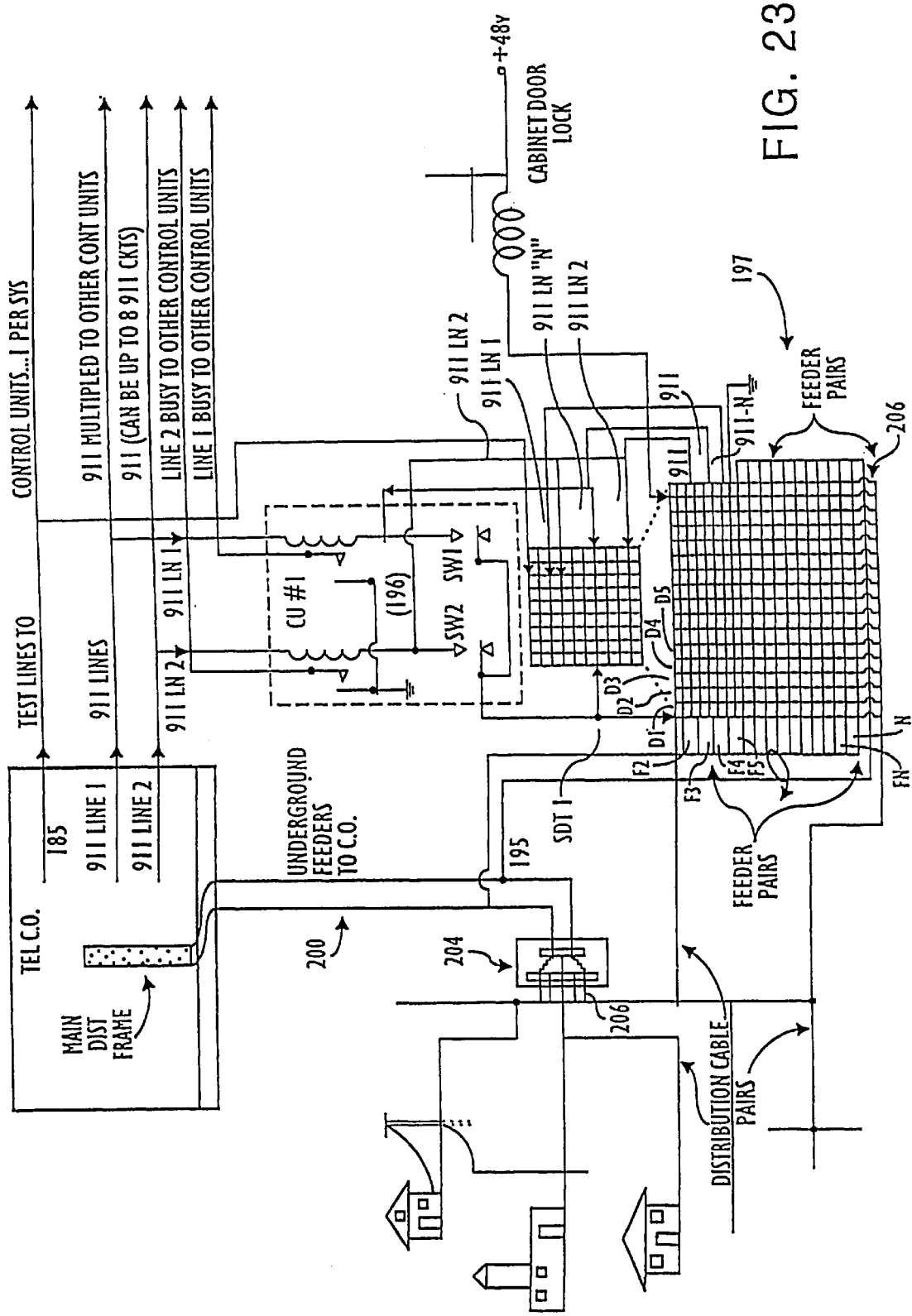
FIG. 23 is a schematic diagram of a circuit for providing additional features according to the present invention.

The system disclosed herein in connection with FIG. 17 eliminates the need for telephone companies to maintain excessive investment in central office line equipment and telephone numbers in order to operate in a Dedicated Inside Plant (DIP) mode. A further object of the invention is to enable telephone companies to eliminate the investment in outside plant cable pairs necessary for them to operate in a dedicated outside plant (DOP) mode. It will be recalled that FIG. 17 illustrates a system wherein the matrix assembly of the present invention is installed between the central office mainframe 154 and the central office line terminating equipment 156 in order to eliminate the labor of placing and So removing two-wire cross-connections manually. Referring now to FIG. 23, a serving area interface 204 of the type typically utilized by telephone companies is essentially a manual cross-connection point. It functions exactly like a mainframe cross-connection process in the central office. In the typical outside plant equipment, the feeder cable pairs 195 from the central office mainframe to the interface are connected to terminal strips inside the interface. Technicians typically place a two-wire cross-connection between these terminal strips in order to connect a pair of wires from the central office to the customer. The purpose of having a serving area interface 204 is to make concentrated feeder pairs available to a wide number of distribution cable pairs that are spread over a large geographical area. It would greatly reduce the flexibility of the investment in feeder cable pairs to have them connected directly to the distribution cable pairs in all cases.

Just as the matrix assembly of the present invention is installed between the cable pairs and the central office line termination as shown in FIG. 17, the matrix assembly of the present invention can be inserted in the connections between the distribution cables and the central office feeder cables in a system shown in FIG. 23. Specifically, this is done at the interface 204 where the SDT circuit board 196 is installed and the feeder pairs 200 are cut as indicated at 195. The feeder pairs are also disconnected from the interface 204 and connected instead to the horizontal traces of the matrix panel 197. The distribution pairs 206 are removed from the interface 204 and terminated on the vertical traces of matrix 197. This effectively provides soft dial tone service for as few as two hundred fifty subscriber pairs using only four-to-eight feeder pair. This configuration is expandable to up to five thousand lines per system.

A test line 185, the 911-line#1 and 911-line#2 lines, are connected to the matrix unit 197.

In the system as thusly configured, the matrix assembly functions under the control of the remote administration center just as if it were in the central office. Therefore, the explanation as to how the system provides soft dial tone and reconnection services for several thousand cable pairs using only a few dedicated 911 lines is the same as previously described and set forth above in connection with the central unit.

The circuit jumper pin 40 described hereinabove in relation to FIG. 4 is effective to accomplish connections at a matrix assembly in the manner described. That pin is also useful to effect connections for the soft dial tone operation described above in relation to FIGS. 18–20. However, use of circuit jumper pin 40 requires a plurality of individual picker movements in the connection/disconnection process, resulting in the process consuming more time than is desirable for certain applications. For example, if the system calls for a specific connection to be made, the picker unit must be translated along the X and Y axes successively to reach a spare pin location, then moved along the Z axis to first engage and then remove the spare pin, then translated along the X and Y axes successively to the matrix hole at which a connection is to be made, and then moved along the Z axis to first insert the pin and then withdraw from the inserted pin. The total time required for the procedure depends on the distances traversed by the picker, but typically require on the order of fifteen or more seconds. This may be generally acceptable when making a permanent connection for a new subscriber since the subscriber is not on the line waiting for the connection to be made. On the other hand, during the soft dial tone procedure the caller lifts the handset and expects to immediately hear dial tone. If the soft dial tone bus is currently in use for the period of time to remove two soft dial tone pins," the absence of dial tone for so long a time may result in the party replacing the handset and assuming that the dial tone is not available. In order to reduce the connection time, therefore, a modified circuit jumper pin configuration has been provided and is illustrated in FIG. 24 to which specific reference is now made.

Figure 24B:
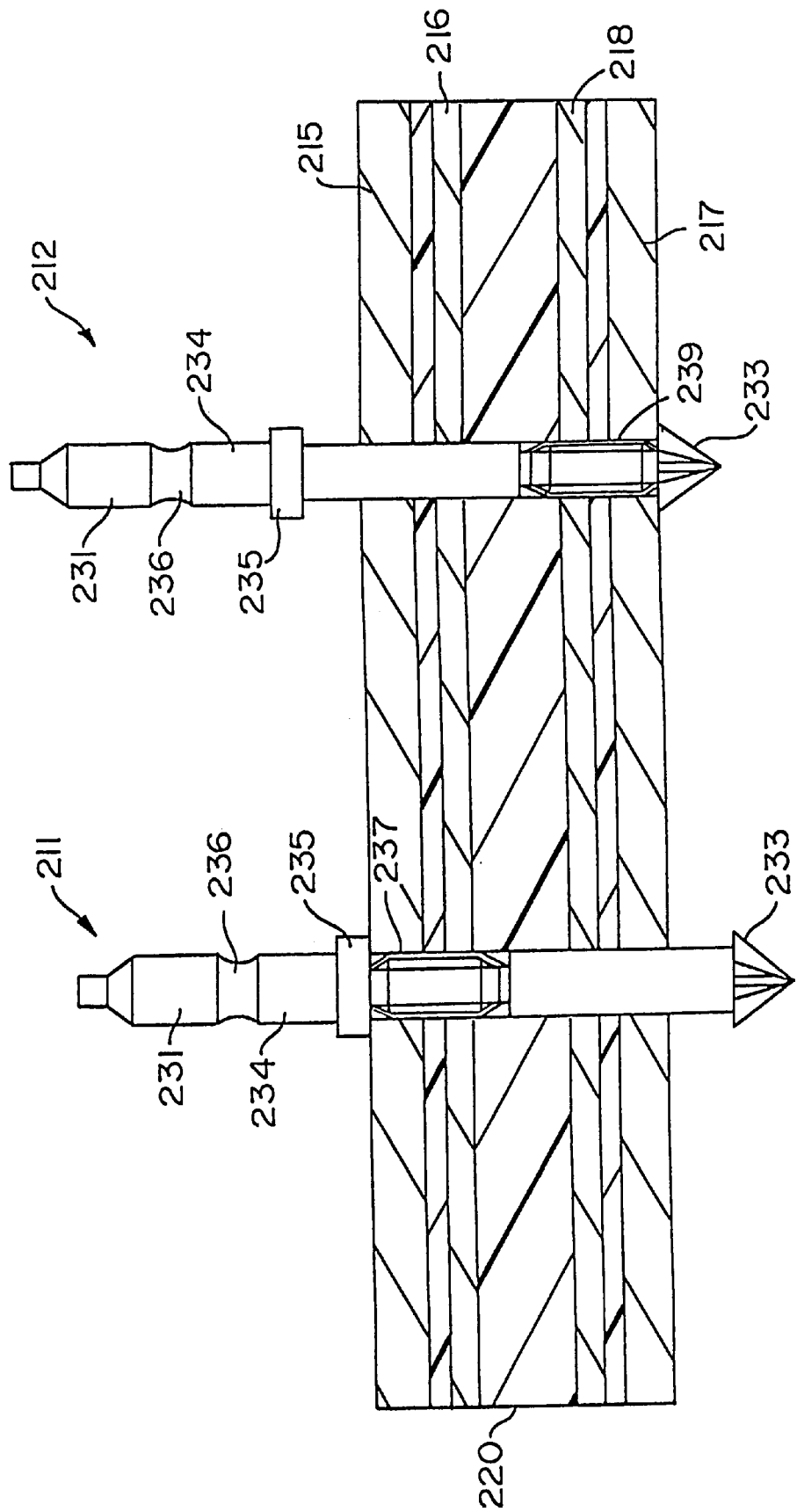

FIGS. 24a and 24b diagrammatically illustrate two modified circuit jumper pins 211 and 212. Pins 211 and 212 are identical except for the locations of their respective contact sleeves. Both pins are shown engaged in respective matrix holes 221 and 222 in a matrix assembly 220. That matrix assembly may be the same matrix described above as matrix 20, but the illustrations in FIGS. 24a and 24b focus on the soft dial tone signal trace portion of the matrix. Four trace conductors 215, 216, 217 and 218 are shown in the drawing and are configured similar to the trace conductors illustrated in FIG. 3, each being located in a respective plane parallel to the planes of the other conductors. Preferably, the trace conductors are each of the dual trace type, meaning that each trace conductor is actually two juxtaposed conductive traces disposed on opposite sides of a circuit board. The matrix holes are conductively plated at the signal traces as described above to permit electrical connections to be made in the manner described.

Each circuit jumper pin 211, 212 is an elongated cylindrical member having a grip 231 at its proximal end and a conical distal tip 233 with a radially enlarged annular flange at its proximal end. Grip 231 is generally cylindrical with a predetermined diameter and a tapered proximal end. The pin is made of an electrically insulative material and, over the contact portion of its length, has a diameter smaller than the inner diameter of the plated contacts in matrix holes 221, 222. An annular stop flange 235 extends radially from the pin at a location closer to the proximal end than the distal end of the pin. Proximally of stop 235, the pin has a short cylindrical section 234 with a diameter similar to the diameter of grip 231. Between section 234 and grip 231 there is a reduced diameter section 236 of generally hourglass configuration. Stop flange 235 and the flange on distal tip 233 have diameters greater than that of holes 221, 222 and establish the insertable length portion of the pin. Specifically, the insertable pin portion is located between stop flange 235 and the flange of tip 233, the two flanges serving to trap the pin in its matrix hole. Each pin thus has a fully inserted position and a fully retracted position in its respective matrix hole. The fully inserted position for pin 212 is illustrated in FIG. 24a along with the fully retracted position of pin 211. The pin positions are reversed in FIG. 24b.

The distalmost part of the insertable portion of pin 212 is surrounded by a tip contact sleeve 239 of electrically conductive spring-like material. A similarly configured ring contact sleeve 237 surrounds the proximalmost part of the insertable portion of pin 211. Contact sleeves 237 and 239 may take the same form as sleeves 47 and 49 described above in relation to FIG. 4. When unstressed (i.e., radially uncompressed), sleeves 237 and 239 have diameters slightly larger than the inner diameter of the female contacts in the matrix holes. When pin 212 is fully inserted into its matrix hole 222 (FIG. 24b), its sleeve 239 extends distally partially beyond the matrix and makes no contact between trace conductor 218. When pin 212 is in its fully retracted position (FIG. 24b), its contact sleeve 239 is radially compressed by aligned female contacts on trace conductors 217 and 218. This radial compression of the resilient conductive sleeve assures positive electrical contact between the sleeve and the female contacts, thereby assuring connection between the corresponding traces 217 and 218. When pin 211 is fully inserted into its respective hole 222, contact sleeve 237 is radially compressed by aligned female contacts on trace conductors 215 and 216. On the other hand, when in its fully retracted position, pin 211 is positioned with its sleeve 237 partially withdrawn from its matrix hole 222, and no cross-connection is made.

It will be appreciated that pin 212 effects cross-connections when fully retracted, whereas pin 211 effects a cross-connection when fully inserted. In order for each pin to be changed from a connection to non-connection condition, or vice versa, it need only be pushed or pulled within its permanent matrix hole. The pushing or pulling may be achieved by hand or with the same mechanism described above in relation to FIGS. 6–16; however, the picker need only be translated to one X-Y coordinate position since there is no need to first move to the position of a spare pin and then translate the pin to the matrix hole at which a connection is to be made.

It will be further appreciated that the trapped circuit jumper pins illustrated in FIGS. 24a and 24b permit considerable time saving during operation, but this time saving is achieved only at the expense of requiring each matrix hole to permanently retain its own pin. The initial cost of pins is therefore a tradeoff against speed of operation. Thus, although the trapped pins are clearly suitable for soft dial tone operation where operating speed is important but relatively few pins are required, this may not be the case for establishing full customer service where many hundreds of pins would be required but operating speed is not critical.

Figure 7:
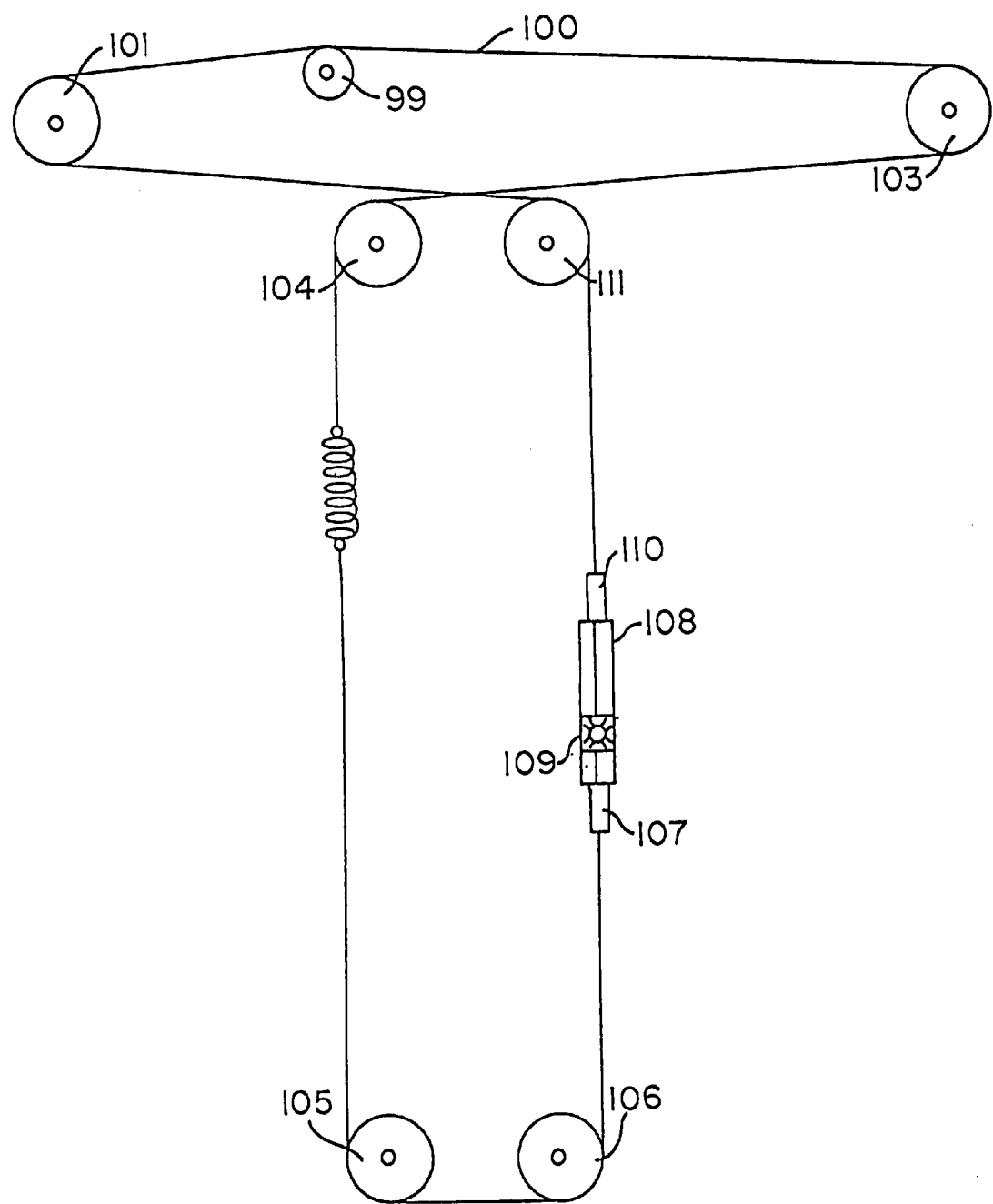
FIG. 7 is a schematic diagram of the drive cable portion of the transport assembly illustrated in FIG. 6.
Figure 25:
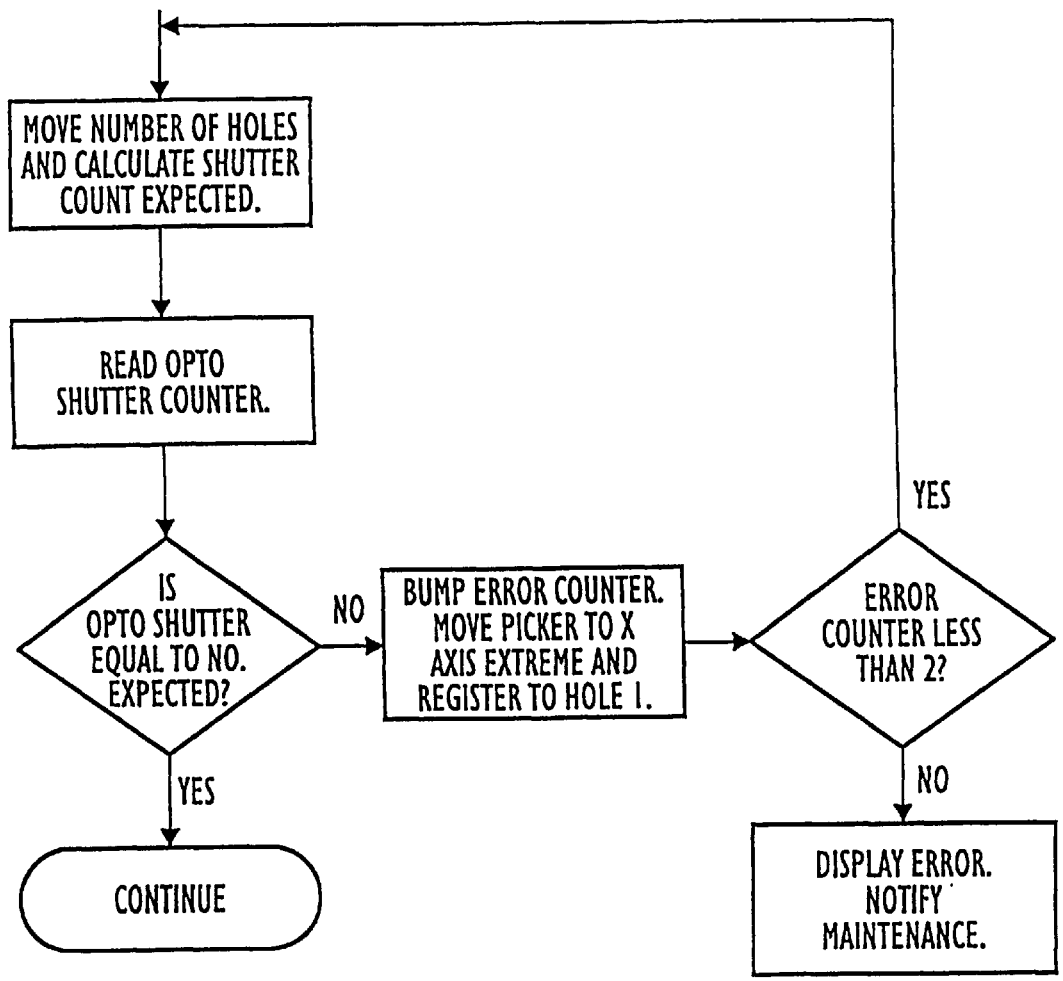
FIGS. 25–36 are flow charts representing programs for controlling various aspects of the system of the present invention.

In describing the operation and effect of opto-shutter drive pulley 99 in connection with FIGS. 6 and 7, mention is made that malfunctions of motor 102, or slippage of cable 100 on drive capstan 101, results in a corrective action or alarm. Specifically, the microprocessor 132 (FIG. 11) is described as receiving conflicting pulse counts from the opto-shutter counter that is driven by pulley 99 and from the count of the step motor steps expected for picker movement being controlled. A flow chart for this portion of the software, as stored in microprocessor 132, is illustrated in FIG. 25 to which specific reference is now made.

The picker is commanded to move the number of steps (corresponding to matrix holes) necessary to reach the desired pin/connection location. As the picker moves, a running count of discrete motor steps is maintained. Likewise, the opto-shutter counter registers counts for respective discrete units of length of cable 100 passing over pulley 99. These discrete length units correspond to the spacing between successive matrix holes. In response to the total of motor steps, the opto-shutter count, modified by a multiplier, is compared to the total motor step count. If the counts are equal, picker movement is considered to be correct; if not, an error count is incremented and the picker is moved to a first matrix hole position serving as a starting reference. If the incremented error count is less than two, the system begins again to move the picker to the commanded location. If a count discrepancy occurs again, the error count will equal two and, accordingly, an error indication is displayed.

The system described above is controlled by a microprocessor, typically a personal computer, located at the telephone system central office. The software used in the computer for effecting system operation is illustrated in flow chart form in FIGS. 26–35. It will be appreciated that much of the system operation is only broadly illustrated in those flow charts; it is only the particular features of the present invention that are represented in greater detail in the flow charts and described below.

Figure 26:
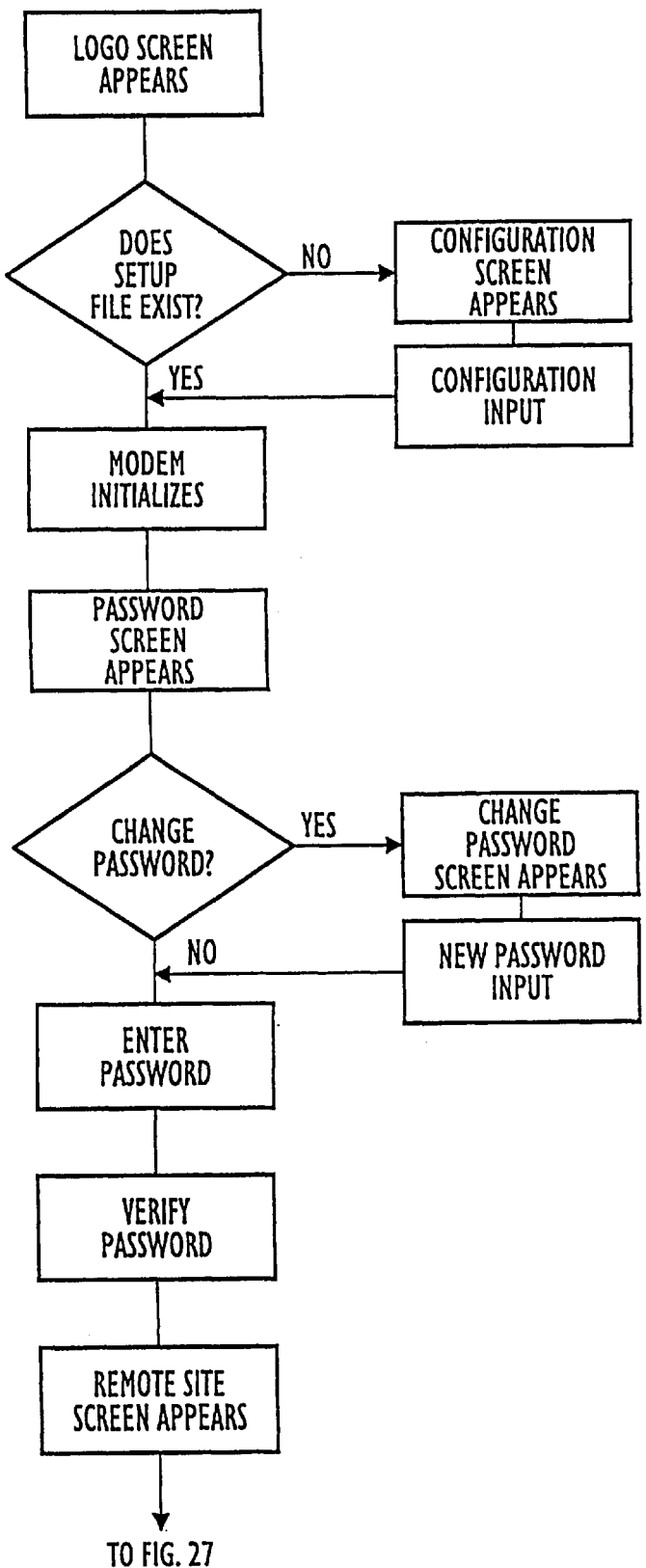

Referring to FIG. 26, the start routine for the system goes through initial setup and initialization before requesting the user to enter a password. Upon proper entry and verification of an acceptable password, a remote site screen is displayed.

Figure 27:
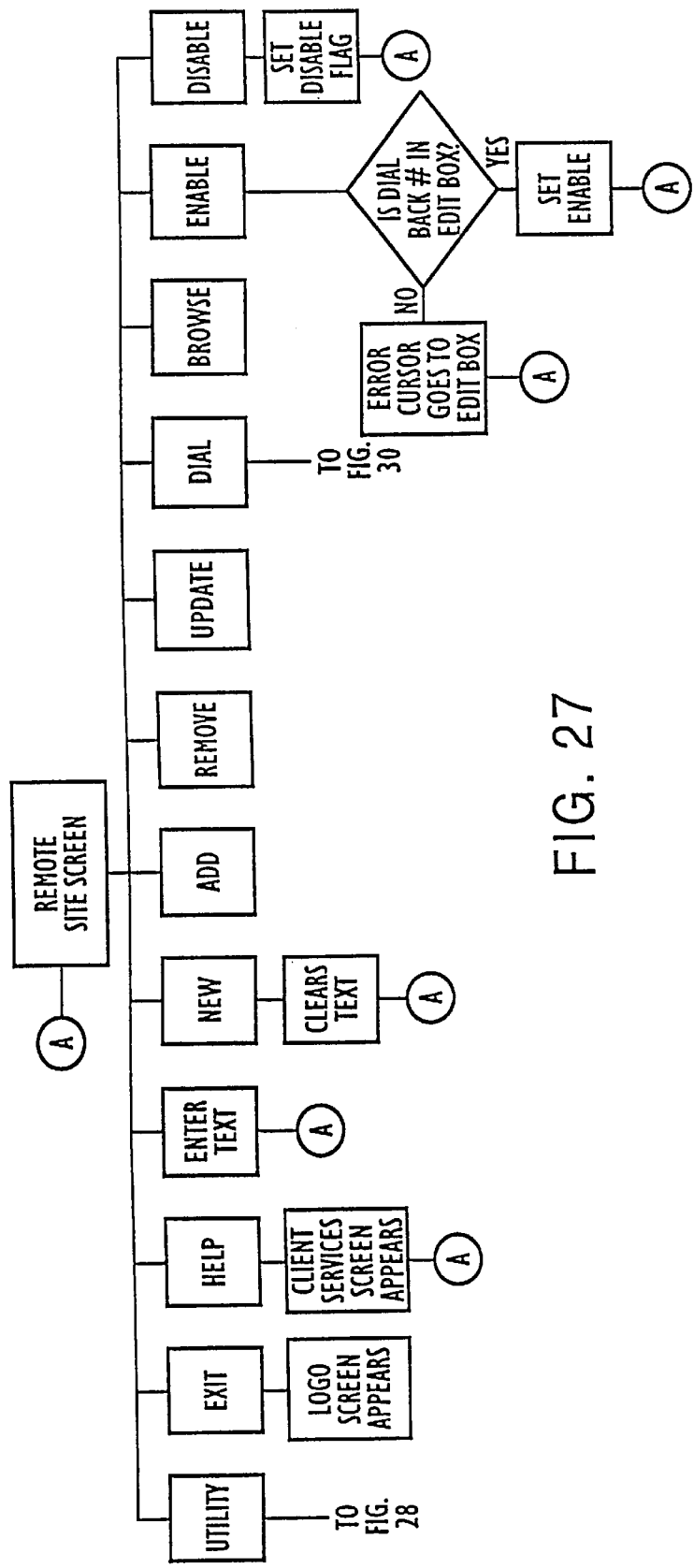

The options made available to the system operator via the remote site screen are illustrated in FIG. 27. The election of different operating modes may be via a menu selection or window selection process, or possibly a combination of the two. Of the twelve options shown in FIG. 27, only the utility option and the dial option are described in detail herein.

Figure 28:
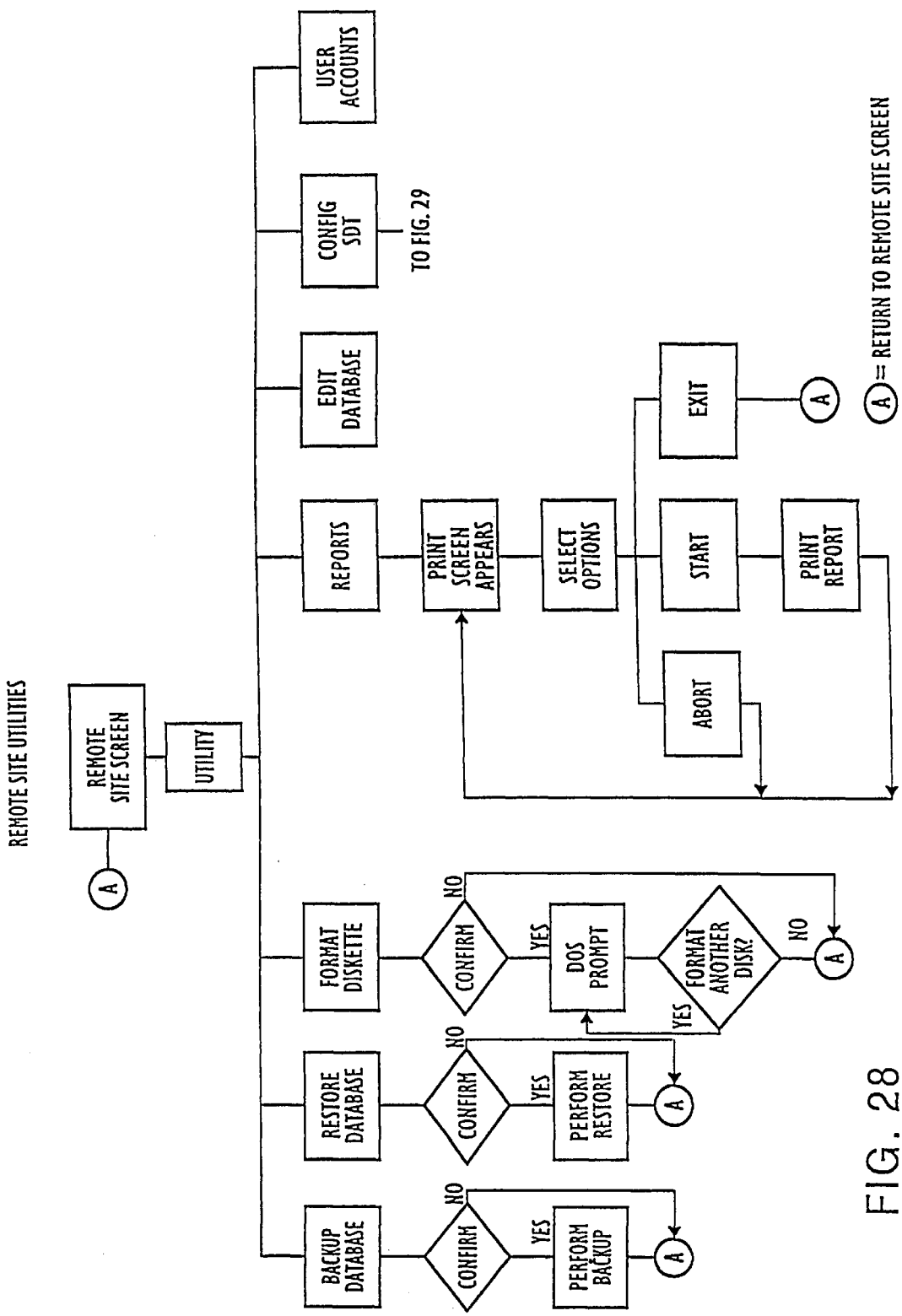
Figure 29:
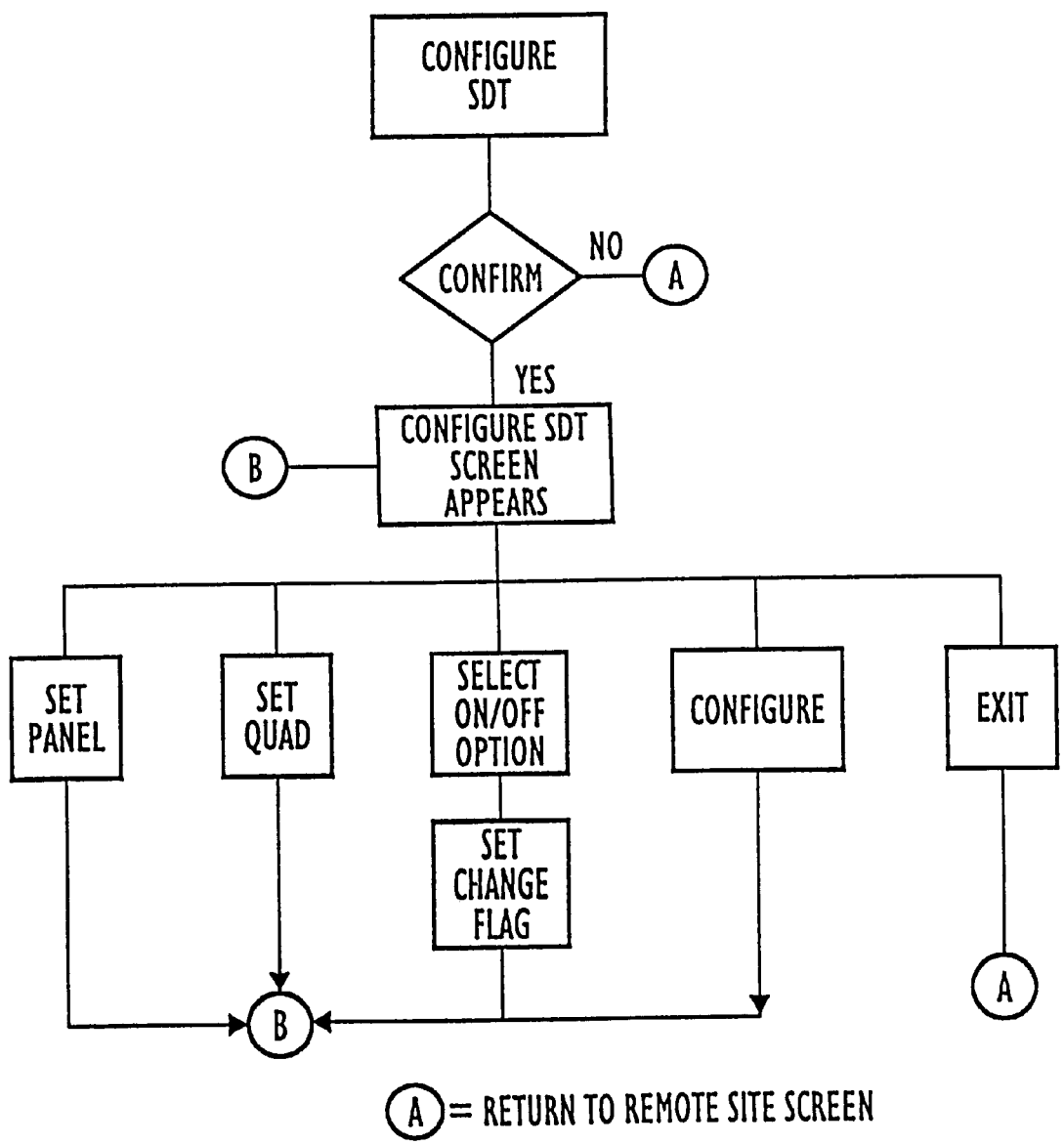
Figure 30:
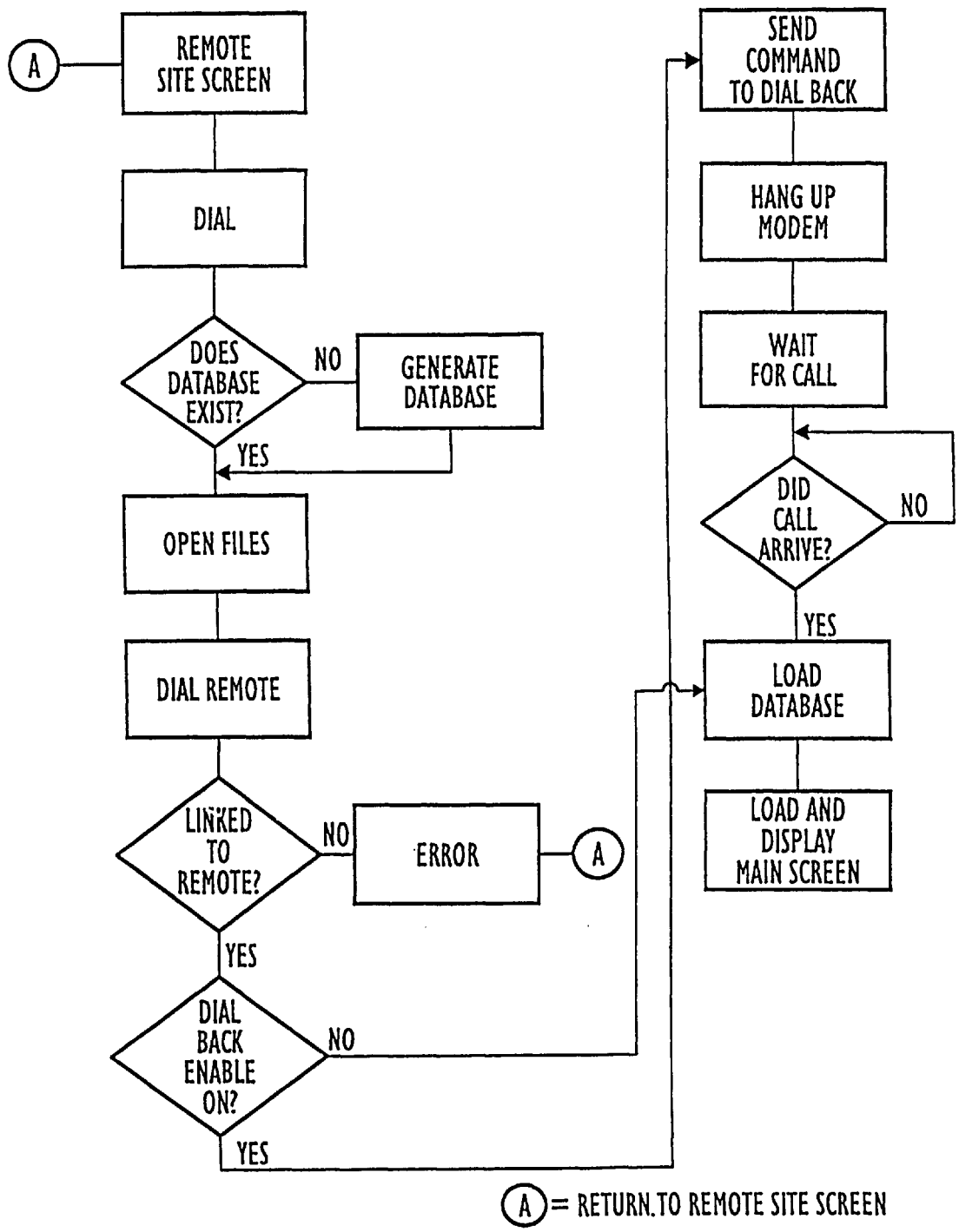

The remote site utility option, when selected, follows the procedure illustrated in FIG. 28. Specifically, the operator is asked to select from seven options, including backup database, restore database, format diskette, reports, edit database, configure soft dial tone, and user accounts. The only one of these options described in detail herein is the configure soft dial tone option which is illustrated in detail in FIG. 29.

Upon election of the configure soft dial tone option, the operator is first asked to confirm the election of that option. Upon such confirmation being entered into the system, the configure SDT screen appears and gives the operator the option of performing a number of different operations. For example, the operator can set a particular matrix panel in a multiple panel system for reconfiguration, or he/she can set the particular quadrant on the selected panel for soft dial tone configuration. The on/off option can be elected to permit the operator to have the soft dial tone feature available or not on a particular panel. The configuration option for the selected panel and quadrant permits soft dial tone features to be established thereon. Exiting from the routine returns the system to the remote site screen illustrated functionally in FIG. 27.

Another option made available on the remote site screen is the dial option which permits the operator to call a particular remote site having a cross-connect matrix system installed thereat. The dial routine is illustrated in detail in FIG. 30 to which specific reference is now made. Upon a command to dial a particular site being initiated, the system determines whether or not a database exists for that site and, if not, a database is generated. The files for the site are then opened and the actual dialing process begins. If no connection is made, an error indication is provided and the system returns back to the remote site screen. If connection is effected a determination is made as to whether or not the dial back enable feature is "on" for the remote site. This feature is a security feature permitting the remote location to dial back to the central office. If the feature is activated, the central office sends a command to the remote location to dial back the central office, and then hangs up the modem. When the dial back call arrives, or if the dial back enable feature is not activated, the data base is loaded into the system and the main screen for the remote site is displayed.

Figure 31:
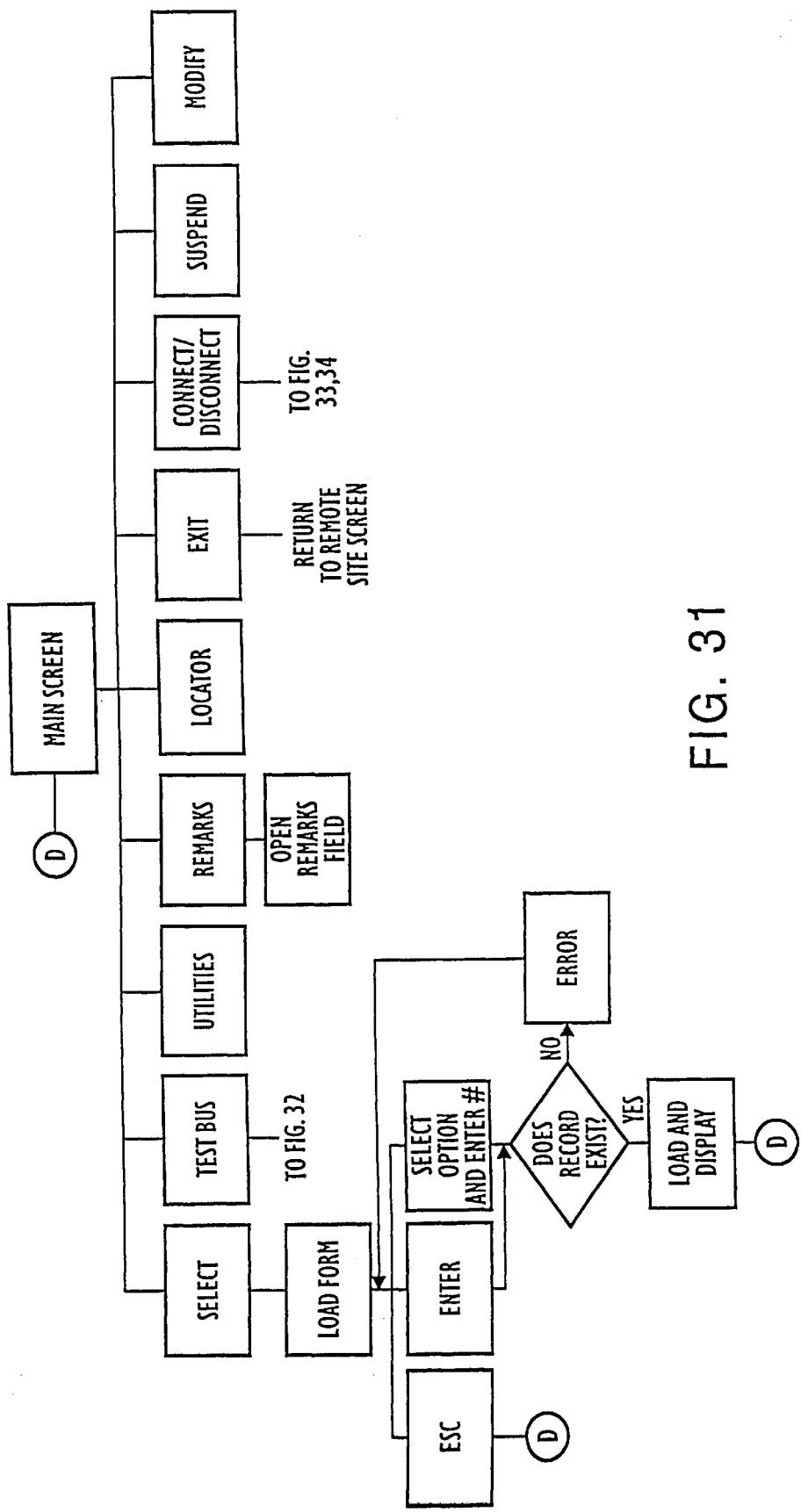
Figure 32:
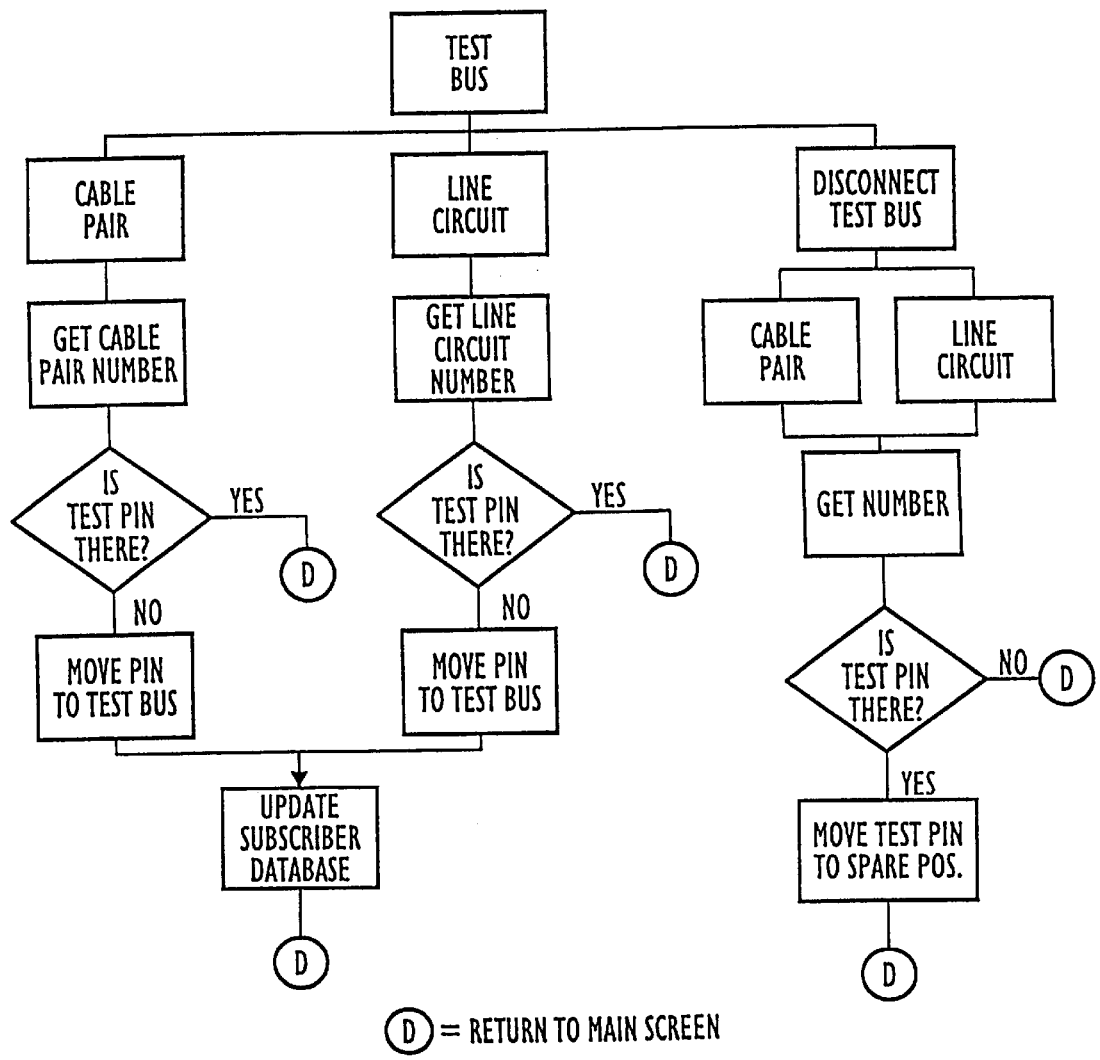

The main screen options are illustrated in FIG. 31. The only options of specific interest to the present invention are the test bus option and the connect/disconnect options. The test bus option is illustrated in detail in FIG. 32 to which specific reference is now made. The operator is given the option of identifying a cable pair of a line circuit to be tested. Upon election of a cable pair by entry of the appropriate cable pair number, the system determines whether or not a test pin is inserted to connect that cable pair to the test bus. If it is, the system returns to the main screen; if it is not, a test pin is moved to that location, the subscriber database is appropriately updated, and the system returns to the main screen. Testing may be performed automatically on the selected cable pair as desired. A similar process is applied for testing a line circuit; that is, the system determines whether or not a test pin is connected in the appropriate location for that line circuit and, if not, a test pin is so moved. When the operator wishes to disconnect the test bus from a particular location, the disconnect option is selected, the cable pair or line circuit number is obtained, and a determination is made as to whether or not the test pin is at the location for that number. If not, the process returns to the main screen display; if so, the test pin is moved to a spare pin position.

Figures 33, 34:
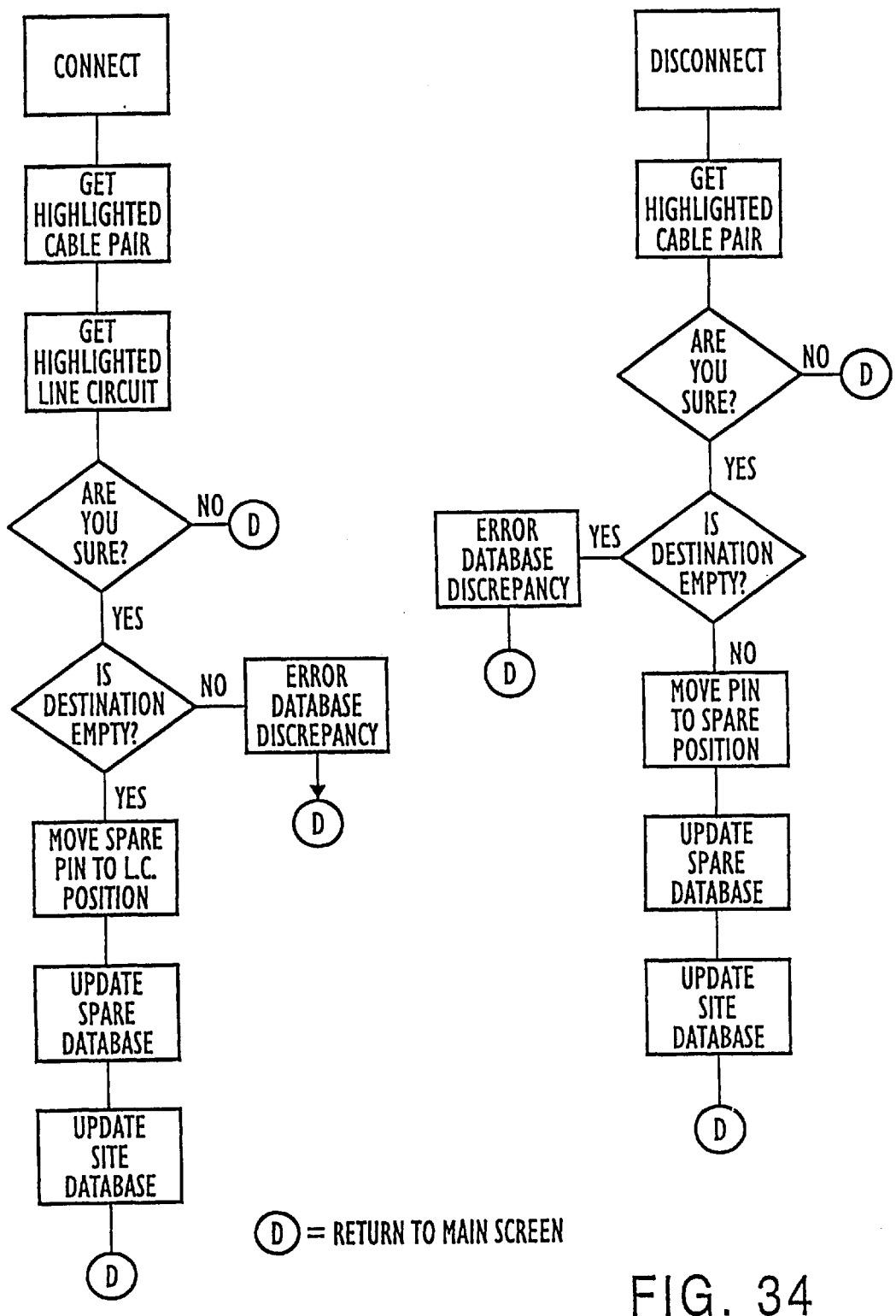

Referring to FIG. 33, if the connect option is selected at the main screen, the operator is permitted to select the cable pair and line circuit to be interconnected. The operator is then asked to confirm the connection. If the particular juncture, (i.e., matrix hole 20) corresponding to the selected cable pair and line circuit is shown in the database for the matrix as being occupied, an error indication is flashed on the screen and the system returns to the main screen display. If the particular matrix location is available, a spare pin is moved by the pick and place mechanism to the selected line circuit position, the matrix spare pin location database and matrix hole database are updated, and the system returns to the main screen display.

Referring to FIG. 34, if the disconnect option is selected from the main screen, the operator need only designate the cable pair to be disconnected and confirm the disconnection since the line circuit to which that cable pair is connected is identified in the matrix database. If the database indicates that the selected cable pair has no connection on the matrix, an error is indicated and the system returns to the main screen display. On the other hand, if the matrix database indicates that there is a circuit jumper pin in place for the cable pair to be disconnected, that pin is moved to a spare pin location, and the databases are appropriately updated. The system then returns to the main screen display.

Figure 35:
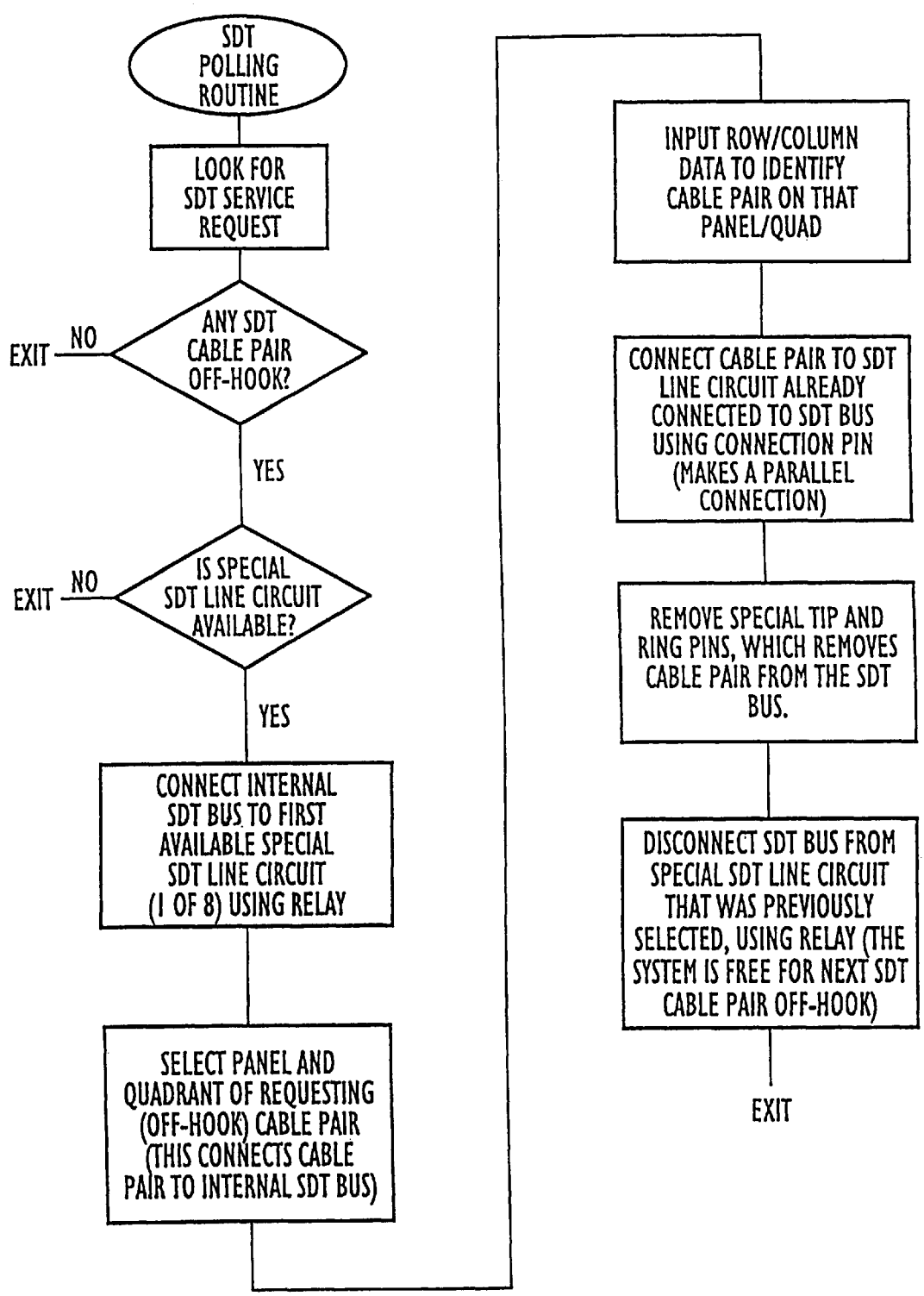

The response of the system to a request for soft dial tone service is illustrated in the flow chart of FIG. 35. In particular, the system continuously poles the potential soft dial tone cable pairs to see if any of those cable pairs has gone off-hook. When such cable pair goes off-hook, a determination is made as to whether or not a special SDT line circuit is available. If so, the internal soft dial tone bus is connected to the first available special SDT circuit by means of the relay circuitry described in relation to FIGS. 18, 19 and 20. The appropriate panel and quadrant of the requesting cable pair is identified and the cable pair is connected to the internal SDT bus as previously described. The row and column numbers from the actuated relays identify the cable pair, which can then be connected to the SDT line circuit already connected to the SDT bus by using a circuit jumper pin (this results in the parallel connection described hereinabove). The special tip and ring pins are then removed to remove the parallel connection of the cable pair to the SDT bus. The SDT bus is then connected from the special SDT line circuit that was previously selected, thereby rendering the system free for the next request for soft dial tone.

Figure 36:
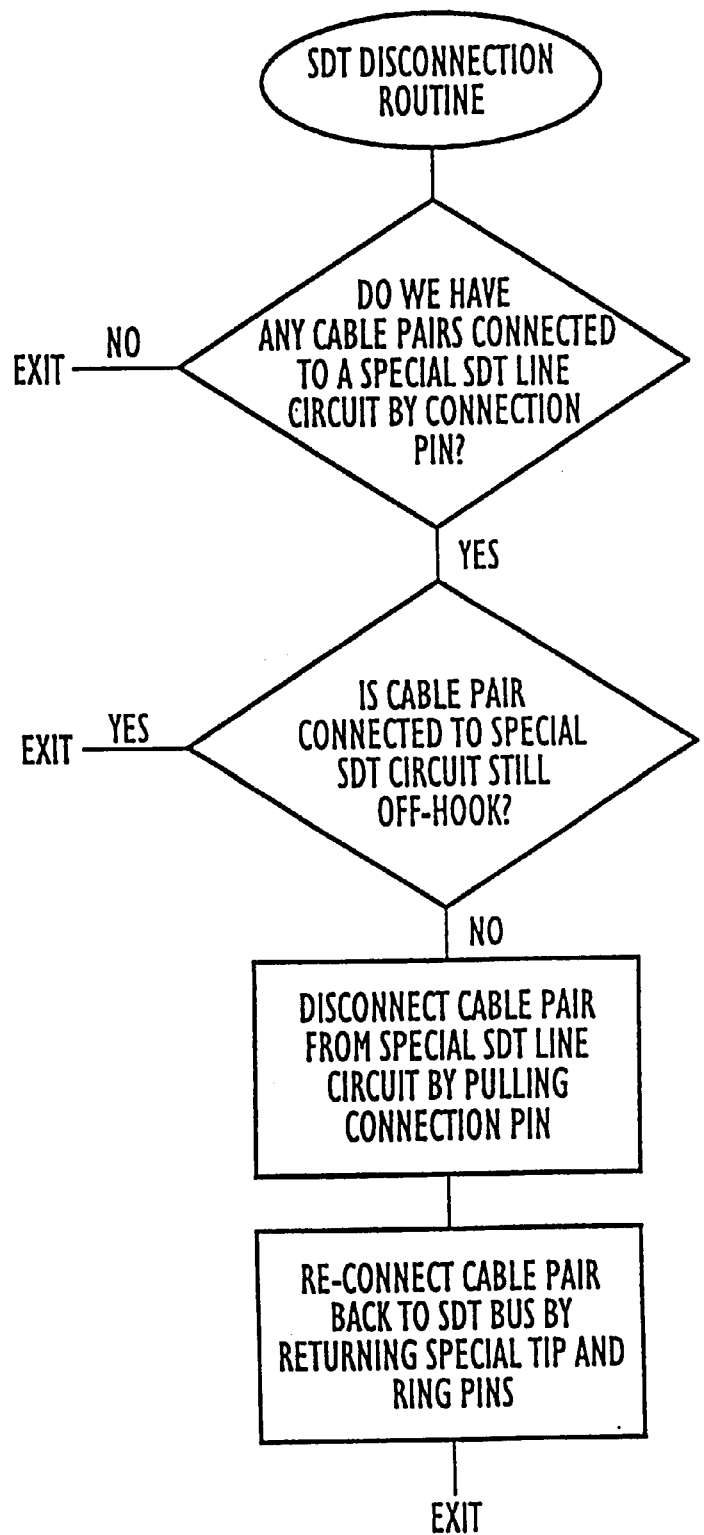

Disconnection of soft dial tone service is illustrated in FIG. 36. Specifically, the system looks to determine whether or not any cable pairs are connected to the special SDT line circuit by a connection pin. If so, a determination is made as to whether or not the cable pair connected to the special SDT circuit is still off-hook. When that cable pair is no longer off-hook, it is disconnected from the special SDT line circuit by pulling the connection pin illustrated in FIG. 24. The cable pair is reconnected to the SDT bus by returning the special tip and ring pins illustrated in FIG. 24 to their appropriate positions. The present invention, as described above, makes available a method and apparatus for inserting a cross-connection matrix into a strategic point in a telephone central office in a manner to position the matrix to remotely and automatically control the placing, moving and removing of cross-connections between a cable pair to the customer's premises and the central office line termination. In addition, the system provides a method and apparatus for deploying a cross-connection matrix in a manner to relieve telephone companies from the requirement of leaving a relatively expensive central office line termination connected to every non-working cable pair in order to have dedicated inside plant.

The invention as described above also provides a method and apparatus for immediately identifying a single customer from among thousands of customers that are requesting service from a non-working cable pair. In addition, a method and apparatus are disclosed for setting up a parallel path through the matrix of the present invention in order to improve the quality of a circuit utilized for soft dial tone. Means are disclosed for enabling the system to remove the initial path from the parallel connection without interrupting progress of the call.

The system further makes available a method and apparatus for taking a non-working line from a group of sixteen such lines and connecting the selected line to a normal central office telephone line while leaving no connections to the other pairs that were originally bridged and parallel.

The system as disclosed herein also has the capability of automatically physically transferring a calling line to a standard telephone line, and achieving this from a remote location with no interruption of a call in progress.

Having described preferred embodiments of a new and improved cross-connection method and apparatus constructed and operated in accordance with the present invention, it is believed that other modifications, variations and changes will be suggested to persons skilled in the art in view of the teachings set forth herein. Accordingly, it is to be understood that all such variations, modifications and changes are believed to fall within the scope of the present invention as defined by the appended claims.

What is claimed is:

1. A method of transporting a jumper pin, by means of a pin picking and placing mechanism, to and from individual junction locations in a switching matrix, said method comprising the steps of:
   (a) moving said mechanism selectively in either of two opposite directions along a first path by means of a drive motor;
   (b) moving said mechanism selectively in either of two opposite directions along a second path by means of said drive motor; and
   (c) limiting movement of said mechanism to only one of said first and second paths at a time by selectively inhibiting movement of said mechanism along said first and second paths independently;
   wherein said drive motor is the only source of motion-producing force for said mechanism along said first and second paths, and motion along the selected path is effected by positively blocking motion along the other path in step (c).

2. The method of claim 1 wherein said first and second paths are disposed in a transport plane parallel to said matrix.

3. The method of claim 2 further comprising the step of:
   (d) moving said mechanism in either of two selective opposite directions along a third path disposed perpendicular to said transport plane by means of said drive motor;
   wherein step (c) includes limiting movement of said mechanism to only a selectable one of said first, second and third paths at a time by selectively inhibiting movement of said mechanism along the other two of said paths; and
   wherein said drive motor is the only source of motion-producing force for said mechanism along said first, second and third paths, and motion along only the selected path is effected by positively blocking movement of the mechanism along the two non-selected paths.

4. The method of claim 3 wherein:
   step (a) includes translating said mechanism along a first support extending along said first path;
   step (b) includes translating said mechanism along a second support extending along said second path;
   step (d) includes rotating said mechanism about an axis oriented parallel to said transport plane; and
   step (c) includes the steps of:
      interengaging said mechanism with said first support to inhibit movement of said mechanism along said first path;

interengaging said mechanism with said second support to inhibit movement of said mechanism along said second path; and blocking rotation of said mechanism to inhibit movement of said mechanism along said third path.

5. The method of claim 4 wherein steps (a), (b) and (d) include translating a single drive cable by means of said drive motor, and passing said drive cable over a series of idler pulleys secured to said mechanism and defining a cable path.

6. The method of claim 5 wherein said first, second and third paths are mutually orthogonal;

wherein steps (a), (b) and (d) include:

wrapping said drive cable along a first pulley rotatable by said drive motor about an axis perpendicular to said transport plane and serving as a drive pulley;

extending said drive cable from said first pulley, in a direction parallel to said transport plane, to a second idler pulley rotatable about an axis perpendicular to said transport plane, and bending the cable approximately 180° about said second idler pulley;

extending the drive cable from said second pulley to a third idler pulley rotatable about an axis perpendicular to said transport plane and carried by a first block translatable along a first tube serving as part of said first support, and bending the drive cable approximately 90° about said third pulley;

extending said drive cable from said third pulley to a fourth idler pulley rotatable about an axis perpendicular to said transport plane and carried by a second block translatable along a second tube serving as part of said first support and extending parallel to said first tube, and bending the drive cable approximately 90° about said fourth pulley;

extending said drive cable from said fourth pulley, in a direction parallel to said second tube, to a fifth idler pulley rotatable about an axis perpendicular to said transport plane and carried by said second block, and bending the drive cable approximately 90° about said fifth pulley generally back toward said first block;

extending said drive cable from said fifth pulley to a sixth idler pulley rotatable about an axis parallel to said transport plane and carried by a carriage translatable along a third tube secured to and extending between said first and second blocks and serving as part of said second support, and bending said drive cable partially about said fifth pulley;

extending said drive cable from said sixth pulley to a seventh idler pulley rotatable about an axis parallel to said transport plane and carried by said carriage, and securing one end of said drive cable on said seventh pulley;

securing another end of said drive cable to said seventh pulley and extending that end of the cable to an eighth idler pulley rotatable about an axis parallel to said transport plane and carried by said carriage;

extending said drive cable from said eighth pulley to a ninth idler pulley rotatable about an axis perpendicular to said transport plane and carried by said first block, and bending said drive cable approximately 90° about said ninth pulley; and returning said drive cable to said first pulley.

7. The method of claim 6 wherein step (c) includes the steps of:

inhibiting movement of said mechanism along said first path by selectively projecting a pin from said first block into a selected slot in a first series of slots defined in and spaced longitudinally along said first tube to prevent said block from moving from a position defined by the selected slot in said first series; and inhibiting movement of said mechanism along said second path by selectively projecting a pin from said carriage into a selected slot in a second series of slots defined in and spaced longitudinally along said second tube to prevent said carriage from moving from a position defined by the selected slot in said second series.

8. The method of claim 6 wherein step (c) includes the steps of:

inhibiting movement of said mechanism along said first path by selectively preventing movement of said first block along said first tube; and inhibiting movement of said mechanism along said second path by selectively preventing movement of said carriage along said second tube.

9. The method of claim 5 wherein said first and second paths are perpendicular to one another;

wherein steps (a) and (b) include:

wrapping said drive cable along a first pulley rotatable by said drive motor about an axis perpendicular to said transport plane, and serving as a drive pulley;

extending said drive cable from said first pulley, in a direction parallel to said transport plane, to a second idler pulley rotatable about an axis perpendicular to said transport plane, and bending the cable approximately 180° about the second pulley;

extending the drive cable from said second pulley to a third idler pulley rotatable about an axis extending perpendicular to said transport plane and carried by a first block translatable along a first tube serving as part of said first support, and bending the drive cable approximately 90° about said third pulley;

extending the drive cable from said third pulley to a fourth idler pulley rotatable about an axis perpendicular to said transport plane and carried by a second block translatable along a second tube serving as part of said first support and extending parallel to said first tube, and bending the drive cable approximately 90° about said fourth pulley;

extending said drive cable from said fourth pulley, in a direction parallel to said second tube, to a fifth idler pulley rotatable about an axis perpendicular to said transport plane and carried by said second block, and bending the drive cable approximately 90° about said fifth pulley generally back toward said first block;

extending said drive cable from said fifth pulley to a sixth idler pulley rotatable about an axis perpendicular to said transport plane and carried by said first block, and bending said drive cable approximately 90° about said sixth pulley; and returning said cable to said first pulley.

10. The method according to claim 9 wherein step (c) includes the steps of:

inhibiting movement of said mechanism along said first path by selectively projecting a pin from said first block into a selected slot in a first series of slots defined in and spaced longitudinally along said first tube to prevent said block from moving from a position defined by the selected slot in said first series; and inhibiting movement of said mechanism along said second path by selectively projecting a pin from said carriage into a selected slot in a second series of slots defined in and spaced longitudinally along said second tube to prevent said carriage from moving from a position defined by the selected slot in said second series.

11. The method of claim 9 wherein step (c) includes the steps of:
inhibiting movement of said mechanism along said first path by selectively preventing movement of said first block along said first tube; and
inhibiting movement of said mechanism along said second path by selectively preventing movement of said carriage along said second tube.

12. The method of claim 2 wherein:
step (a) includes translating said mechanism along a first support extending along said first path;
step (b) includes translating said mechanism along a second support extending along said second path; and
step (c) includes the steps of:
interengaging said mechanism with said first support to inhibit movement of said mechanism along said first path; and
interengaging said mechanism with said second support to inhibit movement of said mechanism along said second path.

13. The method of claim 12 wherein steps (a) and (b) include translating a single drive cable with said drive motor, and passing said drive cable over a series of idler pulleys secured to said mechanism and defining a cable path.

14. The method of claim 13 further comprising the step of displaying an error indication in response to a detection of a slippage of said single drive cable or a malfunction of said drive motor.

15. The method of claim 14 wherein one of said series of idler pulleys drives an opto-shutter counter, and wherein said detection of a slippage includes:
determining the number of steps of said drive motor during transportation of said pin;
determining the number of discrete length units of said drive cable passing over said one pulley by said opto-shutter counter;
comparing the number of drive motor steps to the number of discrete length units; and
indicating an error in response to the comparison yielding a non-matching result.

16. An apparatus for transporting a jumper pin to and from individual junction locations in a switching matrix in order to establish and terminate connections between external lines connected to said switching matrix, said apparatus comprising:
placement means for retrieving said jumper pin from a first junction location in said switching matrix and positioning said jumper pin in a second junction location in said switching matrix, said placement means being selectively driven in any one of a horizontal, vertical, or inward orthogonal direction relative to a plane parallel to said switching matrix;
a drive motor for driving said placement means to positions adjacent said switching matrix corresponding to said first and second junction locations;
a drive cable disposed about said drive motor and said placement means for applying a moving force to said placement means; and
a series of idler pulleys, said pulleys translating said drive cable about said placement means in order to apply said moving force to move said placement means;
wherein said drive motor includes a single motor and is the only source of motion producing force to drive said placement means in said horizontal, vertical and inward orthogonal directions.

17. The apparatus of claim 16 wherein said horizontal and vertical directions are in a transport plane parallel to said switching matrix and said inward orthogonal direction is disposed perpendicular to said transport plane.

18. The apparatus of claim 16 wherein said placement means is only movable in one direction at a time in each of said horizontal, vertical and inward orthogonal directions.

19. The apparatus of claim 16 further comprising first and second supports extending along said horizontal direction and a third support extending along said vertical direction, wherein said first and second supports are parallel to each other and perpendicular to said third support, and said placement means is selectively movable along said first and second supports to move in said horizontal direction and selectively movable along said third support to move in said vertical direction.

20. The apparatus of claim 19 wherein said apparatus further comprises first, second, and third carriages, each of said carriages including rollers respectively engaging said first, second, and third supports in order to move said placement means in one of said horizontal or vertical directions.

21. The apparatus of claim 20 wherein said placement means is attached to said third carriage, said first and second carriages being selectively movable along said first and second supports in a horizontal direction, said third carriage being selectively movable along said third support in said vertical direction.

22. The apparatus of claim 21 wherein said first, second and third supports include tubes, said tubes of said first and third supports having multiple brake slots disposed in a generally linear path along an external surface of said tubes, wherein said first and third carriages include brakes for stopping said respective carriages by selectively engaging said slots, said brakes being selectively applied by said respective carriages to allow movement of said placement means in a single unbraked direction.

23. The apparatus of claim 22 wherein said brakes of said first and third carriages include a pin selectively projectable from said first and third carriages to selectively engage one of said slots to inhibit movement of said placement means along a particular direction so that said placement means moves in another direction in which movement is uninhibited.

24. The apparatus of claim 22 wherein said first, second, and third supports are connected to a frame adjacent said switching matrix, said tubes of said supports including threaded proximal and distal ends such that said threaded ends of said tubes adjustably engage flange nuts to connect said tubes to said frame and align said slots with individual junction locations in said matrix.

25. The apparatus of claim 20 wherein said series of idler pulleys include:
a first pulley rotatable by said drive motor about a first axis perpendicular to said plane of said switching matrix, said drive cable being disposed about said first pulley;

a second pulley rotatable about said first axis, said drive cable being disposed about said second pulley such that said drive cable bends approximately 180° about said second pulley;

a third pulley rotatable about said first axis carried by said first carriage, said drive cable being disposed about said third pulley such that said drive cable bends approximately 90° about said third pulley;

a fourth pulley rotatable about said first axis carried by said second carriage, said drive cable being disposed about said fourth pulley such that said drive cable bends approximately 90° about said fourth pulley;

a fifth pulley rotatable about said first axis carried by said second carriage, said drive cable being disposed about said fifth pulley such that said drive cable bends approximately 90° about said fifth pulley generally back toward said first pulley;

a sixth pulley rotatable about a second axis parallel to said plane of said switching matrix and connected to said third carriage, said sixth pulley bending said drive cable partially about said fifth pulley;

a seventh pulley rotatable about said second axis and carried by said third carriage wherein an end of said drive cable terminates and is secured to said seventh pulley, and a second end of said drive cable originates from and is secured to said seventh pulley;

an eighth pulley rotatable about said second axis and carried by said third carriage wherein said drive cable is disposed about said eighth pulley; and a ninth pulley rotatable about said first axis and carried by said first carriage, said drive cable being disposed about said ninth pulley such that said drive cable bends approximately 90° about said ninth pulley to return said drive cable to said first pulley.

26. The apparatus of claim 16 wherein said placement means further includes a plunger to thrust said jumper pin securely in said second junction location in said switching matrix.

27. The apparatus of claim 16 further comprising:

control means for controlling placement of said jumper pins at individual junction locations in said matrix wherein said control means is located at a remote site and controls a plurality of said apparatus at the same or different sites.

28. In an apparatus for transporting a jumper pin to and from individual junction locations in a switching matrix, a drive assembly controller receiving commands from a remote location comprising:

a modem for receiving and formatting signals from said remote location;

a microprocessor bus for receiving and carrying said formatted signals from said modem;

a microprocessor responsive to said signals from said bus for generating control signals;

a memory coupled to said microprocessor for storing locations of jumper pins disposed within said individual junction locations of said switching matrix;

a stepper indexer responsive to said control signals for generating step signals;

a stepper translator responsive to said step signals for generating motor control signals; and a motor responsive to said motor control signals for positionally stepping and thereby moving a drive cable to actuate said apparatus.

29. The apparatus of claim 28 wherein said microprocessor includes means for comparing the number of discrete length units of a drive cable traversing an opto-shutter counter during transportation of said jumper pin to a prestored expected step count of said motor and means for indicating an error in response to said discrete length units and expected step counts not being equivalent.

* * * * *